(12) United States Patent
Shibata et al.

(10) Patent No.: US 10,878,895 B2
(45) Date of Patent: Dec. 29, 2020

(54) SEMICONDUCTOR MEMORY DEVICE WHICH STORES PLURAL DATA IN A CELL

(71) Applicant: TOSHIBA MEMORY CORPORATION, Minato-ku (JP)

(72) Inventors: Noboru Shibata, Kawasaki (JP); Tomoharu Tanaka, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/857,611

(22) Filed: Apr. 24, 2020

(65) Prior Publication Data

US 2020/0251165 A1 Aug. 6, 2020

Related U.S. Application Data

(60) Continuation of application No. 16/539,205, filed on Aug. 13, 2019, now Pat. No. 10,699,781, which is a
(Continued)

(30) Foreign Application Priority Data

Jan. 30, 2004 (JP) .................... 2004-024475
May 28, 2004 (JP) .................... 2004-160165

(51) Int. Cl.
*G11C 11/34* (2006.01)
*G11C 11/56* (2006.01)
(Continued)

(52) U.S. Cl.
CPC ...... *G11C 11/5628* (2013.01); *G11C 11/5642* (2013.01); *G11C 16/0483* (2013.01);
(Continued)

(58) Field of Classification Search
CPC ............ G11C 11/5628; G11C 11/5642; G11C 16/0483; G11C 16/10; G11C 16/3454; G11C 16/3459
(Continued)

(56) References Cited

U.S. PATENT DOCUMENTS

| 4,163,147 A | 7/1979 | Scheuneman |
|---|---|---|
| 5,566,105 A | 10/1996 | Tanaka et al. |

(Continued)

FOREIGN PATENT DOCUMENTS

| JP | 9-326197 | 12/1997 |
|---|---|---|
| JP | 10-3792 | 1/1998 |

(Continued)

OTHER PUBLICATIONS

Japanese Office Action dated Jan. 4, 2011, in Patent Application No. 2008-099646 (with English-language translation).
(Continued)

*Primary Examiner* — Viet Q Nguyen
(74) *Attorney, Agent, or Firm* — Oblon, McClelland, Maier & Neustadt, L.L.P.

(57) ABSTRACT

A memory cell array is configured to have a plurality of memory cells arranged in a matrix, each of the memory cells being connected to a word line and a bit line and being capable of storing n values (n is a natural number equal to or larger than 3). A control circuit controls the potentials of the word line and bit line according to input data and writes data into a memory cell. The control circuit writes data into the memory cell to a k-valued threshold voltage (k<=n) in a write operation, precharges the bit line once, and then changes the potential of the word line an i number of times to verify whether the memory cell has reached an i-valued (i<=k) threshold voltage.

6 Claims, 61 Drawing Sheets

Related U.S. Application Data continuation of application No. 16/125,601, filed on Sep. 7, 2018, now Pat. No. 10,431,297, which is a continuation of application No. 15/832,557, filed on Dec. 5, 2017, now Pat. No. 10,096,358, which is a continuation of application No. 15/453,302, filed on Mar. 8, 2017, now Pat. No. 9,858,992, which is a continuation of application No. 15/175,806, filed on Jun. 7, 2016, now Pat. No. 9,627,048, which is a continuation of application No. 14/825,858, filed on Aug. 13, 2015, now Pat. No. 9,390,802, which is a continuation of application No. 14/017,611, filed on Sep. 4, 2013, now Pat. No. 9,142,299, which is a continuation of application No. 13/754,057, filed on Jan. 30, 2013, now Pat. No. 8,542,538, which is a continuation of application No. 13/413,779, filed on Mar. 7, 2012, now Pat. No. 8,385,130, which is a continuation of application No. 12/775,571, filed on May 7, 2010, now Pat. No. 8,154,930, which is a continuation of application No. 12/117,767, filed on May 9, 2008, now Pat. No. 7,738,302, which is a division of application No. 11/759,627, filed on Jun. 7, 2007, now Pat. No. 7,376,009, which is a division of application No. 10/988,592, filed on Nov. 16, 2004, now Pat. No. 7,245,528.

(51) Int. Cl.
  *G11C 16/04* (2006.01)
  *G11C 16/12* (2006.01)
  *G11C 16/34* (2006.01)
  *G11C 16/10* (2006.01)

(52) U.S. Cl.
  CPC .............. *G11C 16/10* (2013.01); *G11C 16/12* (2013.01); *G11C 16/3454* (2013.01); *G11C 16/3459* (2013.01); *G11C 2211/5621* (2013.01); *G11C 2211/5648* (2013.01)

(58) Field of Classification Search
  USPC .................................................... 365/185.03
  See application file for complete search history.

(56) References Cited

U.S. PATENT DOCUMENTS

| | | | |
|---|---|---|---|
| 5,774,397 A | 6/1998 | Endoh et al. | |
| 5,860,084 A | 1/1999 | Yaguchi | |
| 5,870,218 A | 2/1999 | Jyouno et al. | |
| 5,934,190 A | 8/1999 | Jessup et al. | |
| 5,969,985 A | 10/1999 | Tanaka et al. | |
| 5,982,667 A | 11/1999 | Jyouno et al. | |
| 6,026,025 A * | 2/2000 | Tanaka | G11C 16/3459 365/185.22 |
| 6,028,792 A | 2/2000 | Tanaka et al. | |
| 6,044,013 A | 3/2000 | Tanaka | |
| 6,058,042 A | 5/2000 | Nobukata | |
| 6,078,519 A | 6/2000 | Kanamitsu et al. | |
| 6,084,806 A | 7/2000 | Sugibayashi | |
| 6,104,635 A | 8/2000 | Ogane | |
| 6,243,290 B1 | 6/2001 | Kurata et al. | |
| 6,246,610 B1 | 6/2001 | Han | |
| 6,282,117 B1 | 8/2001 | Tanaka | |
| 6,285,597 B2 | 9/2001 | Kawahara et al. | |
| 6,288,935 B1 | 9/2001 | Shibata et al. | |
| 6,333,871 B1 | 12/2001 | Tsujikawa et al. | |
| 6,363,010 B2 | 3/2002 | Tanaka | |
| 6,373,746 B1 | 4/2002 | Takeuchi et al. | |
| 6,400,601 B1 | 6/2002 | Sudo et al. | |
| 6,418,057 B1 | 7/2002 | Hosogane | |
| 6,426,892 B2 | 7/2002 | Shibata et al. | |
| 6,438,035 B2 | 8/2002 | Yamamoto et al. | |
| 6,496,412 B1 | 12/2002 | Shibata et al. | |
| 6,525,964 B2 | 2/2003 | Tanaka et al. | |
| 6,545,909 B2 | 4/2003 | Tanaka | |
| 6,552,580 B2 | 4/2003 | Nilson et al. | |
| 6,657,891 B1 | 12/2003 | Shibata et al. | |
| 6,731,528 B2 | 5/2004 | Hush | |
| 6,760,269 B2 | 7/2004 | Nakase et al. | |
| 6,798,697 B2 | 9/2004 | Hosono et al. | |
| 6,850,435 B2 * | 2/2005 | Tanaka | G11C 11/5621 365/185.03 |
| 6,876,578 B2 | 4/2005 | Shibata et al. | |
| 6,894,931 B2 | 5/2005 | Yaegashi et al. | |
| 6,901,016 B2 | 5/2005 | Miyashita et al. | |
| 6,928,001 B2 | 8/2005 | Avni et al. | |
| 6,934,190 B1 | 8/2005 | Liu et al. | |
| 6,937,511 B2 | 8/2005 | Hsu et al. | |
| 6,937,521 B2 | 8/2005 | Avni et al. | |
| 6,944,056 B2 | 9/2005 | Matsuzaki et al. | |
| 6,965,534 B2 | 11/2005 | Kim | |
| 7,009,887 B1 | 3/2006 | Hsia et al. | |
| 7,016,226 B2 | 3/2006 | Shibata et al. | |
| 7,106,226 B2 | 3/2006 | Shibata et al. | |
| 7,050,346 B2 | 5/2006 | Maejima | |
| 7,064,983 B2 | 6/2006 | Maayan et al. | |
| 7,106,627 B2 | 9/2006 | Shibata et al. | |
| 7,120,052 B2 | 10/2006 | Shibata et al. | |
| 7,136,304 B2 | 11/2006 | Cohen et al. | |
| 7,145,806 B2 | 12/2006 | Kawai | |
| 7,178,004 B2 | 2/2007 | Polansky et al. | |
| 7,190,620 B2 | 3/2007 | Maayan et al. | |
| 7,196,933 B2 | 3/2007 | Shibata | |
| 7,224,615 B2 | 5/2007 | Tanaka | |
| 7,245,528 B2 | 7/2007 | Shibata et al. | |
| 7,254,049 B2 | 8/2007 | Hartono | |
| 7,286,423 B2 | 10/2007 | Ramaraju | |
| 7,295,468 B2 | 11/2007 | Shibata | |
| 7,301,806 B2 | 11/2007 | Tanaka | |
| RE40,110 E | 2/2008 | Shibata et al. | |
| 7,330,372 B2 | 2/2008 | Hosono et al. | |
| 7,376,009 B2 | 5/2008 | Shibata et al. | |
| 7,400,537 B2 | 7/2008 | Hemink et al. | |
| 7,443,734 B2 | 10/2008 | Shibata | |
| 7,457,158 B2 | 11/2008 | Lee et al. | |
| 7,471,559 B2 | 12/2008 | Shibata | |
| 7,738,302 B2 | 6/2010 | Shibata et al. | |
| 7,813,170 B2 | 10/2010 | Shibata | |
| 7,813,171 B2 | 10/2010 | Shibata | |
| 7,843,723 B2 | 11/2010 | Shibata | |
| 7,940,546 B2 | 5/2011 | Thyagarajan et al. | |
| 8,077,514 B2 | 12/2011 | Shibata | |
| 8,144,521 B2 | 3/2012 | Park | |
| 8,154,930 B2 | 4/2012 | Shibata et al. | |
| 8,264,894 B2 | 9/2012 | Shibata | |
| 8,295,098 B2 | 10/2012 | Nobunaga et al. | |
| 8,385,130 B2 | 2/2013 | Shibata | |
| 8,542,538 B2 | 9/2013 | Shibata | |
| 8,582,365 B2 | 11/2013 | Kim | |
| 8,605,511 B2 | 12/2013 | Tanaka | |
| 8,835,130 B2 | 9/2014 | Nakazawa et al. | |
| 8,842,976 B2 * | 9/2014 | Ryu | H04N 9/8042 386/326 |
| 8,929,135 B2 | 1/2015 | Tanaka | |
| 9,142,299 B2 | 9/2015 | Shibata | |
| 9,190,161 B2 * | 11/2015 | Shibata | G11C 16/26 |
| 9,390,802 B2 | 7/2016 | Shibata | |
| 9,627,048 B2 | 4/2017 | Shibata | |
| 9,858,992 B2 | 1/2018 | Shibata | |
| 10,026,484 B2 * | 7/2018 | Shibata | G11C 11/5642 |
| 10,096,358 B2 | 10/2018 | Shibata | |
| 2001/0000023 A1 | 3/2001 | Kawahara | |
| 2001/0005328 A1 | 6/2001 | Tsunesada | |
| 2001/0009520 A1 | 7/2001 | Tsujikawa | |
| 2001/0014033 A1 | 8/2001 | Miyamoto | |
| 2001/0040821 A1 | 11/2001 | Tanaka | |
| 2002/0057598 A1 | 5/2002 | Sakamoto | |
| 2002/0097603 A1 | 7/2002 | Tanaka | |
| 2002/0110023 A1 | 8/2002 | Yoshida | |
| 2002/0126554 A1 | 9/2002 | Choi | |
| 2003/0008991 A1 | 1/2003 | Holmes | |

(56) References Cited

U.S. PATENT DOCUMENTS

| | | |
|---|---|---|
| 2003/0137876 A1 | 7/2003 | Hirano |
| 2003/0235080 A1 | 12/2003 | Yaegashi |
| 2004/0095807 A1 | 5/2004 | Suh |
| 2004/0105314 A1 | 6/2004 | Shibata |
| 2004/0109352 A1 | 6/2004 | Lee |
| 2004/0170056 A1 | 9/2004 | Shibata et al. |
| 2005/0024943 A1 | 2/2005 | Chen |
| 2005/0169057 A1 | 8/2005 | Shibata et al. |
| 2006/0215450 A1 | 9/2006 | Honma |
| 2007/0121378 A1 | 5/2007 | Shibata et al. |
| 2007/0253250 A1 | 11/2007 | Shibata et al. |
| 2008/0094910 A1 | 4/2008 | Sim |

FOREIGN PATENT DOCUMENTS

| | | |
|---|---|---|
| JP | 2000-76872 | 3/2000 |
| JP | 2000-149578 | 5/2000 |
| JP | 2000-163976 | 6/2000 |
| JP | 2000-163977 | 6/2000 |
| JP | 2000-195280 | 7/2000 |
| JP | 2000-228092 | 8/2000 |
| JP | 2000-276887 | 10/2000 |
| JP | 2001-67884 | 3/2001 |
| JP | 2001-312900 | 11/2001 |
| JP | 2003-032700 | 1/2003 |
| JP | 2003-109386 | 4/2003 |
| JP | 2003-196988 | 7/2003 |
| JP | 2004-192789 A | 7/2004 |
| JP | 02006172523 A | 6/2006 |

OTHER PUBLICATIONS

Office Action dated Sep. 13, 2011 in Japanese Patent Application No. 2008-099646 (with English translation ).

Japanese Office Action, dated Dec. 7, 2011 for Patent Application No. 2008-177382 (with English translation).

Notice of Reasons for Rejection dated Dec. 11, 2012 for JP Patent Application No. 2011-049501 with English translation.

* cited by examiner

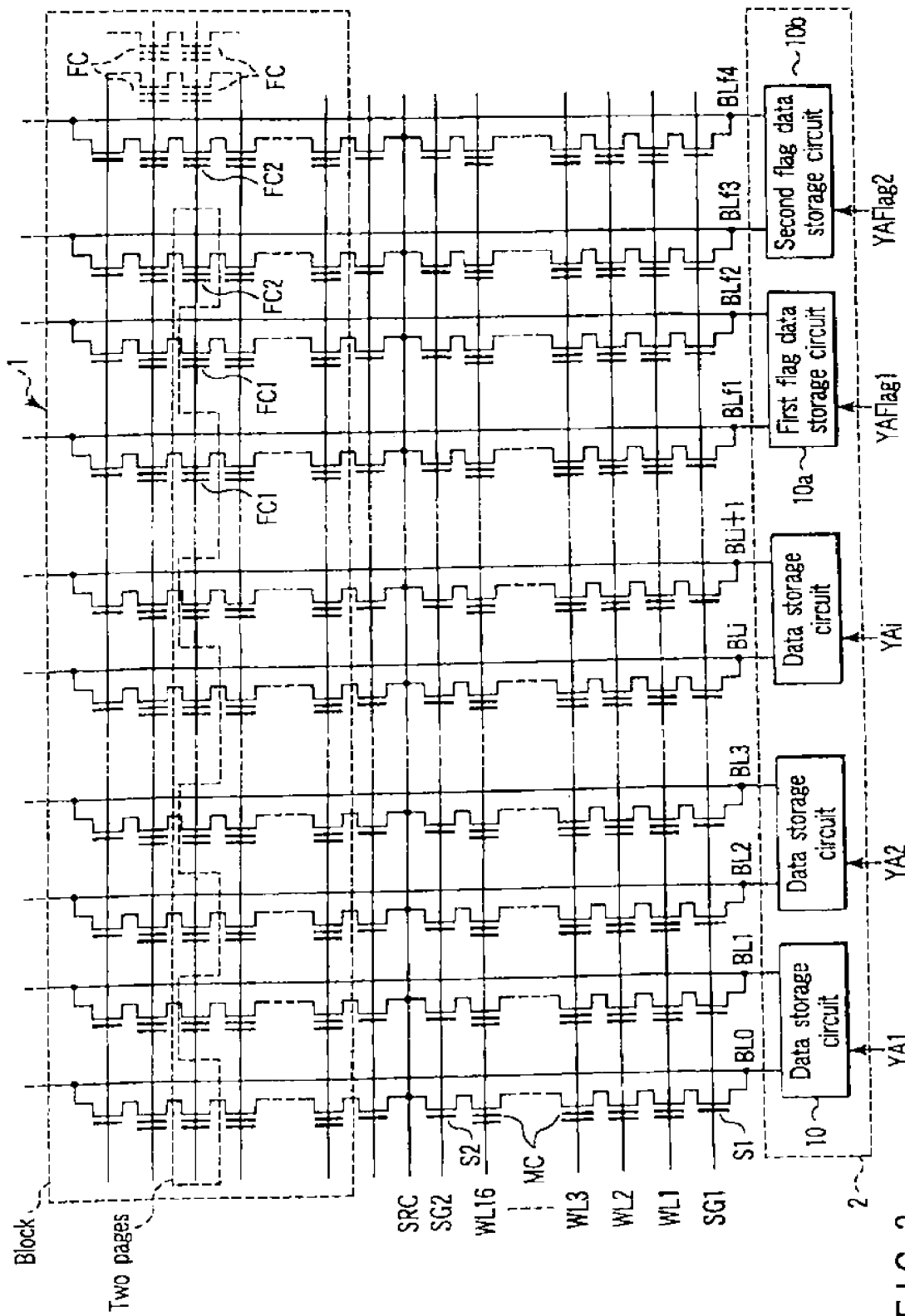
F I G. 3

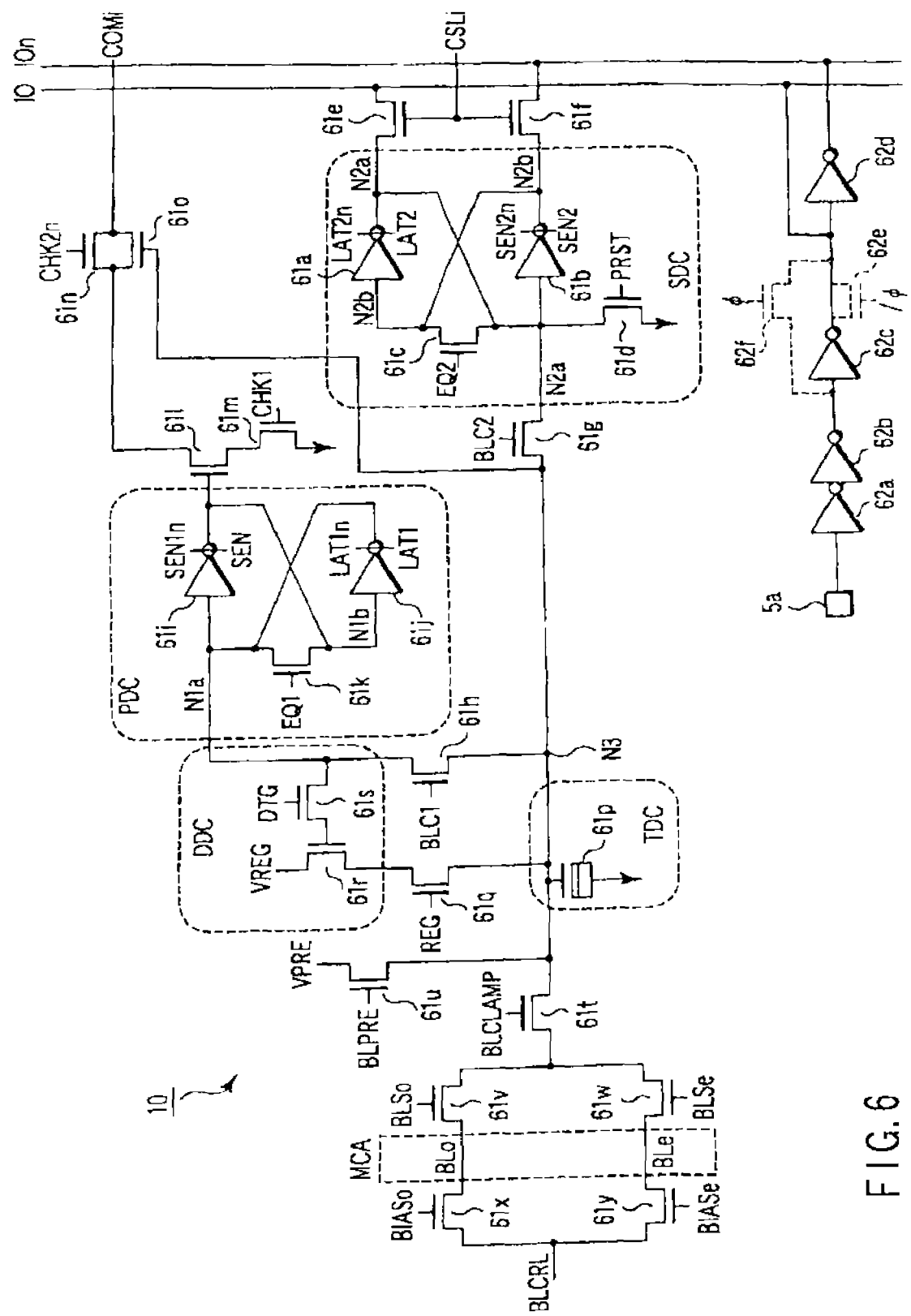
F I G. 6

Data load and after internal read

| | Data in memory cell after writing | | | | |
|---|---|---|---|---|---|
| | 0 | 1 | 2 | 3 | |
| SDC | 0 | 1 | 0 | 1 | Externally inputted data to be written and read data |
| PDC | 0 | 0 | 1 | 1 | Data to be read in internal read |

FIG. 10A

After data cache setting

| | Data in memory cell after writing | | | | |
|---|---|---|---|---|---|
| | 0 | 1 | 2 | 3 | |
| SDC | 1 | 1 | 0 | 0 | Used for charge in verifying memory cell data 1 |
| DDC | 1 | 0 | 1 | 0 | Used for charge in verifying memory cell data 2 |
| PDC | 1 | 0 | 0 | 0 | 1: Writing unselected, 0: Writing |

FIG. 10B

Procedure for setting data storage circuit

SDC→PDC, PDC→DDC

|  | Data in memory cell after writing |  |  |  |
|---|---|---|---|---|
|  | 0 | 1 | 2 | 3 | Externally inputted data to be written and read data |
| SDC | 0 | 1 | 0 | 1 |  |
| PDC | 0 | 0 | 1 | 1 | Data to be read in internal read |

FIG. 11A

SDC→PDC, PDC→DDC

|  | Data in memory cell after writing |  |  |  |
|---|---|---|---|---|
|  | 0 | 1 | 2 | 3 |
| SDC | 0 | 1 | 0 | 1 |
| DDC | 0 | 0 | 1 | 1 |
| PDC | 0 | 1 | 0 | 1 |

FIG. 11B

DDC-Inversion→SDC, PDC→DDC

|  | Data in memory cell after writing |  |  |  |
|---|---|---|---|---|
|  | 0 | 1 | 2 | 3 |
| SDC | 0 | 1 | 0 | 0 |
| DDC | 0 | 0 | 0 | 1 |
| PDC | 0 | 1 | 0 | 1 |

FIG. 11C

DDC-Inversion→PDC, PDC→DDC

|  | Data in memory cell after writing | | | |
|---|---|---|---|---|
|  | 0 | 1 | 2 | 3 |
| SDC | 1 | 1 | 0 | 0 |
| DDC | 0 | 1 | 0 | 1 |
| PDC | 1 | 0 | 1 | 0 |

FIG. 12A

Second flag cell data load (to SDC)

| SDC | 0 |
|---|---|

FIG. 12B

SDC+DDC-Inversion→PDC, PDC→DDC

|  | Data in memory cell after writing | | | |
|---|---|---|---|---|
|  | 0 | 1 | 2 | 3 |
| SDC | 1 | 1 | 0 | 0 |
| DDC | 1 | 0 | 1 | 0 |
| PDC | 1 | 0 | 0 | 0 |

| | Data in memory cell after writing | | | | |
|---|---|---|---|---|---|
| | 0 | 1 | 2 | 3 | |
| SDC | 1 | 1 | 0 | 0 | Used for charge in verifying memory cell data 1 |
| DDC | 1 | 0 | 1 | 0 | Used for charge in verifying memory cell data 2 |
| PDC | 1 | 0 | 0 | 0 | 1: Writing unselected, 0: Writing |

FIG. 13B

| | Data in memory cell after writing | | | | |
|---|---|---|---|---|---|
| | 0 | 1 | 2 | 3 | |
| SDC | 1 | 1 | 0 | 0 | Used for charge in verifying memory cell data 1 |
| DDC | 1 | 0 | 1 | 0 | 1: Writing unselected, 0: Writing |
| PDC | 1 | 0/1 | 1 | 0 | Used for charge in verifying memory cell data 2 Cell for memory cell data 1 exceeds a*→1 |

| | Data in memory cell after writing | | | | |
|---|---|---|---|---|---|
| | 0 | 1pass | 1fail | 2 | 3 | |
| SDC | 1 | 1 | 1 | 0 | 0 | Used for charge in verifying memory cell data 1 |
| DDC | 1 | 1 | 0/1 | 1 | 0 | Used for charge in verifying memory cell data 2<br>Cell for memory cell data 1 exceeds a*→1 |
| PDC | 1 | 1 | 0 | 0 | 0 | 1: Writing unselected, 0: Writing |

F I G. 14

| | Data in memory cell after writing | | | | |
|---|---|---|---|---|---|
| | 0 | 1 | 2fail | 2pass | 3 | |
| SDC | 1 | 1 | 0 | 0 | 0 | Used for charge in verifying memory cell data 1 |
| DDC | 1 | 0/1 | 1 | 1 | 0 | Used for charge in verifying memory cell data 2 Cell for memory cell data 1 exceeds a*→1 |
| PDC | 1 | 0 | 0 | 1 | 0 | 1: Writing unselected, 0: Writing |

F I G. 15

|  | Data in memory cell after writing | | | | | |
| --- | --- | --- | --- | --- | --- | --- |
|  | 0 | 1 | 2 | 3fail | 3pass | |
| SDC | 0 | 1 | 0 | 0 | 0 | Used for charge in verifying memory cell data 1 |
| DDC | 1 | 0/1 | 1 | 0 | 0 | Used for charge in verifying memory cell data 2 Cell for memory cell data 1 exceeds a*→1 |
| PDC | 1 | 0 | 0 | 0 | 1 | 1: Writing unselected, 0: Writing |

F I G. 16

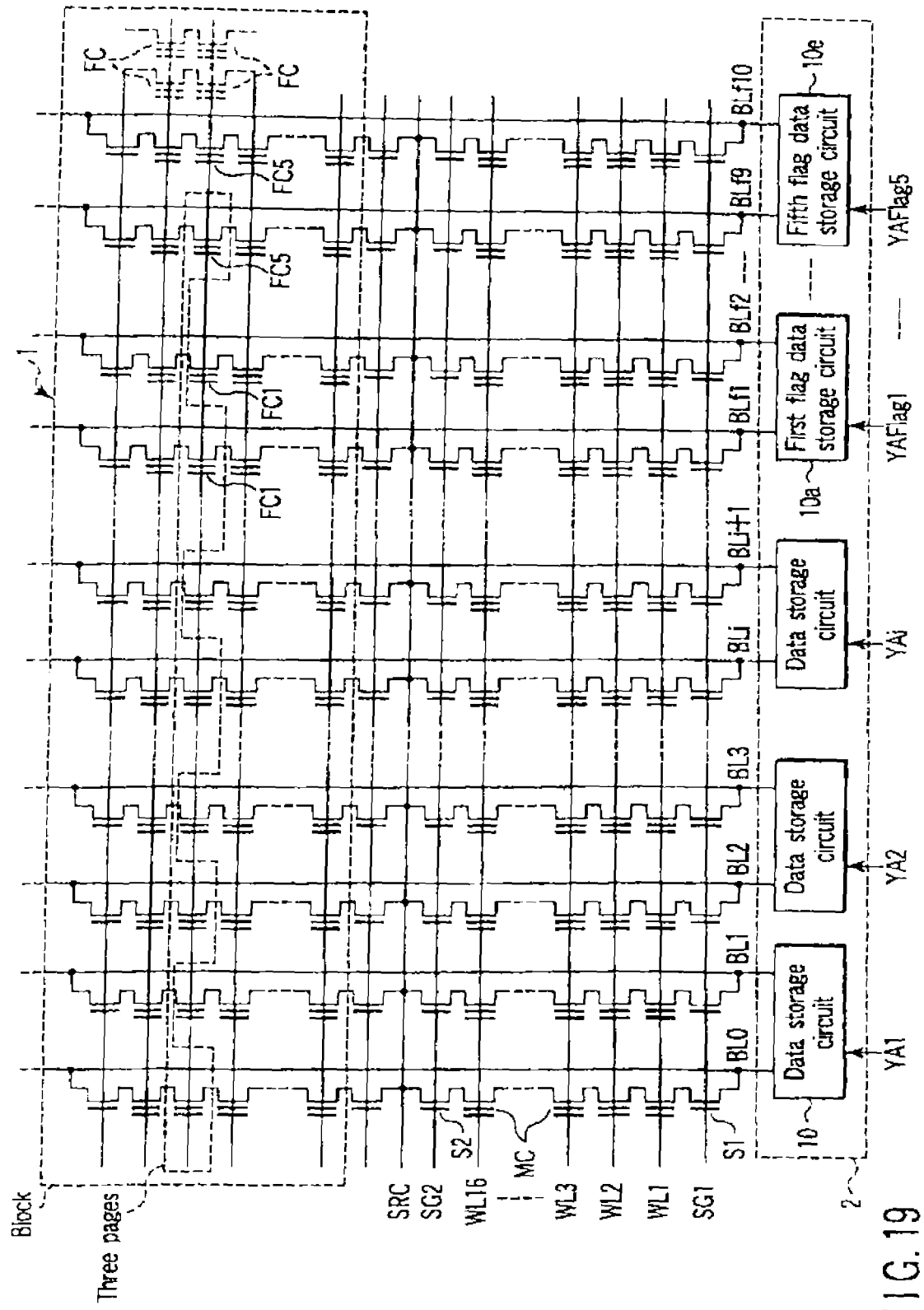
F I G. 19

After third page data load internal read 1

| | Data in memory cell after writing | | | | | | | | |
|---|---|---|---|---|---|---|---|---|---|
| | 0 | 1 | 2 | 3 | 4 | 5 | 6 | 7 | |
| SDC | 0 | 1 | 1 | 0 | 0 | 1 | 1 | 0 | Externally inputted data to be written and read data |
| DDC | 0 | 0 | 0 | 0 | 0 | 0 | 1 | 1 | Data to be read in internal read |
| PDC | 0 | 0 | 0 | 0 | 1 | 1 | 1 | 1 | Data to be read in internal read |

FIG. 25A

After third page data cache setting 1

| | Data in memory cell after writing | | | | | | | | |
|---|---|---|---|---|---|---|---|---|---|
| | 0 | 1 | 2 | 3 | 4 | 5 | 6 | 7 | |
| SDC | 1 | 1 | 1 | 1 | 1 | 1 | 0 | 0 | Used for verifying memory cell data 5, 4 |
| DDC | 0 | 1 | 1 | 1 | 0 | 1 | 0 | 0 | Used for verifying memory cell data 6, 4 |
| PDC | 1 | 1 | 1 | 1 | 0 | 0 | 0 | 0 | 1: Nonwriting, 0: Writing |

FIG. 25B

After third page data cache setting 2

| | Data in memory cell after writing | | | | | | | | |
|---|---|---|---|---|---|---|---|---|---|
| | 0 | 1 | 2 | 3 | 4 | 5 | 6 | 7 | |
| SDC | 1 | 1 | 0 | 0 | 0 | 0 | 0 | 0 | Used for verifying memory cell data 1 |
| DDC | 1 | 0/1 | 1 | 0 | 0 | 1 | 1 | 0 | Used for verifying memory cell data 2<br>Cell for memory cell data 1 exceeds a*→1 |
| PDC | 1 | 0 | 0 | 0 | 1 | 1 | 1 | 1 | 1: Nonwriting, 0: Writing |

F I G. 26

| Memory cell array | BLE | BL0 | BLE | BL0 | BLE | BL0 | BLE | BL0 | BLE | BL0 | BLE | BL0 | BLE | BL0 | BLE | BL0 |
|---|---|---|---|---|---|---|---|---|---|---|---|---|---|---|---|---|
| | First flag cell | First flag cell | First flag cell | First flag cell | First flag cell | First flag cell | First flag cell | First flag cell | Dummy cell | Second flag cell | Second flag cell | Second flag cell | Second flag cell | Second flag cell | Second flag cell | Dummy cell |

FIG. 32

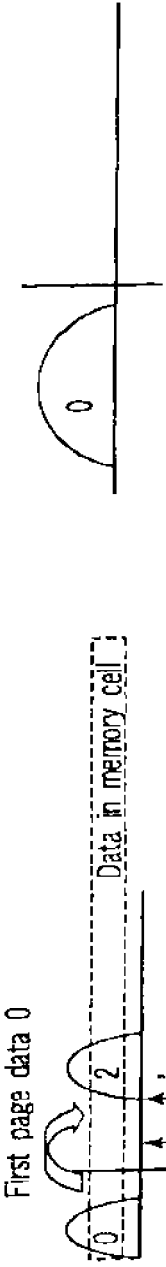# FIG. 33A
After first page is written into and before second page is written into
First page data 0

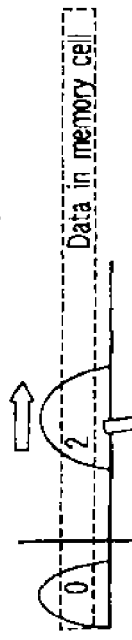# FIG. 33B
Before second page is written into and after adjacent cells are written into

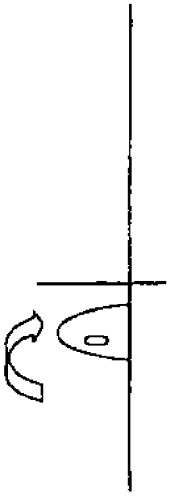# FIG. 33E
After erasing is done

# FIG. 33C
After second page is written into
first page data 1 and second page data 0
first page data 0 and second page data 1

# FIG. 33F
After erasing is done and after writing is done

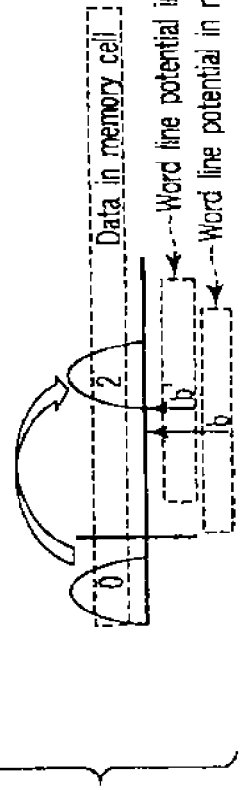# FIG. 33D
Second flag cell (after second page is written into)

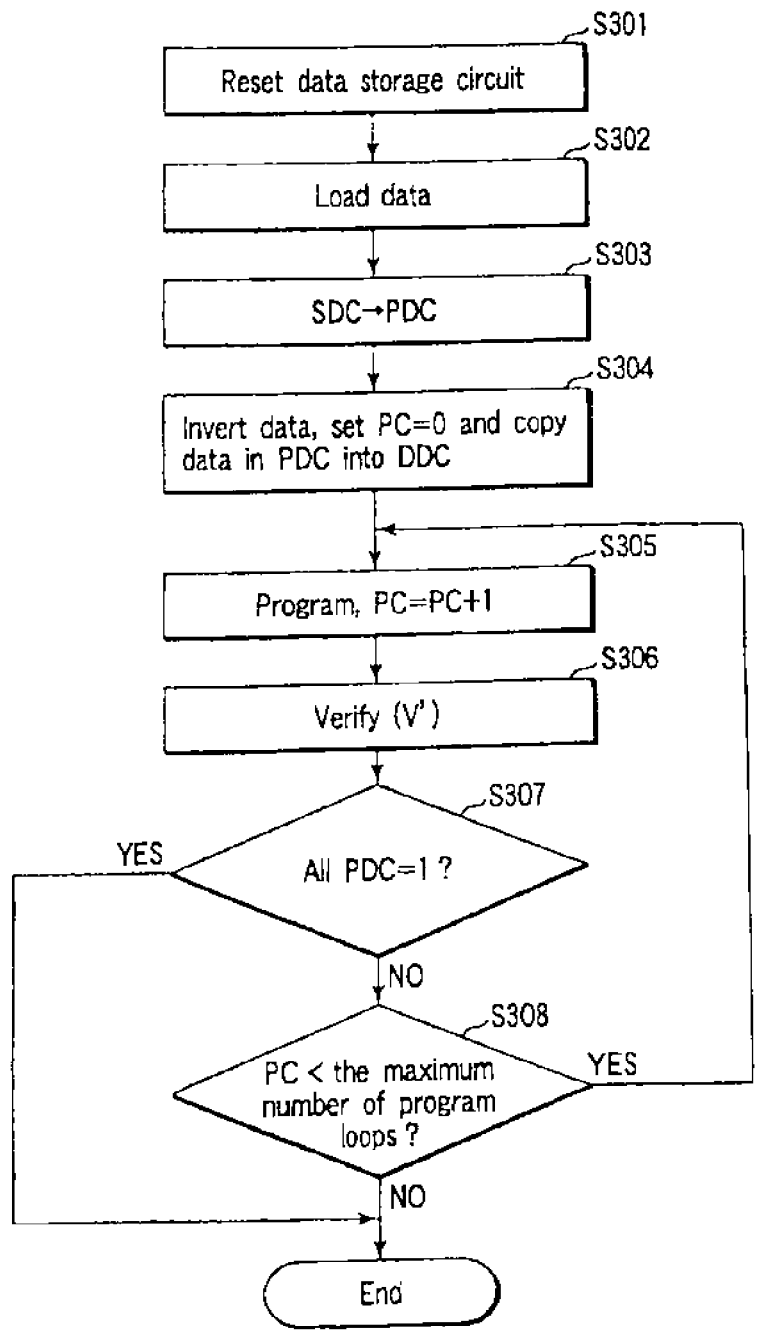
F I G. 34

After data load and internal read

| | Data in memory cell after writing | | | |
|---|---|---|---|---|
| | 0 | 1 | 2 | 3 | |
| SDC | 0 | 1 | 0 | 1 | Externally inputted data to be written and read data |
| PDC | 0 | 0 | 1 | 1 | Data to be read in internal read |

FIG. 36A

After data cache setting

| | Data in memory cell after writing | | | |
|---|---|---|---|---|
| | 0 | 1 | 2 | 3 | |
| SDC | 1 | 1 | 0 | 0 | Used for charge in verifying memory cell data 1 |
| DDC | 1 | 0 | 1 | 0 | Used for charge in verifying memory cell data 2 |
| PDC | 1 | 0 | 0 | 0 | 1: Writing unselected, 0: Writing |

FIG. 36B

Verify (b', c*', c')

FIG. 37A

| | Data in memory cell after writing | | | | | |
|---|---|---|---|---|---|---|
| | 0 | 1 | 1 | 2fail | 2pass | 3 |
| SDC | 1 | 1 | 1 | 0 | 0 | 0 | Used for charge in verifying memory cell data 1 |
| DDC | 1 | 0/1 | 1 | 1 | 0 | 0 | Used for charge in verifying memory cell data 2. Cell for memory cell data 1 exceeds a*→1 |
| PDC | 1 | 0 | 1 | 0 | 1 | 0 | 1: Writing unselected, 0: Writing |

FIG. 37B

| | Data in memory cell after writing | | | | | |
|---|---|---|---|---|---|---|
| | 0 | 1 | 1 | 2 | 3'fail | 3'pass |
| SDC | 1 | 1 | 1 | 0 | 0 | 0 | Used for charge in verifying memory cell data 1 |
| DDC | 1 | 1 | 0 | 0 | 0 | 0 | 1: Writing unselected, 0: Writing |
| PDC | 1 | 1 | 0/1 | 1 | 0 | 1 | Used for charge in verifying memory cell data 2. Cell for memory cell data 1 exceeds a*'→1 |

| | Data in memory cell after writing | | | 3' fail / 3fail | 3' pass / 3fail | 3' pass / 3pass | |
|---|---|---|---|---|---|---|---|
| | 0 | 1 | 2 | | | | |
| SDC | 1 | 1 | 0 | 0 | 0 | 0 | Used for charge in verifying memory cell data 1 |
| DDC | 1 | 0/1 | 1 | 0 | 1 | 1 | Used for charge in verifying memory cell data 2<br>Cell for memory cell data 1 exceeds a*' →1<br>Cell for memory cell data 3 exceeds c*' →1 |
| PDC | 1 | 0 | 0 | 0 | 0 | 1 | 1: Writing unselected, 0: Writing |

F I G. 38

After program verify

| | Data in memory cell after writing | | | | |
|---|---|---|---|---|---|
| | 0 | 1fail | 1'pass 1fail | 1'pass 1pass | |
| DDC | 1 | 0 | 1 | 1 | Writing unselected→1, Verify level "a*¹" is exceeded→1 |
| PDC | 1 | 0 | 0 | 1 | 1: Writing unselected, 0: Writing |

FIG. 39A

After data refresh 1

| | Data in memory cell after writing | | | | |
|---|---|---|---|---|---|
| | 0 | 1fail | 1'pass 1fail | 1'pass 1pass | |
| DDC | 1 | 0 | 0 | 1 | 1: Writing unselected, 0: Writing |
| PDC | 1 | 0 | 1 | 1 | Writing unselected→1, Verify level "a*¹" is exceeded→1 |
| TDC | 1 | 0 | 1 | 1 | Writing unselected→1, Verify level "a*¹" is exceeded→1 |

FIG. 39B

After data refresh 2

| | Data in memory cell after writing | | | | |
|---|---|---|---|---|---|
| | 0 | 1fail | 1'pass 1fail | 1'pass 1pass | |
| DDC | 1 | 0 | 1 | 1 | Writing unselected→1, Verify level "a*¹" is exceeded→1 |
| PDC | 1 | 0 | 1 | 1 | Writing unselected→1, Verify level "a*¹" is exceeded→1 |

FIG. 39C

| After program verify | Data in memory cell after writing | | | | | |
|---|---|---|---|---|---|---|
| | 0 | 1 | 1' pass | 2 | 3 | 3' pass | |
| SDC | 1 | 1 | 1 | 0 | 0 | 0 | Used for charge in verifying memory cell data 1 |
| DDC | 1 | 0 | 1 | 1 | 0 | 1 | Used for charge in verifying memory cell data 2<br>Cell for memory cell data 1 exceeds a*' →1<br>Cell for memory cell data 3 exceeds c*' →1 |
| PDC | 1 | 0 | 0 | 0 | 0 | 0 | 1: Writing unselected, 0: Writing |
| Bit line | 1 | 0 | Interim | Interim | 0 | Interim | 1: Writing unselected, 0: Writing |

|  | Data in memory cell after writing | | | | | |
|---|---|---|---|---|---|---|
|  | 0 | 1 | 1' pass | 2 | 3 | 3' pass |
| SDC | 1 | 1 | 1 | 0 | 0 | 0 | Used for charge in verifying memory cell data 1 |
| DDC | 0 | 1 | 0 | 0 | 1 | 0 |
| PDC | 0 | 1 | 0 | 0 | 1 | 0 |
| Bit line | 1 | 0 | Interim | Interim | 0 | Interim | 1: Writing unselected, 0: Writing |

FIG. 41B

|  | Data in memory cell after writing | | | | | |
|---|---|---|---|---|---|---|
|  | 0 | 1 | 1' pass | 2 | 3 | 3' pass |
| SDC | 1 | 1 | 1 | 0 | 0 | 0 | Used for charge in verifying memory cell data 1 |
| DDC | 0 | 1 | 0 | 0 | 1 | 0 |
| PDC | 1 | 0 | 1 | 0 | 0 | 0 |
| Bit line | 1 | 0 | Interim | Interim | 0 | Interim | 1: Writing unselected, 0: Writing |

FIG. 42A

| | | Data in memory cell after writing | | | | | |
|---|---|---|---|---|---|---|---|
| | 0 | 1 | 1' pass | 2 | 3 | 3' pass | |
| SDC | 1 | 1 | 1 | 0 | 0 | 0 | Used for charge in verifying memory cell data 1 |
| DDC | 1 | 0 | 1 | 0 | 0 | 0 | |
| PDC | 1 | 0 | 1 | 1 | 0 | 1 | |
| Bit line | 1 | 0 | Interim | Interim | 0 | Interim | 1: Writing unselected, 0: Writing |

FIG. 42B

| | | Data in memory cell after writing | | | | | |
|---|---|---|---|---|---|---|---|
| | 0 | 1 | 1' pass | 2 | 3 | 3' pass | |
| SDC | 1 | 1 | 1 | 0 | 0 | 0 | Used for charge in verifying memory cell data 1 |
| DDC | 1 | 0 | 1 | 1 | 0 | 1 | |
| PDC | 1 | 0 | 1 | 0 | 0 | 0 | 1: Writing unselected, 0: Writing |

After third page data load and internal read 1

| | Data in memory cell after writing | | | | | | | | |
|---|---|---|---|---|---|---|---|---|---|
| | 0 | 1 | 2 | 3 | 4 | 5 | 6 | 7 | |
| SDC | 0 | 1 | 0 | 1 | 0 | 1 | 0 | 1 | Externally inputted data to be written and read data |
| DDC | 0 | 0 | 0 | 0 | 0 | 0 | 1 | 1 | Data to be read in internal read |
| PDC | 0 | 0 | 0 | 0 | 1 | 1 | 1 | 1 | Data to be read in internal read |

FIG. 47A

After third page data cache setting 1

| | Data in memory cell after writing | | | | | | | | |
|---|---|---|---|---|---|---|---|---|---|
| | 0 | 1 | 2 | 3 | 4 | 5 | 6 | 7 | |
| SDC | 1 | 1 | 1 | 1 | 1 | 1 | 0 | 0 | Used for verifying memory cell data 5, 4 |
| DDC | 1 | 0 | 1 | 0 | 1 | 0 | 1 | 0 | Used for verifying memory cell data 6, 4 |
| PDC | 1 | 1 | 1 | 1 | 0 | 0 | 0 | 0 | 1: Unwriting, 0: Writing |

FIG. 47B

Verify (d')

| | Data in memory cell after writing | | | | | | | | | |
|---|---|---|---|---|---|---|---|---|---|---|
| | 0 | 1 | 2 | 3 | 4fail | 4pass | 5 | 6 | 7 | |
| SDC | 1 | 1 | 1 | 1 | 1 | 1 | 1 | 0 | 0 | Used for verifying memory cell data 5, 4 |
| DDC | 1 | 0 | 1 | 0 | 1 | 1 | 0 | 1 | 0 | Used for verifying memory cell data 6, 4 |
| PDC | 1 | 1 | 1 | 1 | 0 | 1 | 0 | 0 | 0 | 1: Unwriting, 0: Writing |

FIG. 48A

Verify (d', e*, e')

| | Data in memory cell after writing | | | | | | | | | | | |
|---|---|---|---|---|---|---|---|---|---|---|---|---|
| | 0 | 1 | 2 | 3 | 4fail | 4pass | 5'fail 5fail | 5'pass 5fail | 5'pass 5pass | 6 | 7 | |
| SDC | 1 | 1 | 1 | 1 | 1 | 1 | 1 | 1 | 1 | 0 | 0 | Used for verifying memory cell data 5, 4 |
| DDC | 1 | 0 | 1 | 0 | 1 | 1 | 0 | 1 | 1 | 1 | 0 | Used for verifying memory cell data 6, 4 |
| PDC | 1 | 1 | 1 | 1 | 0 | 1 | 0 | 0 | 1 | 0 | 0 | 1: Unwriting, 0: Writing |

FIG. 48B

Verify (f')

| | \multicolumn{9}{c|}{Data in memory cell after writing} | |
|---|---|---|---|---|---|---|---|---|---|---|
| | 0 | 1 | 2 | 3 | 4 | 5 | 6fail | 6pass | 7 | |
| SDC | 1 | 1 | 1 | 1 | 1 | 1 | 0 | 0 | 0 | Used for verifying memory cell data 5, 4 |
| DDC | 1 | 0 | 1 | 0 | 1 | 0 | 1 | 1 | 0 | Used for verifying memory cell data 6, 4 |
| PDC | 1 | 1 | 1 | 1 | 0 | 0 | 0 | 1 | 0 | 1: Unwriting, 0: Writing |

FIG. 49A

Verify (f', g', g'')

| | \multicolumn{11}{c|}{Data in memory cell after writing} | |
|---|---|---|---|---|---|---|---|---|---|---|---|---|
| | 0 | 1 | 2 | 3 | 4 | 5 | 6fail | 6pass | 7'fail 7fail | 7'pass 7fail | 7'pass 7pass | |
| SDC | 1 | 1 | 1 | 1 | 1 | 1 | 0 | 0 | 0 | 0 | 0 | Used for verifying memory cell data 5, 4 |
| DDC | 1 | 0 | 1 | 0 | 1 | 0 | 1 | 1 | 0 | 1 | 1 | Used for verifying memory cell data 6, 4 |
| PDC | 1 | 1 | 1 | 1 | 0 | 0 | 0 | 1 | 0 | 0 | 1 | 1: Unwriting, 0: Writing |

FIG. 49B

After third page data cache setting 2

| | \ Data in memory cell after writing | | | | | | | |
|---|---|---|---|---|---|---|---|---|
| | 0 | 1 | 2 | 3 | 4 | 5 | 6 | 7 | |
| SDC | 0 | 1 | 0 | 0 | 0 | 0 | 0 | 0 | Used for verifying memory cell data 1 |
| DDC | 1 | 1 | 0/1 | 0 | 1 | 0 | 1 | 0 | Used for verifying memory cell data 2 Cell for memory cell data 1 exceeds a*←1 |
| PDC | 1 | 0 | 0 | 0 | 1 | 1 | 1 | 1 | 1:Unwriting, 0:Writing |

FIG. 50A

Verify (a', a*)

| | \ Data in memory cell after writing | | | | | | | |
|---|---|---|---|---|---|---|---|---|
| | 0 | 1'fail | 1'pass | 2 | 3 | 4 | 5 | 6 | 7 | |
| SDC | 1 | 1 | 1 | 0 | 0 | 0 | 0 | 0 | 0 | Used for verifying memory cell data 1 |
| DDC | 1 | 1 | 0 | 0 | 0 | 1 | 1 | 1 | 1 | 1:Unwriting, 0:Writing |
| PDC | 1 | 0 | 1 | 1 | 0 | 1 | 0 | 1 | 0 | Used for verifying memory cell data 2, 1' |

FIG. 50B

Verify (a')

| | 0 | 1' fail 1fail | 1' pass 1fail | 1' pass 1pass | 2 | 3 | 4 | 5 | 6 | 7 | |
|---|---|---|---|---|---|---|---|---|---|---|---|
| | | | Data in memory cell after writing | | | | | | | | |
| SDC | 1 | 1 | 1 | 1 | 0 | 0 | 0 | 0 | 0 | 0 | Used for verifying memory cell data 1 |
| DDC | 1 | 0 | 1 | 1 | 1 | 0 | 1 | 0 | 1 | 0 | Used for verifying memory cell data 2, 1' |
| PDC | 1 | 0 | 0 | 0 | 0 | 0 | 1 | 1 | 1 | 1 | 1: Unwriting, 0: Writing |

FIG. 51A

Verify (b')

| | 0 | 1 | 2 fail | 2 pass | 3 | 4 | 5 | 6 | 7 | |
|---|---|---|---|---|---|---|---|---|---|---|
| | | | Data in memory cell after writing | | | | | | | |
| SDC | 1 | 1 | 0 | 0 | 0 | 0 | 0 | 0 | 0 | Used for verifying memory cell data 5, 4 |
| DDC | 1 | 0/1 | 1 | 1 | 0 | 1 | 0 | 1 | 0 | Used for verifying memory cell data 6, 4 |
| PDC | 1 | 0 | 0 | 1 | 0 | 1 | 1 | 1 | 1 | 1: Unwriting, 0: Writing |

FIG. 51B

| Verify (b', c*, c') | | | | | | | | | | | |
|---|---|---|---|---|---|---|---|---|---|---|---|
| | 0 | 1 | 2fail | 2pass | 3'fail 3fail | 3' pass 3fail | 3' pass 3pass | 4 | 5 | 6 | 7 | |
| SDC | 1 | 1 | 0 | 0 | 0 | 0 | 0 | 0 | 0 | 0 | 0 | Used for verifying memory cell data 5, 4 |
| DDC | 1 | 0/1 | 1 | 1 | 0 | 1 | 1 | 1 | 0 | 1 | 0 | Used for verifying memory cell data 6, 4 |
| PDC | 1 | 0 | 0 | 1 | 0 | 0 | 1 | 1 | 1 | 1 | 1 | 1: Unwriting, 0: Writing |

F I G. 52

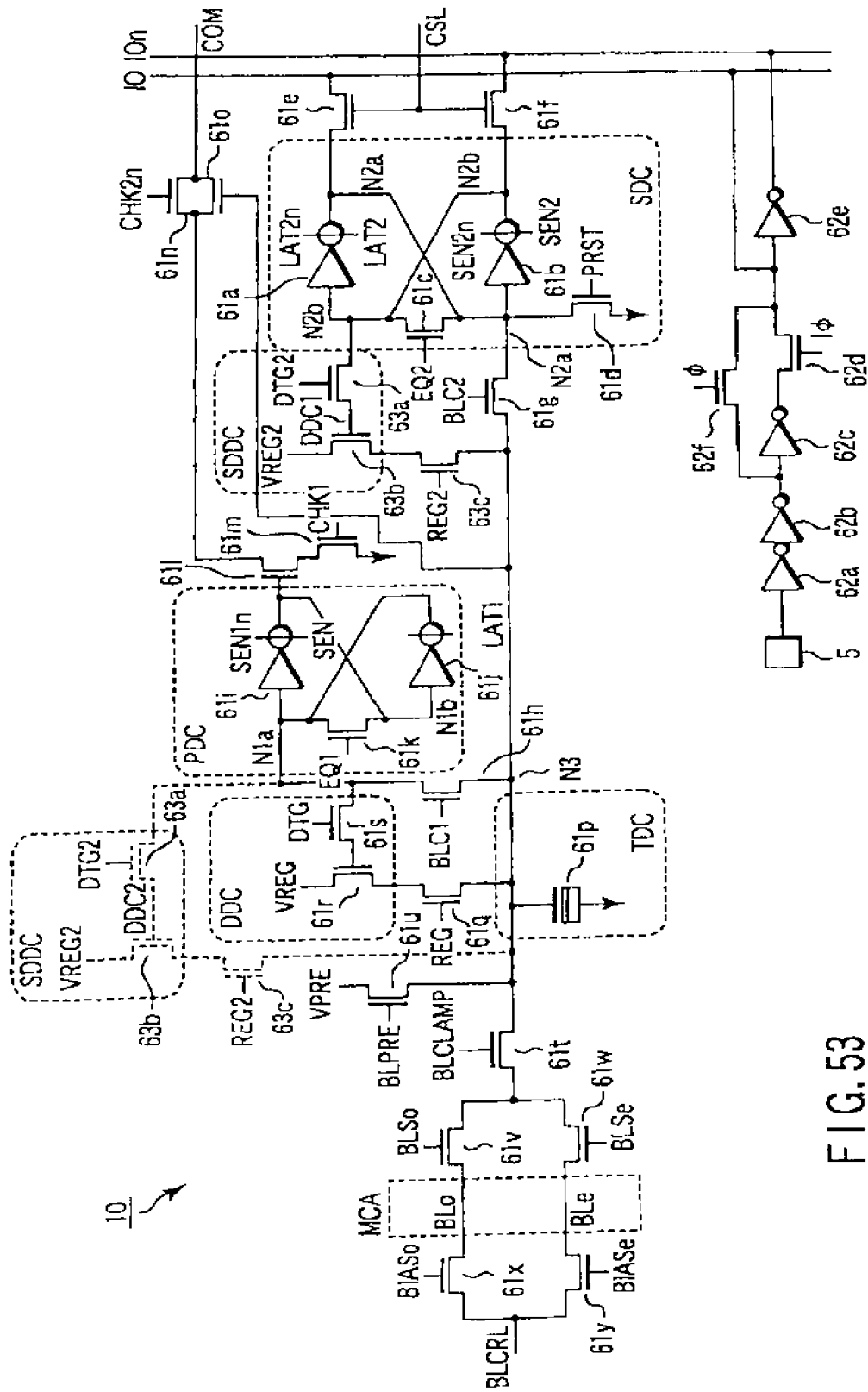
F I G. 53

After third page data load and internal read 1

| | \multicolumn{8}{c|}{Data in memory cell after writing} | |
|---|---|---|---|---|---|---|---|---|---|
| | 0 | 1 | 2 | 3 | 4 | 5 | 6 | 7 | |
| SDDC | 0 | 0 | 1 | 1 | 1 | 1 | 1 | 1 | Data to be read in internal read |
| SDC | 0 | 1 | 0 | 1 | 0 | 1 | 0 | 1 | Externally inputted data to be written and read |
| DDC | 0 | 0 | 0 | 0 | 0 | 0 | 1 | 1 | Data to be read in internal read |
| PDC | 0 | 0 | 0 | 0 | 1 | 1 | 1 | 1 | Data to be read in internal read |

FIG. 56A

After third page data cache setting

| | Data in memory cell after writing | | | | | | | | |
|---|---|---|---|---|---|---|---|---|---|
| | 0 | 1 | 2 | 3 | 4 | 5 | 6 | 7 | |
| SDDC | 1 | 1 | 0 | 0 | 1 | 1 | 0 | 0 | Used for verifying memory cell data 5, 4, 1, 0 |
| SDC | 1 | 1 | 1 | 1 | 0 | 0 | 0 | 0 | Used for verifying memory cell data 3, 2, 1, 0 |
| DDC | 1 | 0 | 1 | 0 | 1 | 0 | 1 | 0 | Used for verifying memory cell data 7, 5, 3, 1 |
| PDC | 1 | 0 | 0 | 0 | 0 | 0 | 0 | 0 | 1: Unwriting, 0: Writing |

FIG. 56B

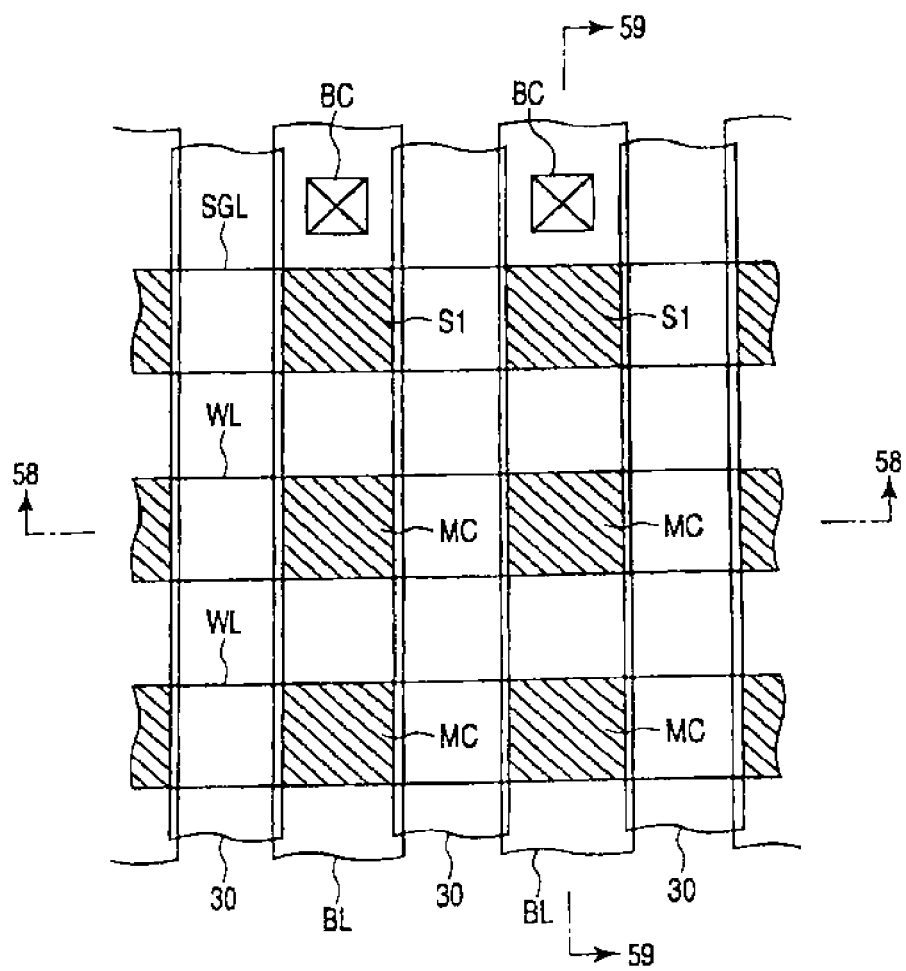
F I G. 57

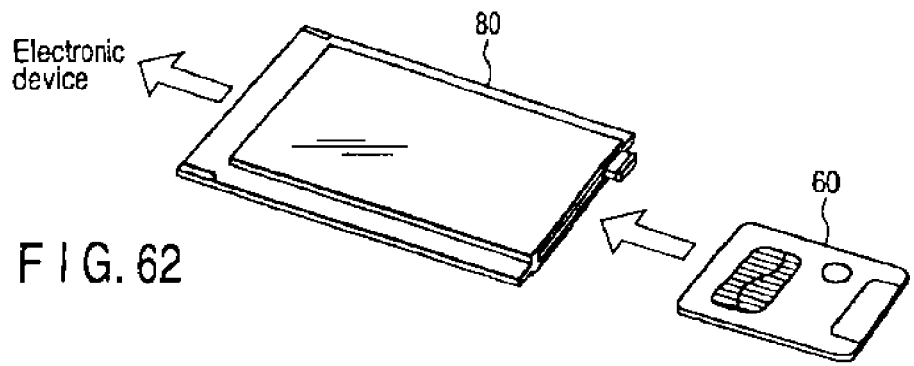
F I G. 62
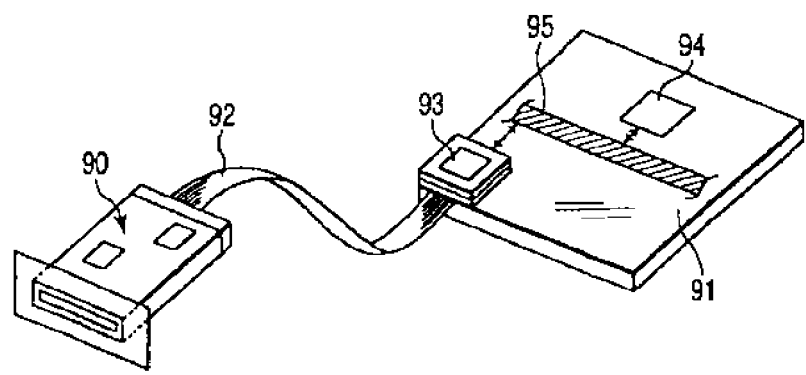
F I G. 63
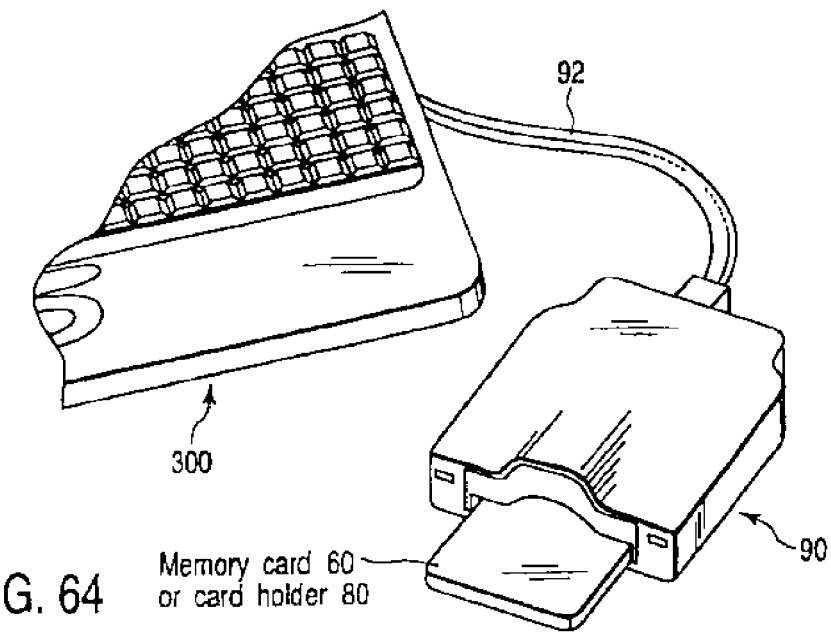
F I G. 64

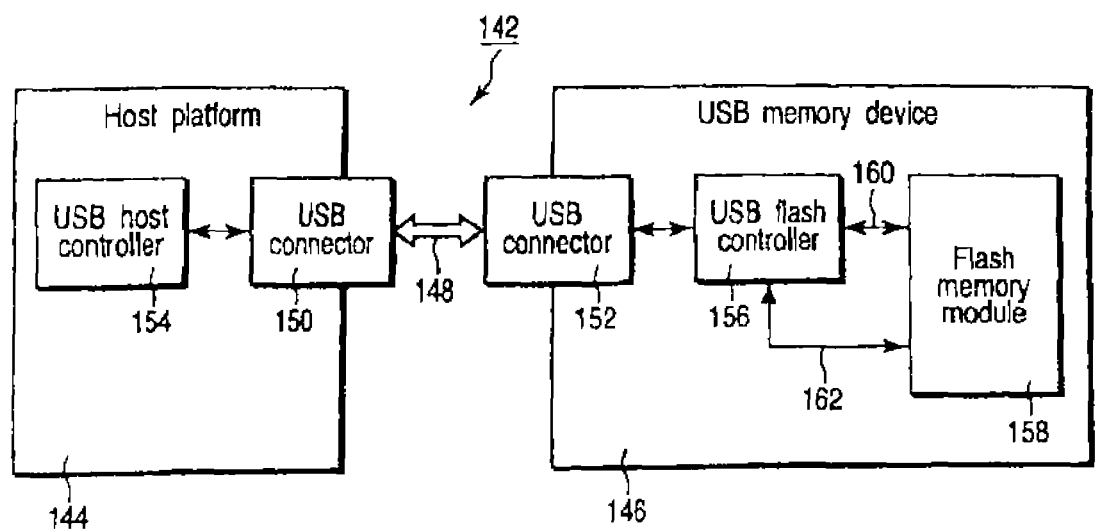
F I G. 67

SEMICONDUCTOR MEMORY DEVICE WHICH STORES PLURAL DATA IN A CELL

CROSS-REFERENCE TO RELATED APPLICATIONS

This application is a continuation of and claims the benefit of priority under 35 U.S.C. § 120 from U.S. application Ser. No. 16/539,205, filed Aug. 13, 2019, which is a continuation of U.S. application Ser. No. 16/125,601, now U.S. Pat. No. 10,431,297, filed Sep. 7, 2018, which is a continuation of U.S. application Ser. No. 15/832,557, now U.S. Pat. No. 10,096,358, filed Dec. 5, 2017, which is a continuation of U.S. application Ser. No. 15/453,302, now U.S. Pat. No. 9,858,992, filed Mar. 8, 2017, which is a continuation of U.S. application Ser. No. 15/175,806, now U.S. Pat. No. 9,627,048, filed Jun. 7, 2016, which is a continuation of U.S. application Ser. No. 14/825,858, filed Aug. 13, 2015, now U.S. Pat. No. 9,390,802, which is a continuation of U.S. application Ser. No. 14/017,611, filed Sep. 4, 2013, now U.S. Pat. No. 9,142,299, which is a continuation of U.S. application Ser. No. 13/754,057, filed Jan. 30, 2013, now U.S. Pat. No. 8,542,538, which is a continuation of U.S. application Ser. No. 13/413,779, filed Mar. 7, 2012, now U.S. Pat. No. 8,385,130, which is a division of U.S. application Ser. No. 12/775,571, filed May 7, 2010, now U.S. Pat. No. 8,154,930, which is a continuation of U.S. application Ser. No. 12/117,767, filed May 9, 2008, now U.S. Pat. No. 7,738,302, which is a division of U.S. application Ser. No. 11/759,627, filed Jun. 7, 2007, now U.S. Pat. No. 7,376,009, which is a division of U.S. application Ser. No. 10/988,592, filed Nov. 16, 2004, now U.S. Pat. No. 7,245,528 and claims the benefit of priority under 35 U.S.C. § 119 from Japanese Patent Applications No. 2004-024475, filed Jan. 30, 2004, and No. 2004-160165, filed May 28, 2004, the entire contents of all of which are incorporated herein by reference.

BACKGROUND OF THE INVENTION

1. Field of the Invention

This invention relates to a semiconductor memory device capable of storing, for example, 2 bits or more of data.

2. Description of the Related Art

A nonvolatile semiconductor memory device capable of storing multivalued data, such as a NAND flash memory using EEPROM, has been proposed (for example, refer to Jpn. Pat. Appln. KOKAI Publication No. 2000-195280).

In a nonvolatile semiconductor memory device of this type, when multivalued data is stored in a memory cell, a threshold voltage corresponding to each data is set in the memory cell. The number of threshold voltages increases as the number of bits in data stored in the memory cell increases. For example, to store 2 bits of 4-valued data, four threshold voltages are required. To store 3 bits of 8-valued data, eight threshold voltages are needed.

When data is written into a memory cell, it is verified whether the threshold voltage of the memory cell has reached a threshold voltage corresponding to the data to be written. To carry out a verify operation, the bit line to which the memory cell is connected is precharged to a specific potential. In this state, a verify voltage is supplied to the word line. If the threshold voltage of the memory cell has not reached the threshold voltage corresponding to the writing data, the memory cell turns on. As a result, the potential on the bit line is discharged via the memory cell and therefore goes low. In contrast, if the threshold voltage of the memory cell has reached the threshold voltage corresponding to the writing data, the memory cell remains off. As a result, the bit line remains high. The potential on the bit line is detected, thereby verifying the threshold voltage of the memory cell. The result of the verification has shown that the threshold voltage of the memory cell has not reached the threshold voltage corresponding to the data to be written into, writing is done again.

As described above, in a nonvolatile semiconductor memory device which stores multivalued data, when the number of bits of data to be stored is large, the number of threshold voltages set in the memory cell increases. In writing data, the verify operation has to be carried for on each threshold voltage. Consequently, it requires a long time to carry out the verify operation, which makes it difficult to speed up the data write operation.

BRIEF SUMMARY OF THE INVENTION

According to a first aspect of the present intention, there is provided a semiconductor memory device comprising: a memory cell array which is configured to have a plurality of memory cells arranged in a matrix, each of the plurality of memory cells being connected to a word line and a bit line and being capable of storing n values (n is a natural number equal to or larger than 3); and a control circuit which controls the potential of the word line and bit line according to input data and writes data into a memory cell and which writes data into the memory cell to a k-valued threshold voltage ($k<=n$) in a write operation, precharges the bit line once, and then changes the potential of the word line an i number of times to verify whether the memory cell has reached an i-valued ($i<=k$) threshold voltage.

According to a second aspect of the present intention, there is provided a semiconductor memory device comprising: a memory cell array which is configured to have a plurality of memory cells arranged in a matrix, each of the plurality of memory cells being connected to a word line and a bit line and being capable of storing 4 values; and a control circuit which controls the potentials of the word line and bit line according to input data and writes data into the memory cell and, wherein the control circuit, in a first write operation, changes the threshold voltage of the memory cell from a first threshold voltage to either the first threshold voltage or a second threshold voltage (the first threshold voltage<the second threshold voltage) and in a second write operation, changes the threshold voltage of the memory cell to either the first threshold voltage or a third threshold voltage (the first threshold voltage<the third threshold voltage) if the threshold voltage of the memory cell is the first threshold voltage, and to either a fourth threshold voltage (the second threshold voltage<=the fourth threshold voltage) or a fifth threshold voltage (the fourth threshold voltage<the fifth threshold voltage) if the threshold voltage of the memory cell is the second threshold voltage and which, in the first and second write operations, raises a program voltage in increments of $\Delta Vpgm$ and carries out a write operation by repeating a program and verify operation, $\Delta Vpgm$ in the first write operation being larger than $\Delta Vpgm$ in the second write operation.

According to a third aspect of the present intention, there is provided a semiconductor memory device comprising: a memory cell array which is configured to have a plurality of memory cells arranged in a matrix, each of the plurality of memory cells being connected to a word line and a bit line and being capable of storing 4 values; and a control circuit which controls the potentials of the word line and bit line according to input data and writes data into the memory cell, wherein the control circuit, in a first write operation, changes the threshold voltage of the memory cell from a first threshold voltage to either the first threshold voltage or a second threshold voltage (the first threshold voltage<the second threshold voltage) and in a second write operation, changes the threshold voltage of the memory cell to either the first threshold voltage or a third threshold voltage (the first threshold voltage<the third threshold voltage) if the threshold voltage of the memory cell is the first threshold voltage, and to either a fourth threshold voltage (the second threshold voltage<=the fourth threshold voltage) or a fifth threshold voltage (the fourth threshold voltage<the fifth threshold voltage) if the threshold voltage of the memory cell is the second threshold voltage and which, in the second write operation, sets a maximum value to the number of verify operations of verifying whether the third threshold voltage has been reached by repeating a program and verify operation and, when the number of verify operations has reached the maximum value, skips the verify operation of verifying whether the third threshold voltage has been reached.

According to a fourth aspect of the present intention, there is provided a semiconductor memory device comprising: a memory cell which stores data using a first threshold voltage to an n-th threshold voltage (n is a natural number equal to or larger than 2); and a control circuit which writes any one of the first to n-th threshold voltages according to input data, wherein the control circuit, in a first write operation, writes k-valued threshold voltages of the n-th threshold voltage, (n−1)-th threshold voltage, . . . , (n−k+1)-th threshold voltage into the memory cell and, in a second write operation, writes k-valued threshold voltages of the (n−k)-th threshold voltage, (n−k−1)-th threshold voltage, . . . , (n−2k+1)-th threshold voltage into the memory cell and, in an n/k-th write operation, writes (k−1)-valued threshold voltages of the k-th threshold voltage, the (k−1)-th threshold voltage, . . . , second threshold voltage into the memory cell.

According to a fifth aspect of the present intention, there is provided a semiconductor memory device comprising: a memory which stores at least one data item; at least one data storage circuit which is connected to the memory cell and stores externally inputted data of a first logic level or a second logic level; and a control circuit which controls the operation of the data storage circuit, wherein the control circuit, when the logic level of the data stored in the data storage circuit is the first logic level, inverts the logic level to the second logic level and, when the logic of the data is the second logic level, inverts the logic level to the first logic level and further, when the logic level of the data stored in the data storage circuit is the first logic level, does writing on the memory cell to raise the threshold voltage and, when the logic level of the data is the second level, causes the threshold voltage of the memory cell to remain unchanged.

According to a sixth aspect of the present intention, there is provided a semiconductor memory device comprising: a memory cell array configured to have a plurality of memory cells arranged in a matrix, each of the plurality of memory cells being connected to a word line and a bit line and being capable of storing n values (n is a natural number equal to or larger than 3); and a control circuit which controls the potentials of the word line and bit line according to input data and writes data into a memory cell, wherein the control circuit writes data into the memory cell to an a1-valued (a1<=n) threshold voltage in a first write operation, to an a2-valued (a2<=n) threshold voltage in a second write operation, to an ak-valued (ak<=n) threshold voltage in a k-th write operation (k is a natural number equal to or larger than 2: k<=n) and which, in the first to k-th write operations, raises a program voltage in increments of ΔVpgm and carries out write operations by repeating a program and verify operation, ΔVpgm in the first to k-th write operations fulfilling the following expression: the first ΔVpgm>the second ΔVpgm> . . . >the k-th ΔVpgm.

According to a seventh aspect of the present intention, there is provided a semiconductor memory device comprising: a memory cell which stores data using a first to an n-th threshold voltage, each of the threshold voltages being defined so as to increase in the order of the first threshold voltage to the n-th threshold voltage (n is a natural number equal to or larger than 2) and rising as a result of a write operation; a control circuit which writes any one of the first to n-th threshold voltages into the memory cell according to input data, wherein the control circuit, in a first write operation, writes k1-valued threshold voltages of the n-th threshold voltage, (n−1)-th threshold voltage, . . . , (n−k1+1)-th threshold voltage into the memory cell and, in a second write operation, writes k2-valued threshold voltages of (n−k1)-th threshold voltage, (n−k1−1)-th threshold voltage, . . . , (n−k1−k2+1)-th threshold voltage into the memory cell and, in an i-th write operation, writes (ki−1)-valued threshold voltages of the ki-th threshold voltage, (ki−1)-th threshold voltage, . . . , second threshold voltage into the memory cell.

According to an eighth aspect of the present intention, there is provided a semiconductor memory device comprising: a memory cell array configured to have a plurality of memory cells arranged in a matrix, each of the plurality of memory cells being connected to a word line and a bit line and being capable of storing n values (n is a natural number equal to or larger than 3); a control circuit which controls the potentials of the word line and bit line according to input data and writes data into a memory cell and which, in a write operation, carries out a verify operation using a threshold voltage lower than a k-valued threshold voltage in verifying whether the threshold voltage of the memory cell has reached the k-valued threshold voltage and, if the threshold voltage of the memory cell has exceeded the threshold voltage lower than the k-valued threshold voltage, sets the data in the data storage circuit to the same data to be written to an i-valued threshold voltage (i<k) lower than the k-valued threshold voltage; and a data storage circuit which is connected to the bit line and stores at least one bit of data.

According to a ninth aspect of the present intention, there is provided a semiconductor memory device comprising: a memory cell which stores k bits of data (k is a natural number equal to or larger than 2); a first storage circuit which stores externally inputted data and the data read from the memory cell; a second storage circuit which stores the data stored in the first storage circuit; a third storage circuit which stores the data read from the memory cell; a fourth storage circuit which stores the data stored in the third storage circuit; and a control circuit which holds or change the data in the first to fourth storage circuits according to the data stored in the memory cell in a write operation and which writes 8-valued data simultaneously in a third page write operation.

According to a tenth aspect of the present intention, there is provided a semiconductor memory device comprising: a memory cell array in which a plurality of memory cells are arranged in a matrix, each of the plurality of memory cells being connected to a word line and a bit line and being capable of storing n values (n is a natural number equal to or larger than 3); and a control circuit which controls the potentials of the word line and bit line according to input data and reads data from the memory cell and which reads the data from the memory cell by precharging the bit line once and then changing the potential of the word line an i number of times.

BRIEF DESCRIPTION OF THE SEVERAL VIEWS OF THE DRAWING

FIG. 3 is a circuit diagram showing the configuration of the memory cell array and bit-line control circuit of FIG. 2 according to a first embodiment of the present invention;

FIG. 6 is a circuit diagram of an example of the data storage circuit shown in FIG. 3;

FIGS. 10A and 10B show the relationship between each data cache and data in a memory cell;

FIGS. 11A, 11B, and 11C show the procedure for setting a data cache;

FIGS. 12A, 12B, and 12C show the procedure for setting a data cache;

FIGS. 13A and 13B show a data cache in a verify operation;

FIG. 14 shows a data cache in a verify operation;

FIG. 15 shows a data cache in a verify operation;

FIG. 16 shows a data cache in a verify operation;

FIG. 19 is a circuit diagram of a modification of FIG. 3, showing a second embodiment of the present invention;

FIGS. 25A and 25B show the state of a data cache in the third page program;

FIG. 26 shows the state of the data cache in the third page program;

FIG. 32 shows an example of arranging a plurality of flag cells;

FIGS. 33A to 33F show the relationship between data in a memory cell and the threshold voltages of the memory cell according to a fourth embodiment of the present invention;

FIG. 34 is a flowchart to explain a first page operation in the fourth embodiment;

FIGS. 36A and 36B show the relationship between each data cache and data in the memory cell in the fourth embodiment;

FIGS. 37A and 37B show the relationship between each data cache and data in the memory cell in the fourth embodiment;

FIG. 38 shows the relationship between each data cache and data in the memory cell in the fourth embodiment;

FIGS. 39A, 39B and 39C show the relationship between each data cache and data in the memory cell according to a fifth embodiment of the present invention;

FIG. 40 shows the relationship between each data cache and data in the memory cell in the fifth embodiment;

FIGS. 41A and 41B show the relationship between each data cache and data in the memory cell in the fifth embodiment;

FIGS. 42A and 42B show the relationship between each data cache and data in the memory cell in the fifth embodiment;

FIGS. 47A and 47B show the relationship between each data cache and data in the memory cell in the sixth embodiment;

FIGS. 48A and 48B show the relationship between each data cache and data in the memory cell in the sixth embodiment;

FIGS. 49A and 49B show the relationship between each data cache and data in the memory cell in the sixth embodiment;

FIGS. 50A and 50B show the relationship between each data cache and data in the memory cell in the sixth embodiment;

FIGS. 51A and 51B show the relationship between each data cache and data in the memory cell in the sixth embodiment;

FIG. 52 shows the relationship between each data cache and data in the memory cell in the sixth embodiment;

FIG. 53 is a circuit diagram showing the configuration of a data storage circuit according to a seventh embodiment of the present invention;

FIGS. 56A and 56B show the relationship between each data cache and data in the memory cell in the seventh embodiment;

FIG. 57 is a plan view showing an example of a nonvolatile semiconductor memory device applied to the first to seventh embodiments;

FIG. 62 is a perspective view of the memory card to which the semiconductor memory device of the invention is applied and a card holder;

FIG. 63 is a perspective view of a connection unit to which the memory card and card holder are connected;

FIG. 64 is a perspective view showing a case where a connection unit in which the card memory is inserted is connected to a personal computer with a connection wire;

FIG. 67 is a block diagram of a USB memory device to which a nonvolatile semiconductor memory device of each of the embodiments is applied.

DETAILED DESCRIPTION OF THE INVENTION

Hereinafter, referring to the accompanying drawings, embodiments of the present invention will be explained.

First Embodiment

Figure 2:
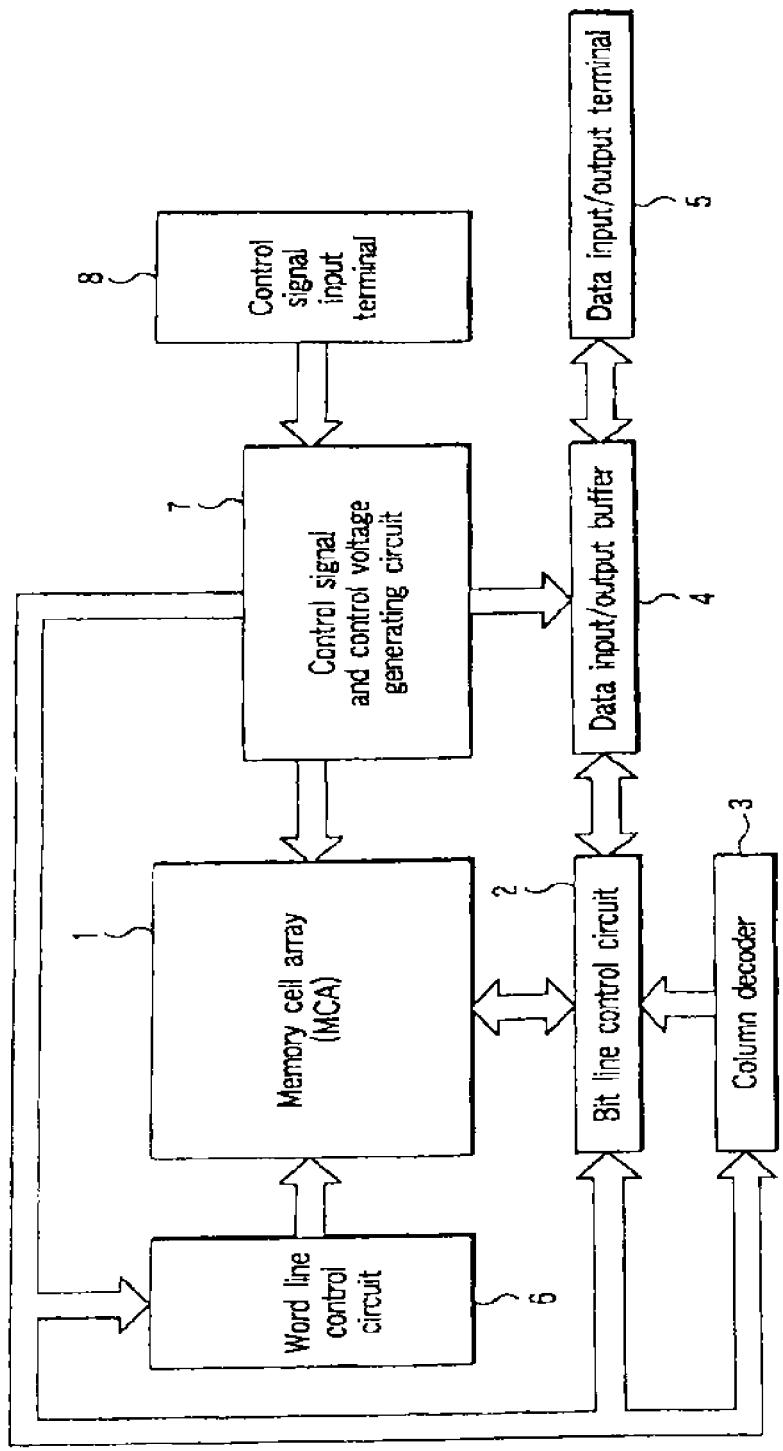
FIG. 2 shows a schematic configuration of a nonvolatile semiconductor memory device.

FIG. 2 schematically shows the configuration of a nonvolatile semiconductor memory device according to a first embodiment of the present invention. For example, the configuration of a NAND flash memory which stores 4-valued (2 bits of) data is shown in FIG. 2.

A memory cell array 1 includes a plurality of bit lines, a plurality of word lines, and a common source line. In the memory array 1, for example, memory cells are arranged in a matrix. Each of the memory cells is composed of an EEPROM cell and enables data to be rewritten electrically. A bit line control circuit 2 for controlling the bit lines and a word line control circuit 6 are connected to the memory cell array 1.

The bit line control circuit 2 includes a plurality of data storage circuits and a flag data storage circuit as described later. The bit line control circuit 2 reads the data in a memory cell in the memory cell array 1 via a bit line, detects the state of a memory cell in the memory cell array 1 via a bit line, or writes data into a memory cell in the memory cell array 1 by applying a write control voltage to the memory cell via a bit line. A column decoder 3 and a data input/output buffer 4 are connected to the bit line control circuit 2. The column decoder 3 selects one of the data storage circuits in the bit line control circuit 2. The data in a memory cell read into a data storage circuit is outputted via the data input/output buffer 4 from a data input/output terminal 5 to the outside world.

Writing data externally inputted to the data input/output terminal 5 is inputted via the data input/output buffer 4 to the data storage circuit selected by the column decoder 3.

The word line control circuit 6 is connected to the memory cell array 1. The word line control circuit 6 selects a word line in the memory cell array 1 and applies a voltage necessary for reading, writing, or erasing to the selected word line.

The memory cell array 1, bit line control circuit 2, column decoder 3, data input/output buffer 4, and word line control circuit 6, which are connected to a control signal and control voltage generating circuit 7, are controlled by the control signal and control voltage generating circuit 7. The control signal and control voltage generating circuit 7, which is connected to a control signal input terminal 8, is controlled by a control signal externally inputted via the control signal input terminal 8.

The bit line control circuit 2, column decoder 3, word line control circuit 6, and control signal and control voltage generating circuit 7 constitute a write circuit and a read circuit.

FIG. 3 shows the configuration of the memory cell array 1 and bit line control circuit 2 of FIG. 2. In the memory cell array 1, a plurality of NAND cells are provided. A NAND cell is composed of memory cells MCs (made up of, e.g., 16 EEPROMs) connected in series and a first and a second select gate S1, S2. The first select gate S1 is connected to bit line BL0 and the second select gate S2 is connected to source line SRC. The control gates of the memory cells arranged in each row are connected equally to word lines WL1, WL2, WL3, ..., WL16. The first select gates S1 are connected equally to select line SG1 and the second select gates S2 are connected to select line SG2.

The bit line control circuit 2 has a plurality of data storage circuits 10 and a first and a second flag data storage circuit 10a, 10b. Pairs of bit lines (BL0, BL1), (BL2, BL3), (BLi, BLi+1), (BLf1, BLf2), (BLf3, BLf4) are connected to the data storage circuits 10 and the first and second flag data storage circuits 10a, 10b in a one-to-one correspondence.

The memory cell array 1 includes a plurality of blocks as shown by the broken lines. Each block is composed of a plurality of NAND cells. The data is erased in blocks. An erase operation is performed simultaneously on the two bit lines connected data storage circuit 10 and the first and second flag data storage circuits 10a and 10b.

A plurality of memory cells (the memory cells enclosed by the broken line) provided every other bit line and connected to a single word line constitute a sector. Data is written or read in sectors. In a sector, for example, two pages of data are stored. A plurality of first flag cells FC1 for storing flags and a plurality of second flag cells FC2 are connected to each word line. That is, in the first embodiment, a sector includes a first flag cell FC1 and a second flag cell FC2.

Each of the first and second flag cells FC1, FC2 is not limited to one for each sector. For instance, a plurality of flag cells may be connected to one sector as shown by the broken lines. In this case, the data stored in the flag cells may be decided by the majority of the data stored in the plurality of flag cells as described later.

In a read operation, a program verify operation, and a program operation, one bit line is selected from the two bit lines (BLi, BLi+1) connected to the data storage circuit 10 according to an externally specified address signal (YA1, YA2, . . . , YAi, YAFlag). In addition, according to an external address, one word line is selected, thereby selecting one sector (for two pages). The switching between the two pages is effected according to the address.

Figure 4A:
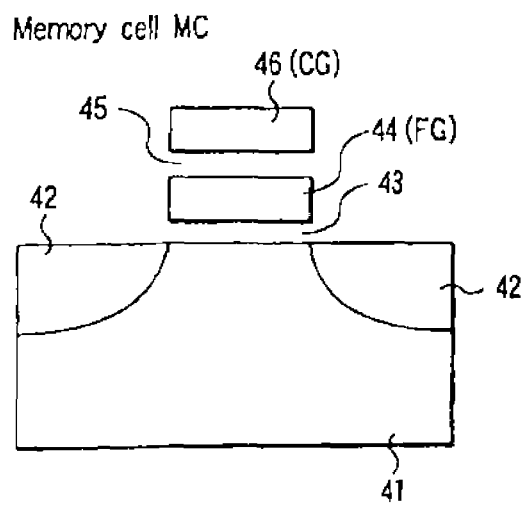
FIGS. 4A and 4B are a sectional view of a memory cell and that of a select transistor.
Figure 4B:
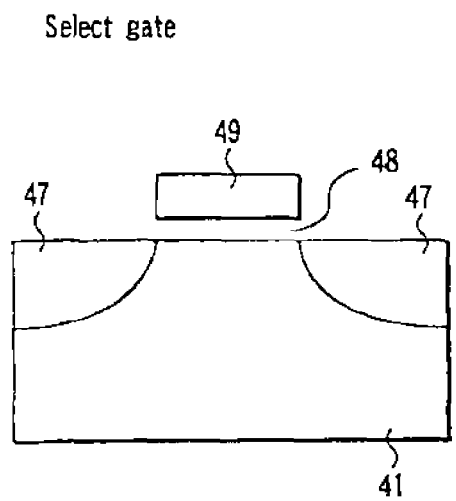

FIGS. 4A and 4B are sectional views of a memory cell and a select transistor, respectively. FIG. 4A shows a memory cell. In a substrate 41, n-type diffusion layers 42 acting as the source and drain of a memory cell are formed. Above the substrate 41, a floating gate (FG) 44 is formed via a gate insulating film 43. Above the floating gate 44, a control gate (CG) 46 is formed via an insulating film 45. FIG. 4B shows a select gate. In the substrate 41, n-type diffusion layers 47 acting as a source and a drain are formed. Above the substrate 41, a control gate 49 is formed via a gate insulating film 48.

Figure 5:
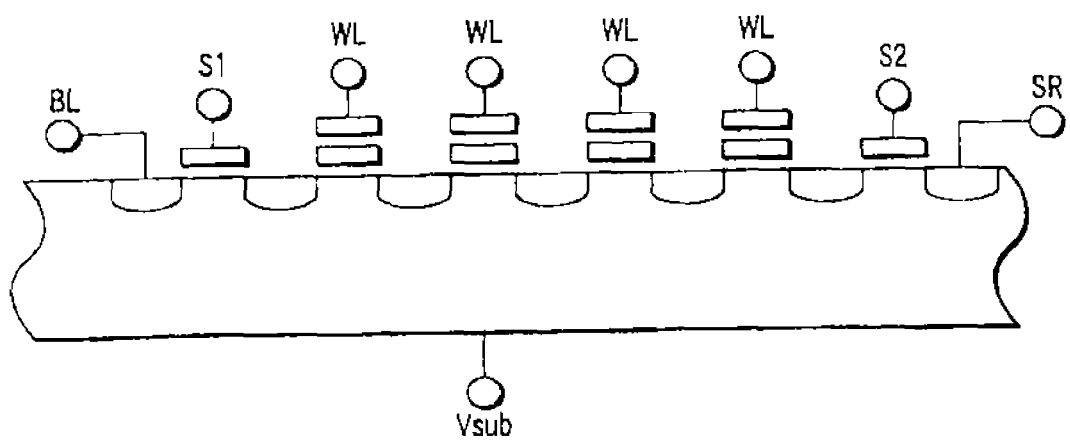
FIG. 5 is a sectional view of a NAND cell in the memory cell array.

FIG. 5 is a sectional view of a NAND cell in the memory cell array. In this example, in the NAND cell, 16 memory cells MCs configured as shown in FIG. 4A are connected in series. The drain side and source side of the NAND cell are provided with a first select gate S1 and a second select gate S2 configured as shown in FIG. 4B, respectively.

FIG. 6 is a circuit diagram of the data storage circuit 10 shown in FIG. 3. Each of the first and second flag data storage circuits 10a, 10b has the same configuration as that of the data storage circuit 10.

The data storage circuit 10 has a primary data cache (PDC), a secondary data cache (SDC), a dynamic data cache (DDC), a temporary data cache (TDC). The SDC, PDC, and DDC hold the input data in a write operation, hold the read data in a read operation, hold the data temporarily in a verify operation, and are used to manipulate the internal data in storing multivalued data. The TDC not only amplifies the data on the bit line in reading the data and holds the data temporarily, but also is used to manipulate the internal data in storing multivalued data.

The SDC is composed of clocked inverter circuits 61a, 61b and transistors 61c, 61d, which constitute a latch circuit. The transistor 61c is connected between the input terminal of the clocked inverter circuit 61a and the input terminal of the clocked inverter circuit 61b. A signal EQ2 is supplied to the gate of the transistor 61c. The transistor 61d is connected between the input terminal of the clocked inverter circuit 61b and the ground. A signal PRST is supplied to the gate of the transistor 61d. The node N2a of the SDC is connected via a column select transistor 61e to an input/output data line IO. The node N2b of the SDC is connected via a column select transistor 61f to an input/output data line IOn. A column select signal CSLi is supplied to the gates of the transistors 61e, 61f. The node N2a of the SDC is connected via transistors 61g, 61h to the node N1a of the PDC. A signal BLC2 is supplied to the gate of the transistor 61g. A signal BLC1 is supplied to the gate of the transistor 61h.

The PDC is composed of clocked inverter circuits 61i, 61j and a transistor 61k. The transistor 61k is connected between the input terminal of the clocked inverter circuit 61i and the input terminal of the clocked inverter circuit 61j. A signal EQ1 is supplied to the gate of the transistor 61k. The node N1b of the PDC is connected to the gate of a transistor 61l. One end of the current path of the transistor 61l is connected via a transistor 61m to the ground. A signal CHK1 is supplied to the gate of the transistor 61m. The other end of the current path of the transistor 61l is connected to one end of the current path of transistors 61n, 61o which constitute a transfer gate. A signal CHK2n is supplied to the gate of the transistor 61n. The gate of the transistor 61o is connected to the junction node of the transistors 61g and 61h. A signal COMi is supplied to the other end of the current path of the transistors 61n, 61o. The signal COMi is a signal which is common to all of the data storage circuits 10 and which indicates whether all of the data storage circuits 10 have been verified. Specifically, when all of the data storage circuits have been verified, the node N1b of the PDC goes low. In this state, when the signals CHK1 and CHK2 are made high, if all of the data storage circuits have been verified, the signal COMi goes high.

Furthermore, the TDC is composed of, for example, a MOS capacitor 61p. The capacitor 61p is connected between the junction node N3 of the transistors 61g, 61h and the ground. The DDC is connected via a transistor 61q to the junction node N3. A signal REG is supplied to the gate of the transistor 61q.

The DDC is composed of transistors 61r, 61s. A signal VREG is supplied to one end of the current path of the transistor 61r. The other end of the transistor 61r is connected to the current path of the transistor 61q. The gate of the transistor 61r is connected via the transistor 61s to the node N1a of the PDC. A signal DTG is supplied to the gate of the transistor 61s.

Furthermore, one end of the current path of transistors 61t, 61u is connected to the junction node N3. A signal VPRE is supplied to the other end of the current path of the transistor 61u. A signal BLPRE is supplied to the gate of the transistor 61u. A signal BLCLAMP is supplied to the gate of the transistor 61t. The other end of the current path of the transistor 61t is connected via a transistor 61v to one end of bit line BLo and via a transistor 61w to one end of bit line BLe. The other end of bit line BLo is connected to one end of the current path of a transistor 61x. A signal BIASo is supplied to the gate of the transistor 61x. The other end of bit line BLe is connected to one end of the current path of a transistor 61y. A signal BIASe is supplied to the gate of the transistor 61y. A signal BLCRL is supplied to the other ends of the current paths of the transistors 61x, 61y. The transistors 61x, 61y are turned on according to signals BIASo, BIASe so as to complement the transistors 61v, 61w, thereby supplying the potential of a signal BLCRL to the unselected bit lines.

Furthermore, a data input terminal is connected via a plurality of inverter circuits 62a, 62b, 62c to the input/output data line IO and further via an inverter circuit 62d to the input/output data line IOn.

Each of the above signals and voltages is generated by the control signal and control voltage generating circuit 7 of FIG. 2. Under the control of the control signal and control voltage generating circuit 7, the operation below will be carried out.

The memory, which is a multivalued memory, enables, for example, two bits of data to be stored in one cell. The switching between the two bits is effected according to the address (a first page, second page).

(Description of Operation)

The operation of the above configuration will be explained.

FIG. 1 shows the relationship between data in a memory cell and the threshold voltages of the memory cell. When an erase operation is carried out, the data in the memory cell becomes "0". As shown in FIG. 1A, when a first page is written into, the data in the memory cell becomes data "0" and data "2". As shown in FIG. 1B, before a second page is written into, data lower than the threshold voltage of the actual data is written into an adjoining cell. Then, because of the data written into the cell, the distribution of the threshold voltage of data "2" becomes larger. Thereafter, when the second page is written into, the data in the memory cell becomes data "0" to "3" having the original threshold voltage. In the first embodiment, the data in the memory cell is defined, starting from the lowest threshold voltage upward.

The data in a read or a write operation is set as shown in FIGS. 1A to 1D, which enables the data to be written into one page of the cell array in a plurality of batches. If the power supply is turned off suddenly in the middle of writing the data into the upper page (or the page written into later), the data in the lower page (or the page previously written into) is destroyed. However, if the upper page is written into on the basis of the unwritten data before the upper page is written into, the data already written up to the threshold voltage v' is written up to the threshold voltage b'. In addition, the flag cell is also written into. Thereafter, the upper page is written into, thereby preventing the data in the lower page from being destroyed even if the power supply is turned off abruptly.

Figure 1A:
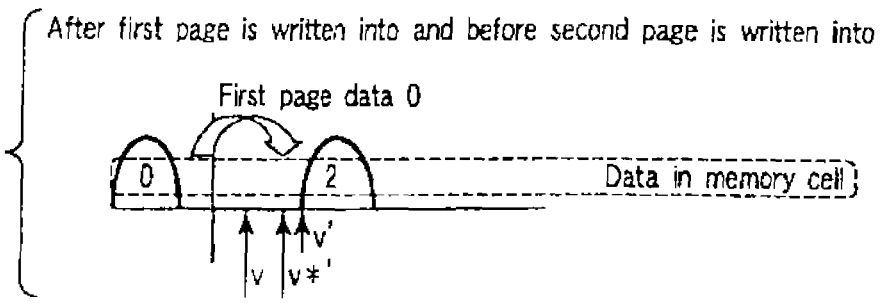
FIGS. 1A, 1B, 1C, and 1D show the relationship between data in a memory cell and the threshold voltages of the memory cell.
Figure 1B:
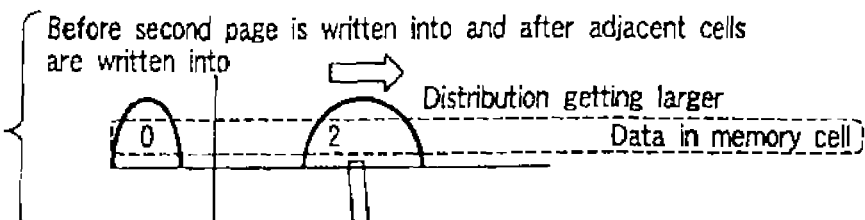
Figure 1C:
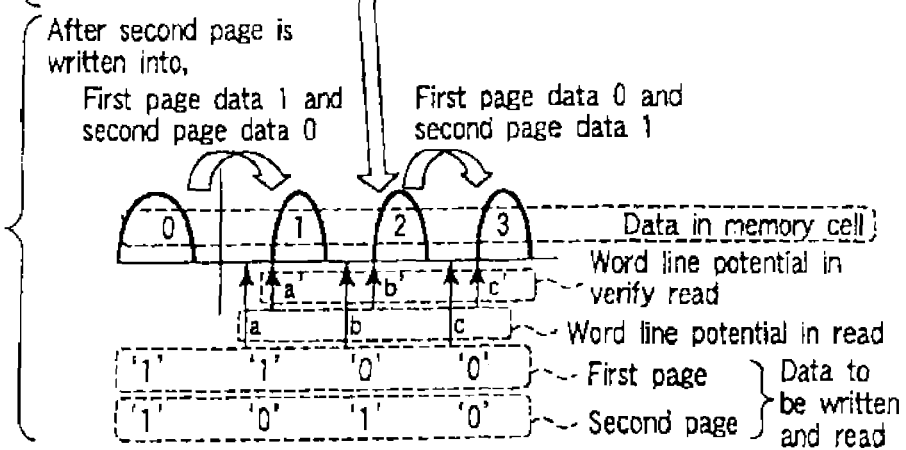

The first embodiment is characterized in that, in the second page write operation shown in FIG. 1C, the threshold voltage "b'" and the threshold voltage "c'" are verified simultaneously by precharging the bit line temporarily and then changing the word line potential a plurality of times.

Figure 7:
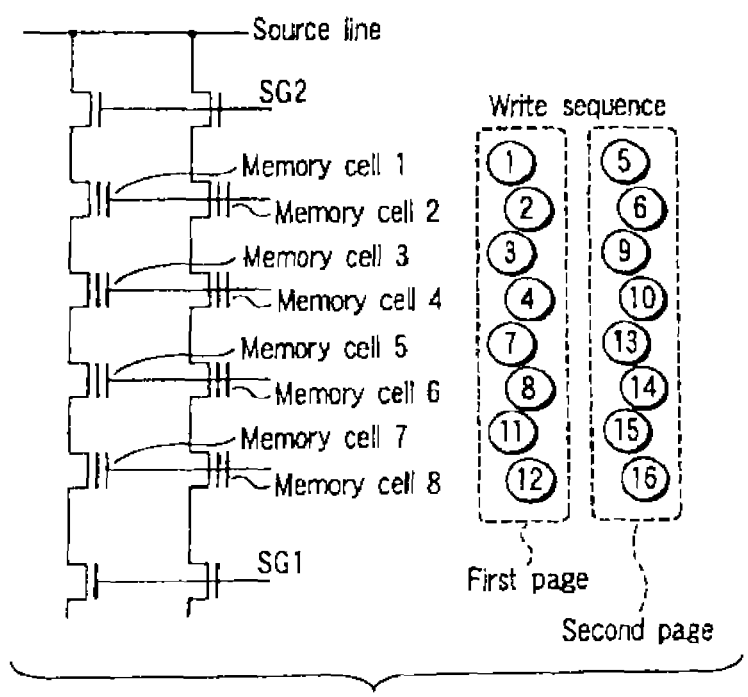
FIG. 7 shows the procedure for writing data into a NAND cell.

FIG. 7 shows the order in which a NAND cell is written into. In a block, data is written in pages, starting from a memory cell closer to the source line. In FIG. 7, for the sake of explanation, the number of word lines is set at 4.

In first writing, one bit of data is written into the first page of a memory cell 1.

In second writing, one bit of data is written into the first page of a memory cell 2 adjoining the memory cell 1 in the word direction.

In third writing, one bit of data is written into the first page of a memory cell 3 adjoining the memory cell 1 in the bit direction.

In fourth writing, one bit of data is written into the first page of a memory cell 4 adjoining the memory cell 1 diagonally.

In fifth writing, one bit of data is written into the second page of the memory cell 1.

In sixth writing, one bit of data is written into the second page of the memory cell 2 adjoining the memory cell 1 in the word direction.

In seventh writing, one bit of data is written into the first page of a memory cell 5 adjoining the memory cell 3 in the bit direction.

In eighth writing, one bit of data is written into the first page of a memory cell 6 adjoining the memory cell 3 diagonally.

In ninth writing, one bit of data is written into the second page of the memory cell 3.

In tenth writing, one bit of data is written into the second page of the memory cell 4 adjoining the memory cell 3 in the word direction.

In eleventh writing, one bit of data is written into the first page of a memory cell 7 adjoining the memory cell 5 in the bit direction.

In twelfth writing, one bit of data is written into the first page of a memory cell 8 adjoining the memory cell 5 diagonally.

In thirteenth writing, one bit of data is written into the second page of the memory cell 5.

In fourteenth writing, one bit of data is written into the second page of the memory cell 6 adjoining the memory cell 5 in the word direction.

In fifteenth writing, one bit of data is written into the second page of the memory cell 7.

In sixteenth writing, one bit of data is written into the second page of the memory cell 8 adjoining the memory cell 7 in the word direction.

(Program and Program Verify)

Figure 8:
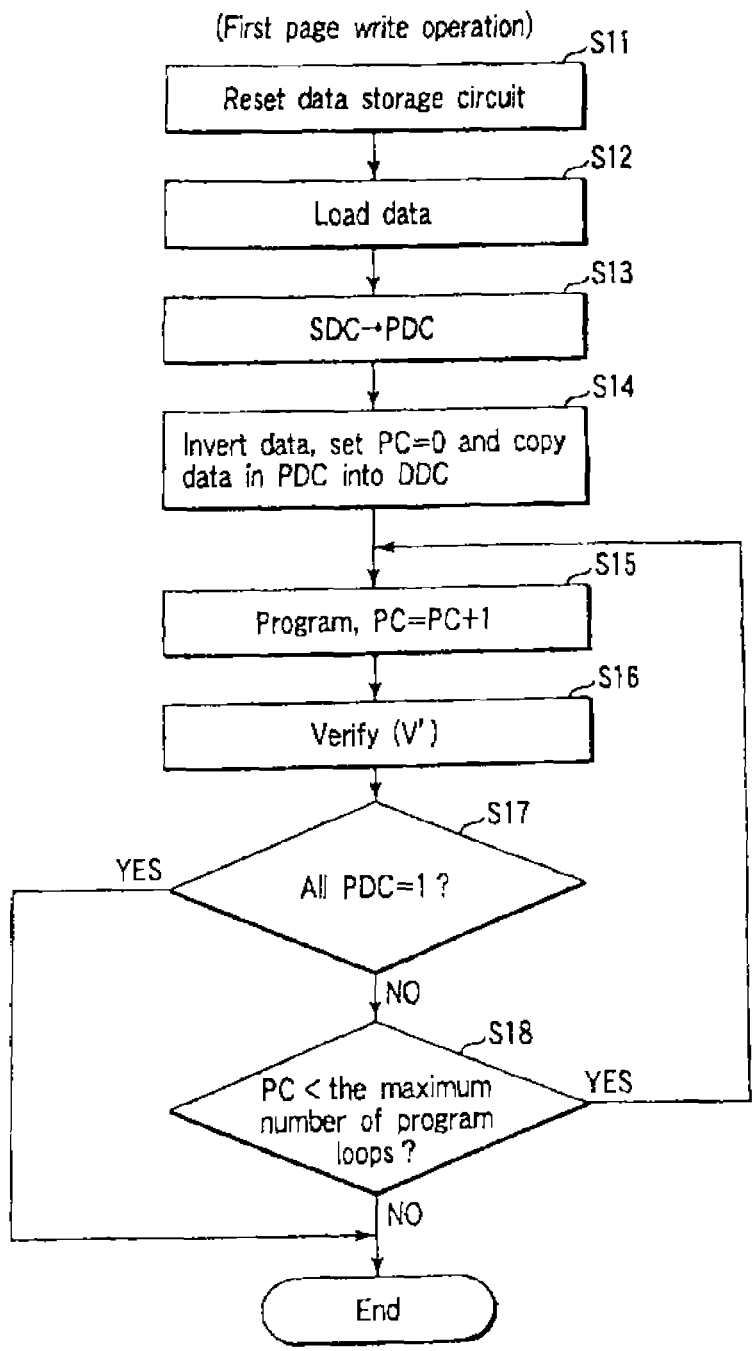
FIG. 8 is a flowchart to explain a first page program operation.

FIG. 8 is a flowchart for a first page program. In a program operation, first, an address is specified, thereby selecting two pages (one sector) shown in FIG. 3. In the memory, of the two pages, programming can be done only in this order: the first page and then the second page. Therefore, first, the first page is selected according to an address.

While the address is being inputted, the transistor 61d of FIG. 6 is turned on, thereby setting the nodes N2a of all the SDCs to Vss (S11).

Next, writing data is externally inputted via the data input/output lines IO, IOn and is then stored in the SDCs (shown in FIG. 6) in all of the data storage circuits 10 (S12). At this time, when data is written, data "0" is externally inputted to the data input terminal 5a. The data is supplied via the inverter circuits 62a, 62b, 62c, 62d and transistors 61e, 61f to the SDC. Thus, node N2a of the SDC goes to Vdd. When writing is unselected, data "1" is inputted to the data input terminal 5a. Thus, node N2a of the SDC goes to Vss. Thereafter, when a write command is inputted, the data in the SDCs of all of the data storage circuits 10 is transferred to the PDC (S13). Specifically, the signals BLC1, BLC2 are set to a specific voltage, for example, Vdd+Vth (Vdd: power supply voltage (e.g., 3 V or 1.8 V, this voltage is illustrative and not restrictive), Vth: the threshold voltage of an n-channel MOS transistor), thereby turning on the transistors 61h, 61g. Then, the data at node N2a is transferred via the transistors 61g, 61h to the PDC. Therefore, when data "1" is externally inputted (no writing is done), node N1a of the PDC goes low. When data "0" is externally inputted (writing is done), node N1a of the PDC goes high. Thereafter, the data in the PDC is at the potential at node N1a and the data in the SDC is at the potential at node N2a.

(Data Invert Operation) (S14)

Thereafter, set VPRE=Vdd and set signal to Vdd+Vth. Then, precharge N3 to Vdd temporarily and set DTG=Vdd+Vth. In this state, the data in the PDC is transferred to the DDC. Next, set REG=Vdd and VREG=Vss. If the DDC is at the high level, node N3 is at the low level. If the DDC is at the low level, node N3 is at the high level. Thereafter, the signals SEN1, LAT1 are made off temporarily, the signal EQ1 is set at Vdd, and node N1a and node N1b are set at the same potential. Then, the signal BLC1 is set to BLC1=Vdd+Vth and the data in the TDC (the potential at node N3) is transferred to the PDC. As a result, if data "1" has been latched in the PDC, the data in the PDC becomes "0". If data "0" has been latched in the PDC, the data in the PDC becomes "1".

When a write command is inputted, a booster circuit for voltages Vpgm and Vpass for programming operates. The potentials of the voltages Vpgm and Vpass do not rise immediately. The data invert operation is carried out during the waiting time needed for the potential to rise. Consequently, the write speed does not get slower.

As described above, inverting the inputted data is effective in a page copy. In a page copy, the data on one page written in the memory cell is read into the page buffer and then written into one other page without outputting the data to the outside. Specifically, when a page copy is made, reading is done first. As a result, if writing has been done (if data "0" has been inputted to the data input terminal 5a), the SDC latches data "1". If writing has not been done (if data "1" has been inputted to the data input terminal 5a), the SDC latches data "0". As described earlier, the SDC latches the inverted inputted data. As a result, the data read for a page copy coincides with the data latched in the SDC in a write operation. As described above, making the read-out data coincide with the data to be next written makes it easy to externally input and rewrite only a part of the read-out data. Therefore, even when a page copy is not made, the externally inputted data is always inverted in the page buffer.

The data invert operation is carried out by inputting an ordinary program command. Thereafter, the data in the PDC is copied into the DDC.

In the first page program, no data is written into the flag cell. Thus, the PDCs of the first and second flag data storage circuits 10a, 10b have latched data "1".

Furthermore, the value of a programmable counter (PC) is initialized to "0". The counter is provided in, for example, the control signal and control voltage generating circuit 7 of FIG. 2. However, the installation location of the counter is not limited to the control signal and control voltage generating circuit 7.

(Program Operation) (S15)

First, set the potentials of the signals BLC1, BLCLAMP, and BLSo, or BLSe of FIG. 6 at Vdd+Vth. As a result, the transistors 61h, 61t, and 61v or 61w are turned on, supplying the data stored in the PDC to the bit line. If data "1" is stored in the PDC (if no writing is done), the bit line goes to Vdd. If data "0" is stored in the PDC (if writing is done), the bit line goes to Vss (the ground potential). The cells which are connected to the selected word line and which are on the unselected page (when the bit line is unselected) must not be written into. Therefore, Vdd is supplied to the bit lines connected to these cells as in the case of data "1". Here, Vdd is applied to the select line SG1 of the selected block, the potential VPGM (20 V) is applied to the selected word line, and the potential Vpass (10 V) is applied to the unselected word lines. Then, if the bit line is at Vss, the channel of the cell goes to Vss and the word line goes to VPGM, with the result that writing is done. If the bit line is at Vdd, the channel of the cell is not at Vss and goes to VPGM/2 by coupling when VPGM is raised. Thus, this cell is not programmed.

In a multivalued memory, to narrow the threshold value distribution, the original verify potential "v'" and a verify potential "v*'" lower than the original one are set as shown in FIG. 1. An intermediate potential (e.g., 1 V) is supplied to a bit line corresponding to a cell which has exceeded the verify potential "v*'", thereby making the write speed slower. Therefore, when the signal VREG is set at Vdd and the signal REG is set at an intermediate potential (e.g., 1 V+Vth), if the bit line is at Vss and the DDC is at the high level, the bit line goes to the intermediate potential. If the DDC is at the low level, the bit line remains at Vss. If the bit line is at Vdd, it remains at Vdd.

In the first page write operation, if the input data is "0", the data in the memory cell is made "2" as shown in FIG. 1. If the input data is "1", the data in the memory cell remains at "0".

As a result of the program operation, the counter (PC) is counted up (PC=PC+1).

(First Page Verify) (S16)

At the first page, data is written to the original verify potential "v'" as shown in FIG. 1A. Thus, in a first step of the verify operation, a potential "v*'" lower than the original verify potential "v'" is supplied to the word line. In a second step, the potential of the word line is raised to "v'" and verification is performed. Hereinafter, "*" represents a potential lower than the original one.

First, a read potential Vread is supplied to the unselected word lines and select line SG1 in the selected block. In the data storage circuit 10 of FIG. 6, for example, Vdd+Vth is supplied to the signal BLPRE and a specific voltage, for example, 1 V+Vth, is supplied to the signal BLCLAMP. The signal VPRE is set at Vdd and the bit line is precharged to 1 V.

Next, the select line SG2 on the source side of the cell is made high. The cells whose threshold voltage is higher than the potential "v*'" are turned off. As a result, the bit line remains at the high level. The cells whose threshold voltage is lower than the potential "v*'" are turned on. As a result, the bit line goes to Vss.

Next, a specific voltage, for example, Vdd+Vth, is supplied to the signal BLPRE and VPRE is set at Vdd. This causes node N3 of the TDC to be precharged to Vdd. Then, the signal BLCLAMP is set at a specific voltage, for example, 0.9 V+Vth, thereby turning on the transistor 61t. Node N3 of the TDC goes low when the bit line is at the low level, whereas node N3 goes high when the bit line is at the high level.

Here, when writing is done, the low level has been stored in the DDC of FIG. 6. When no writing is done, the high level has been stored in the DDC. Thus, when the signal VREG is set at Vdd and the signal REG is made high, only if no writing is done, node N3 of the TDC is forced to go high. After this operation, the data in the PDC is transferred to the DDC and the potential in the TDC is transferred to the PDC. It is only when the cell is not written into or when data "2" has been written in the cell and the threshold voltage of the cell has reached the verify potential "v*'" that a high level signal is latched in the PDC. In addition, it is only when the threshold voltage of the cell has not reached "v*'" that a low level signal is latched in the PDC.

Next, when the potential of the word line is raised from "v*'" to "v'", the cells whose threshold voltage is lower than the threshold voltage "v'" are turned on and the bit lines go to Vss.

Next, a specific voltage, for example, Vdd+Vth, is supplied to the signal BLPRE and VPRE is set at Vdd. This causes node N3 of the TDC to be precharged to Vdd. Then, the signal BLCLAMP is set at a specific voltage, for example, 0.9 V+Vth, thereby turning on the transistor 61t. Node N3 of the TDC goes low when the bit line is at the low level, whereas node N3 goes high when the bit line is at the high level.

Here, when writing is done, the low level has been stored in the DDC of FIG. 6. When no writing is done, the high level has been stored in the DDC. Thus, when the signal VREG is set at Vdd and the signal REG is made high, only if no writing is done, node N3 of the TDC is forced to go high. After this operation, the data in the PDC is transferred to the DDC and the potential in the TDC is transferred to the PDC. It is only when the cell is not written into or when data "2" has been written in the cell and the threshold voltage of the cell has reached the verify potential "v'" that a high level signal is latched in the PDC. In addition, it is only when the threshold voltage of the cell has not reached "v'" that a low level signal is latched in the PDC.

As a result, it is when the threshold voltage of the cell has exceeded "v*" or when writing is unselected that the DDC goes high. It is when writing has been done and the threshold voltage of the cell is equal to or lower than "v*" that the DDC goes low. It is when the threshold voltage of the cell has exceeded "v'" or when writing is unselected that the PDC goes high. It is when writing has been done and the threshold voltage of the cell is equal to or lower than "v'" that the PDC goes low.

When the PDC is at the low level, the write operation is carried out again. The program and verify operation is repeated until the data in all of the data storage circuits 10 has become high (S15 to S18). At this time, when the PDC is at the low level and the DDC is at the high level, that is, when the threshold voltage of the cell is equal to or higher than "v*" or equal to "v'", the intermediate potential is supplied to the bit line, thereby suppressing the write speed.

(Adjoining Cell Program)

As shown in FIG. 7, after one bit of data is written into the first page of the memory cell 1, the writing of data into the first page of the memory cell 2 adjoining the memory cell 1 in the word direction, the writing of data into the first page of the memory cell 3 adjoining the memory cell 1 in the bit direction, and the writing of data into the first page of the memory cell 4 adjoining the memory cell 1 diagonally are effected in that order. When these write operations have been carried out, the threshold voltage of the memory cell 1 rises due to the capacitance between the floating gates of the adjoining cells (the FG-FG capacitance), depending on writing data. Accordingly, the threshold voltage distribution of data "0" and data "2" in the memory cell 1 expand toward a higher potential as shown in FIG. 1B.

Thereafter, in the fifth writing, one bit of data is written into the second page of the memory cell 1.

(Second Page Program)

In the first embodiment, a second page program operation and a verify operation are made faster. Specifically, data "2" and data "3" in the memory cell are verified simultaneously, thereby enabling a higher-speed operation. Hereinafter, the operation will be explained.

Figure 9:
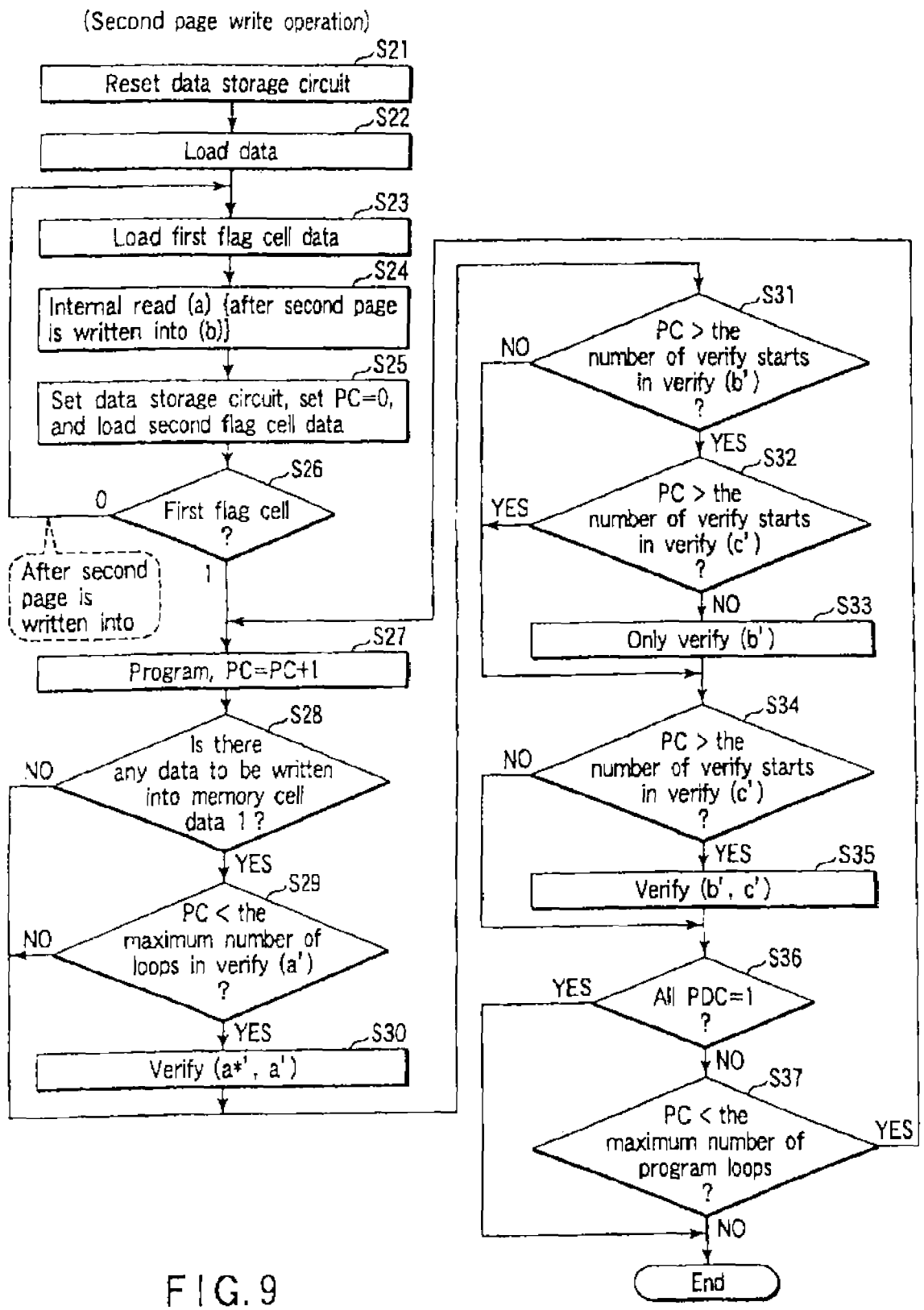
FIG. 9 is a flowchart to explain a second page program operation.

FIG. 9 is a flowchart for a second page program (write) operation. In the second page program operation, too, two pages shown in FIG. 3 are selected according to an address. At the same time, the page buffer is reset (S21).

Next, writing data is externally inputted and then is stored in the SDCs in all of the data storage circuits (S22). If data "1" is externally inputted (if no writing is done), node N2a of the SDC of the data storage circuit 10 goes low. If data "0" is externally inputted (if writing is done), node N2a goes high.

(First Flag Cell Data Load) (S23)

In the second page program, when a write command is inputted, the SDC in the first flag cell data storage circuit 10a goes high to write data into the first flag cell FC1. As described earlier, a plurality of flag cells may be provided to increase the reliability. In the second page, the SDC corresponding to the first flag cell FC1 goes high. In the first flag cell FC1, data "0" is replaced with data "1".

The SDC corresponding to the second flag cell FC2 is made low. As a result, writing is done to data "0" in the second flag cell FC2. In a subsequent operation, writing is done to data "2".

In the second page program, as shown in FIG. 1C, when the data in the memory cell is "0" and when externally inputted data is "1", the data in the memory cell is caused to remain at "0". When externally inputted data is "0", the data in the memory cell is made "1".

When the data in the memory cell is "2" and when externally inputted data is "1", the data in the memory cell is caused to remain at "2". However, in the first page write operation, the threshold voltage of the memory cell has risen only to "v'", lower than the threshold voltage of the original data "2". Therefore, these cells are written into until the original threshold voltage "b'" of data "2" has been reached.

In addition, when the data in the memory cell is "2" and when externally inputted data "0", the data in the memory cell is made "3".

(Internal Data Read) (S24)

First, before a cell is written into, an internal read operation is carried out to determine whether the data in the cell on the first page is "0" or "2". An internal read operation is the same as a read operation. In determining whether the data in an ordinary cell is "0" or "2", a read potential "b" is applied to the selected word line. However, in the first page program operation, since the verify potential is "v*" lower than the normal verify potential "v'", it might be lower than the potential "b". Therefore, in the internal data load operation, a read operation is carried out by supplying a potential "a" to the word line.

Specifically, a potential Vread is applied to the unselected word lines and select line SG1 in the selected block. In addition to this, the signal VPRE of the data storage circuit 10 is set at Vdd, the signals BLPRE and BLCLAMP are set at a specific voltage, such as 1 V+Vth, and the bit line is precharged to Vdd. Then, the select line SG2 on the source side of the cell is made high. Since the cells whose threshold voltage is higher than the potential "a" are turned off, the bit line remains high. Since the cells whose threshold voltage is lower than the potential "a" are turned on, the bit line is discharged and goes to the ground potential Vss.

Next, the signal VPRE of the data storage circuit 10 is set at Vdd, the signal BLPRE is set at Vdd+Vth, and node N3 of the TDC is precharged to Vdd. Thereafter, the signal BLCLAMP is set at 0.9 V+Vth. Node N3 of the TDC goes low when the bit line is at the low level and goes high when the bit line is at the high level. Thereafter, the potential of the TDC is transferred to the PDC. As a result, when the data in the memory cell is "2", a high-level signal is latched in the PDC. When the data in the memory cell is "0", a low-level signal is latched in the PDC. FIG. 10A shows the relationship between the SDC, PDC and the data in the memory cell after data load and internal read operations.

(Data Cache Setting) (S25)

Thereafter, the data stored in each data cache is manipulated according to the data cache setting procedure shown in FIGS. 11 and 12. Specifically, in a state where data is externally inputted and the data read by an internal read operation is latched in each data cache as shown in FIG. 11A, the data in the SDC is transferred to the PDC and the data in the PDC is transferred to the DDC as shown in FIG. 11B. Next, as shown in FIG. 11C, the data in the DDC is inverted and the inverted data is transferred to the SDC. Thereafter, the data in the PDC is transferred to the DDC. Next, as shown in FIG. 12A, the data in the DDC is inverted and the inverted data is transferred to the PDC. Thereafter, the data in the PDC is transferred to the DDC. Next, as shown in FIG. 12B, data for the second flag cell FC2 is loaded into the second flag cell data storage circuit 10b and is latched in the SDC. Then, as shown in FIG. 12C, the data in SDC is combined with the data in the DDC. The combined data is inverted and the inverted data is transferred to the PDC. The data in the PDC is transferred to the DDC.

As a result of such an operation, the data stored in each data cache takes the values as shown in FIG. 10B and FIG. 12C.

Specifically, when the data in the memory cell is made "0" (data "1" on the first page and data "1" on the second page), all of the PDC, DDC, and SDC are set to the high level.

When the data in the memory cell is made "1" (data "1" on the first page and data "0" on the second page), the PDC is set to the low level, the DDC is set to the low level, and the SDC is set to the high level.

When the data in the memory cell is made "2" (data "0" on the first page and data "1" on the second page), the PDC is set to the low level, the DDC is set to the high level, and the SDC is set to the low level.

When the data in the memory cell is made "3" (data "0" on the first page and data "0" on the second page), all of the PDC, DDC, and SDC are set to the low level.

(Second Flag Cell Data Load) (S25)

Figure 1D:
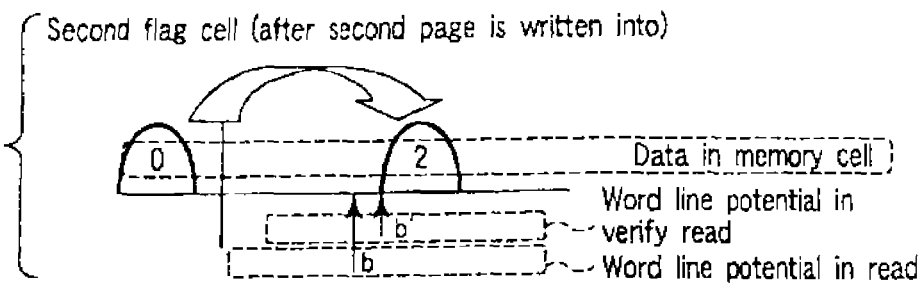

As described above, in the course of setting the data cache, the SDC in the second flag cell data storage circuit 10b is set to the low level. As a result, the data in the second flag cell FC2 changes from "0" to "2". A second page write operation is to do writing from data "0" to "1" in the memory cell and from data "2" to "3" in the memory cell as shown in FIG. 1C. As for the second flag cell, the memory cell is programmed from data "0" to data "2" in the second page write operation. Therefore, as shown in FIG. 1D, the distribution of the threshold voltage of data "2" in the second flag cell might expand as shown in FIG. 1D. However, since the read operation of the second flag cell FC2 is carried out by always supplying the level of "b" lower than "b'" to the word line, there is no problem.

In addition, for example, in the course of setting each data cache, the counter (PC) is initialized to "0" (S25).

Thereafter, it is determined whether data has bee written into the first flag cell FC1 (S26). The data in the first flag cell FC1 has been read out in the internal read operation (S24). If no data has been written into the first flag cell FC1, control proceeds to the program operation (S27). If data has been written in the first flag cell FC1, the internal read operation is carried out again using the level of "b" (S26 to S23).

(Program) (S27)

When no data has been written in the first flag cell FC1, data is written into the memory cell. For example, after the counter (PC) is counted up, when the signal BLC1 is set at Vsg, if the PDC has data "0", the bit line is at Vss. If the PDC has data "1", the bit line is at Vdd. Next, the signal BLC1 is set to Vss and then the signal VREG is set to Vdd, and the signal REG is set to the intermediate potential+Vth (1 V+Vth). Then, if the DDC has data "1", the bit line is at Vdd. If the DDC has data "0", the bit line is not precharged. As a result, only when data "1", "3" have been written in the memory cell, the bit line is at Vss. When data "2" has been written in the memory cell, the bit line is at the intermediate potential (1 V). If the data in the memory cell is "0" (if no writing is done), the bit line is at Vdd. Here, the selected word line is set at Vpgm and the unselected word line is set at Vpass. If the bit line is at Vdd, no writing is done. If the bit line is at Vss, writing is done. If the bit line is at the intermediate potential (1 V), writing is done a little. Accordingly, a memory cell in which data "2" has been written might be written into insufficiently. The reason for this is that, since data "2" and data "3" are verified simultaneously, the write time ends earlier when they are written as simultaneously as possible. Therefore, the intermediate potential is supplied to the bit line.

Thereafter, when data "1" has been written in the memory cell (S28) and the value of the counter (PC) is smaller than the maximum number of verify operations using the predetermined verify voltage "a'" (S29), a write verify operation is carried out by setting the verify voltages "a*'" and "a'" in sequence (S30).

In the explained below, a verify operation is carried out by setting the verify voltages "a*'", "a'", "b*'", "b'", and "c'" in that order. At this time, to perform a program operation and a verify operation skipping unnecessary verify operations, the value of the counter (PC) is compared with a predetermined value (S29, S31, S32, S34, S37). For example, if the number of verify operations using the verify voltages "a*'" and "a'" has reached the maximum number of loops, verify operations using "a*'" and "a'" are skipped. In addition, for example, if the number of verify starts using the verify voltage "b'" has not been reached, a verify operation using "b'" is skipped and the program is executed. Each value needed to control the skips is set as follows: for example, The maximum number of loops=10 using verify voltage "a'"

The number of verify starts=4 using verify voltage "b'"

The number of verify starts=8 using verify voltage "c'"

The maximum number of program loops=20

(Verify "a*'", "a'") (S30)

In the verify operation, when the signal VPRE is set to the high level and the signal BLCLAMP is set to a specific potential, the bit line is precharged.

In FIG. 13A:

Verify (a*').

Discharge bit line at a potential of WL=a*'.

In particular, FIG. 13A shows the data set in each data cache after a verify operation using the verify voltage "a*'".

Next, the potential of the word line is set to the verify potential "a*'" and the bit line is discharged. The signal VPRE is set to Vdd and the signal BLPRE is set to Vsg and the TDC is charged to Vdd. Then, a specific voltage is supplied to the signal BLCLAMP. If the bit line is at Vss, the TDC goes to Vss (low level). If the precharge potential remains on the bit line, the TDC goes to Vdd (high level). Here, the signal BLC2 is set at Vth+0.5 V. If the SDC has "0" (if data "2", "3" have been written in the memory cell), the TDC goes to Vss. Thus, it is when data "1" has been written in the memory cell and the verify potential "a*'" has been reached that the TDC goes to Vdd. If data "1" has not been written in the memory cell, the bit line has not been precharged, with the result that the TDC is at the low level. If data "1" has been written in the memory cell and the verify potential "a*'" has not been reached, the TDC is at Vss.

Here, when the signal VREG is made high and the signal REG is made high, if the data in the DDC is "1", the TDC is forced to go high. Therefore, it is when data "1" has been written in the memory cell and the verify potential "a*'" has been reached or when the data in the DDC is "1", that is, data "2" has been written in the memory cell that the TDC goes to Vdd. Then, the signal DTG is set to Vsg and the data in the PDC is copied into the DDC. Thereafter, the signal BLC1 is set to Vsg and the potential of the TDC is loaded into the PDC.

In FIG. 13B:

Set TDC at Vdd temporarily and transfer the bit line potential to TDC with BLCLAMP=H.

Set BLC2=Vth+0.5V. When SDC=0, set TDC=0.

Set VREG=H and REG=H. When dynamic data is 1, set TDC at 1.

Transfer data in PDC to DDC and transfer data in TDC to PDC.

In particular, in FIG. 13B, it is when data "1" has been written in the memory cell and the verify potential "a*'" has been exceeded or when data "2" has been written in the memory cell that the PDC has data "1".

Next, the potential of the word line is raised a little to produce a verify potential "a'" and the bit line is discharged. After the signal VPRE is set to Vdd, the signal BLPRE is set to Vsg, and the TDC is charged to Vdd again, a specific voltage is supplied to the signal BLCLAMP. If the bit line is at Vss, the TDC is at Vss. If the precharge potential is left on the bit line, the TDC is at Vdd. Here, when the signal BLC2 is set to Vth+0.5 V, if the SDC has "0" (when data "2", "3" have been written in the memory cell), the TDC is at Vss. Thus, it is when data "1" has been written in the memory cell and the verify potential "a'" has been reached that the TDC goes to Vdd. The TDC goes to Vss when data "1" has not been written in the memory cell or when data "1" has been written in the memory cell and the verify potential "a'" has not been reached.

Here, when the signal VREG is made high and the signal REG is made high, if the data in the DDC is "1", that is, if no data has been written in the memory cell, the TDC is forced to go high. It is when writing is unselected or when data "1" has been written in the memory cell and the verify potential "a'" has been reached that the TDC goes to Vdd.

Then, after the signal DTG is set to Vsg and the data in the PDC is copied into the DDC, the signal BLC1 is set to Vsg and the potential of the TDC is loaded into the PDC (see FIG. 14).

In FIG. 14:
Discharge bit line at a potential of WL=a*'.
Set TDC at Vdd temporarily and transfer the bit line potential to TDC with BLCLAMP=H.
Set BLC2=Vth+0.5V. When SDC=0, set TDC=0.
Set VREG=H and REG=H. When dynamic data is 1, set TDC at 1.
Transfer data in PDC to DDC and transfer data in TDC to PDC.

In a cell where data "1" has been written in the memory cell, when the threshold voltage becomes higher than the verify potential "a*'", the data in the DDC becomes "1" (high level). In a cell where data "1" has been written in the memory cell, when all of the write operations using the verify potential "a'" have been completed, the data in the PDC becomes "1" (high level).

Thereafter, when the value of the counter (PC) is larger than the number of verify starts using a predetermined verify voltage "b'" (S31) and smaller than the number of verify starts using a predetermined verify voltage "c'" (S32), the verify potential "b" is set and a write verify operation is carried out (S33).

In FIG. 15:
Verify (b').
Charge bit line with data in DDC.
Discharge bit line with a potential of WL=b'.
During discharge, transfer DDC to TDC, PDC to DDC, and TDC to PDC.
Set TDC at Vdd temporarily and transfer the bit line potential to TDC with BLCLAMP=H.
Set VREG=H and REG=H. When dynamic data is 1, set TDC at 1.
Transfer data in PDC to DDC and transfer data in TDC to PDC.
(Verify "b'") (S33)

A verify operation using the verify potential "b" (see FIG. 15). Since the writing of data "2" into the memory cell is completed earlier than the writing of data "3", only the verify potential "b" is verified first. The signal VPRE is set to Vdd and the signal BLCLAMP is set to a specific potential, thereby precharging the bit line. Next, the verify potential "b'" is supplied to the word line and the bit line is discharged. While the bit line is being discharged, the data in the DDC is transferred to the TDC. Thereafter, the data in the PDC is transferred to the DDC and the data in the TDC is transferred to the PDC. Then, the TDC is charged to Vdd. Thereafter, the signal BLCLAMP is set to a specific potential. Then, it is when the threshold voltage of the cell is equal to or higher than the verify potential "b'" that the TDC goes high. Here, when the signal BLC1 is set at Vth+0.5 V, if the PDC has "0" (when data "3" has been written in the memory cell or when data "1" has been written in the memory cell and the threshold voltage of the cell is equal to or lower than the verify potential "a*'"), the TDC goes to Vss. Thus, it is when data "2" has been written in the memory cell and the verify potential "b'" has been reached that the TDC goes to Vdd. Next, when the signal VREG is made high and the signal REG is set to Vsg, if the data in the DDC is at the high level, the TDC is forced to go high. Therefore, it is when data "2" has been written in the memory cell and the verify potential "b'" has been reached or when writing is unselected that the TDC goes to Vdd. After the signal DTG is set to Vsg and the data in the PDC is copied into the DDC, the signal BLC1 is set to Vsg and the potential of the TDC is loaded into the PDC.

Thereafter, when the value of the counter (PC) is larger than the number of verify starts using the verify voltage "c'" (S34), a simultaneous verify operation using verify potentials "b" and "c" is carried out (S34, S35).

In FIG. 16:
Verify (b,c).
Charge bit line.
Discharge bit line with a potential of WL−c'.
During discharge, transfer DDC to DC, PDC to DDC, and TDC to PDC.
Set TDC at Vdd temporarily and transfer the bit line potential to TDC with BLCLAMP=H.
Set VREG=H and REG=H. When dynamic data is 1, set TDC at 1.
Transfer data in PDC to DDC and transfer data in TDC to PDC.

(Simultaneous Verification Using Verify Potentials "b", "c") (FIG. 16)

In the course of repeating the program and verify operation a plurality of times, the writing of data into a cell where data "3" is being written into the memory cell is completed. Therefore, instead of the verify operation using the verify potential "b", a simultaneous verify operation is carried out using the verify potentials "b" and "c". First, the signal BLPRE is set to the high level and the signal BLCLAMP is set to a specific potential, thereby precharging the bit line.

Next, the verify potential "b'" is supplied to the word line, thereby discharging the bit line. While the bit line is being discharged, the data in the DDC is transferred to the TDC. Thereafter, the data in the PDC is transferred to the DDC and the data in the TDC is transferred to the PDC.

Then, after the TDC is charged to Vdd, a specific potential is supplied to BLCLAMP. Therefore, it is when the threshold voltage is equal to or higher than the verify potential "b'" that the TDC goes high. Here, when the signal BLC1 is set to Vth+0.5 V, if the PDC has "0" (when data "3" has been written in the memory cell or when data "1" has been written in the memory cell and the threshold voltage is equal to or lower than the verify potential "a*'"), the TDC goes to Vss. Therefore, it is when data "2" has been written in the memory cell and the verify potential "b'" has been reached that the TDC goes to Vdd. Next, when the signal VREG is made high and the signal REG is set to Vsg, if the data in the DDC is at the high level, the TDC is forced to go high. Therefore, it is when data "2" has been written in the memory cell and the verify potential "b'" has been reached or when writing is unselected that the TDC goes to Vdd. After the signal DTG is set to Vsg and the data in the PDC is copied into the DDC, the signal BLC1 is set to Vsg and the potential of the TDC is loaded into the PDC.

Next, the verify potential "c'" is supplied to the word line and the bit line is discharged. While the bit line is being discharged, the data in the DDC is transferred to the TDC. Thereafter, the data in the PDC is transferred to the DDC and the data in the TDC is transferred to the PDC.

Then, after the TDC is charged to Vdd, a specific potential is supplied to BLCLAMP. It is when data "3" has been written in the memory cell and the verify potential "c'" has been reached that the TDC goes to Vdd. Next, when the signal VREG is made high and the signal REG is set to Vsg, if the data in the DDC is at the high level, the TDC is forced to go high. Therefore, it is when data "2" has been written in the memory cell and the verify potential "c'" has been reached or when writing is unselected that the TDC goes to Vdd. After the signal DTG is set to Vsg and the data in the PDC is copied into the DDC, the signal BLC1 is set to Vsg and the potential of the TDC is loaded into the PDC.

In this way, the program and verify operation is repeated until the data in all of the PDCs has become "1" (S36, S37). However, when the data in the DDC is "1" in a write operation, that is, when data "2" has been written in the memory cell or when data "1" has been written in the memory cell and the verify potential "a*'" has been exceeded, the bit line is set to the intermediate potential and a write operation is carried out.

Each time the program and verify operation is repeated, the program voltage Vpgm is raised little by little. An increment ΔVpgm in the program voltage Vpgm differs between the first page write operation and the second page write operation. For example, an increment ΔVpgm in the first page write operation is set larger than an increment ΔVpgm in the second page write operation.

In the algorithm of FIG. 9, after program and verify "a*, a'" are repeated several times, program and verify "a*', a'" and program verify "b'" are repeated several times, and program and verify "a*', a'" and program verify "b', c'" are repeated several times. In the middle of repeating the operations, the writing of data "1" into the memory cell is completed earlier. Therefore, when the cells into which data "1" is to be written have run out, program verify "a*', a'" is skipped and program and program verify "b'" or program and program verify "b', c'" are repeated. When program and verify "a*', a'" are skipped, the SDC is not used. Therefore, the next program data can be inputted. However, there may be a cell where data "1" is difficult to write into the memory cell. Therefore, the number of times of program verify "a*, a'" is limited (S29).

In the first embodiment, the data on the first page (lower page) is written into the memory cell. Thereafter, when the data on the second page (upper page) is written into the memory cell, the data on the first page is read out and threshold voltages of three levels are written. However, the data on the first page and the data on the second page may be written into the memory cell at the same time.

Figure 17:
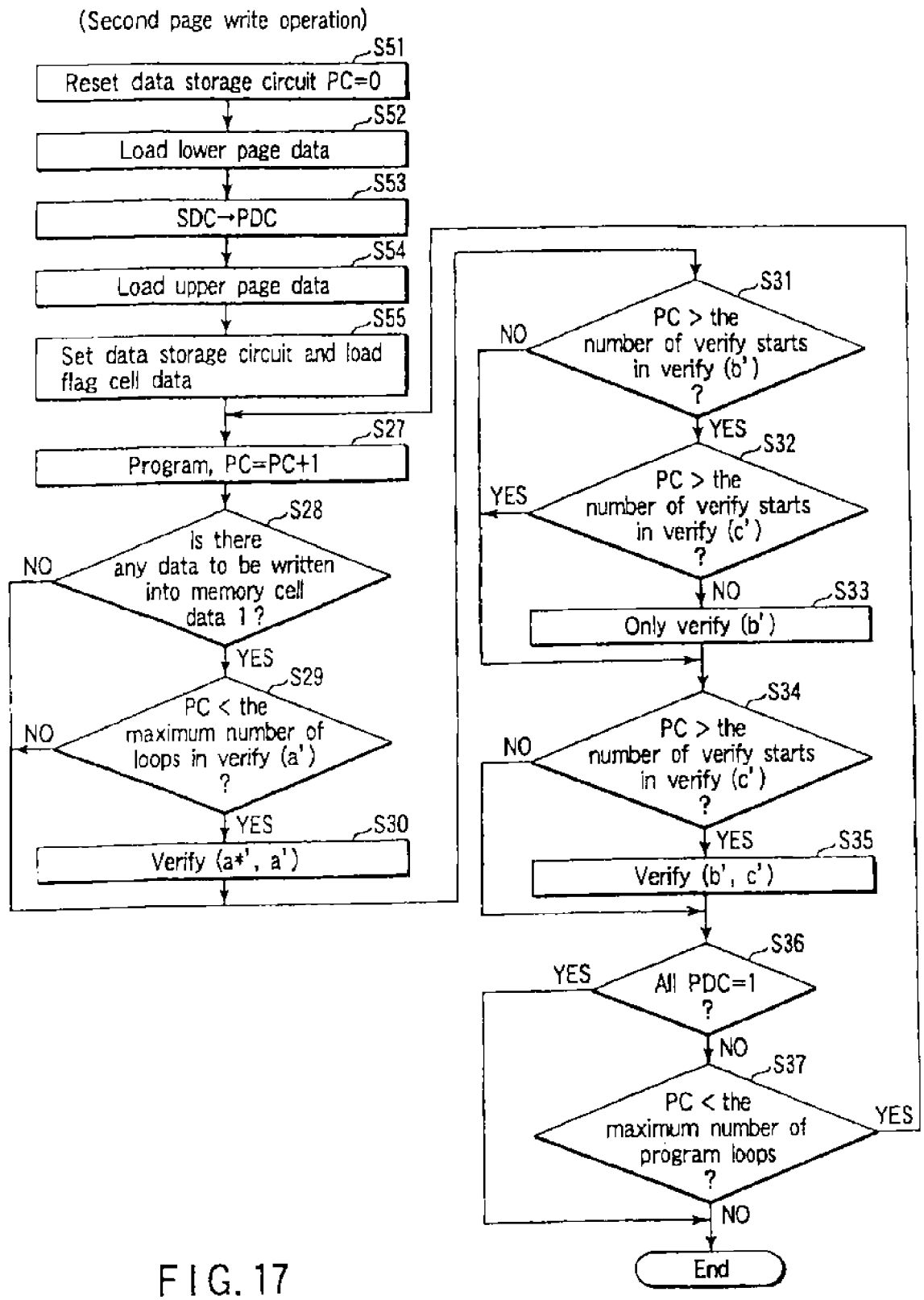
FIG. 17 is a flowchart to explain a second page program operation, showing a modification of the first embodiment.

FIG. 17 shows a modification of the first embodiment. The same parts as those in FIG. 9 are indicated by the same reference numerals. As shown in FIG. 17, the data storage circuits are reset and the counter (PC) is initialized (S51). Thereafter, the data on the first page is loaded into the SDC (S52). Then, the data on the first page is transferred from the SDC to the PDC (S53). Next, the data on the second page is loaded into the SDC (S54). Thereafter, each data cache is set as shown in FIG. 10B (S55). According to the data in the data cache, the program is executed (S56).

In such a method, since the data on the first page and the data on the second page are written into the memory cell simultaneously, the data on the first page need not be read out for a write operation and internal data read only for the first page. This enables a higher speed write operation.

(First Page Read)

Figure 18A:
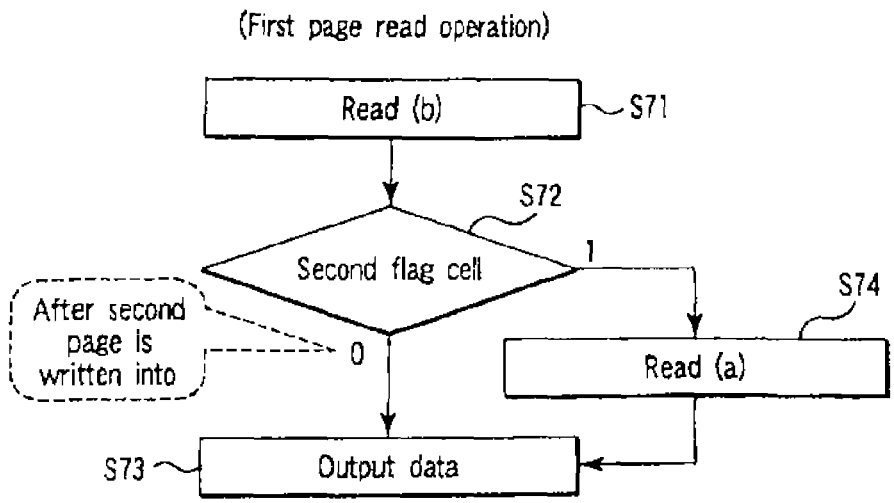
FIGS. 18A and 18B are flowcharts to explain a read operation.

FIG. 18A is a flowchart for a first page read operation. First, an address is specified, thereby selecting two pages shown in FIG. 3. As shown in FIGS. 1B and 1C, the distribution of threshold voltage differs before and after the second page is written into. Therefore, the potential of the word line is set to "b" and a read operation is carried out. Then, it is determined whether the data in the second flag cell is either "0" or "1" (S71, S72). In this determination, if there are a plurality of flag cells, it is decided by the majority of the flag cells whether the data in the second flag cell is either "0" or "1".

If the data read from the second flag cell is "0" (the data in the memory cell is "2"), this means that the second page has been written into. Thus, the distribution of threshold voltage of the cell is as shown in FIG. 1C. To determine the data in such a cell, a read operation is carried out using the word line potential "b". However, in step S71, the result of performing a read operation using the word line potential "b" has been already read into the data storage circuit. Therefore, the data stored in the data storage circuit is outputted to the outside (S73).

On the other hand, if the data read from the flag cell is "1" (the data in the memory cell is "0"), this means that the second page has not been written into. The distribution of threshold voltage of the cell is as shown in FIG. 1A or 1B. To determine the data in these memories, a read operation has to be carried out using the word line potential "a". Therefore, a read operation is carried out using the word line potential "a" (S74). Thereafter, the data read into the data storage circuit is outputted to the outside (S73).

(Read Operation: First Page Read)

As described above, in the first page read operation, the read potential "a" or "b" is supplied to the selected word line, thereby performing the read operation.

First, a read voltage Vread is supplied to the unselected word lines and select line SG1 in the selected block. The signal BLPRE is set to 1 V+Vth and BLCLAMP is set to Vdd+Vth in the data storage circuit shown in FIG. 6, thereby precharging the bit line. Thereafter, the select line SG2 on the source side of the cell is made high. Since the cells whose threshold voltage is higher than the potential "a" or "b" are turned off, the bit line remains at the high level. In addition, since the cells whose threshold voltage is lower than the potential "a" or "b" are turned on, the bit line goes to Vss.

Next, the signal BLPRE of the data storage circuit 10 is set to Vdd+Vth, thereby turning on the transistor 61u, which precharges node N3 of the TDC to Vdd. Thereafter, the signal BLCLAMP is set to the intermediate potential (e.g., 0.9 V+Vth), thereby turning on the transistor 61t. Node N3 of the TDC goes low when the bit line is at the low level and goes high when the bit line is at the high level.

Next, the signal BLC1 is set to Vsg (Vdd+Vth), thereby loading the potential of the TDC into the PDC. Thereafter, the data in the PDC is transferred to the SDC. If the data in the second flag cell FC2 is "1" (if no data has been written), the read level is changed and the cell is read from again.

(Second Page Read)

Figure 18B:
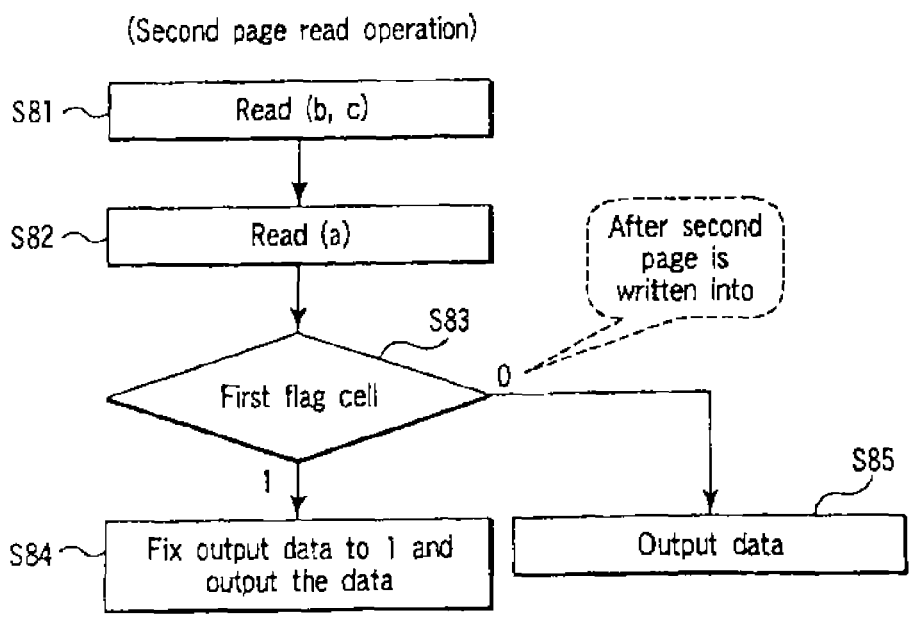

FIG. 18B is a flowchart for a second page read operation. In the second page read operation, an address is specified, thereby selected two pages shown in FIG. 3. As shown in FIGS. 1B and 1C, the distribution of threshold voltage differs before and after the second page is written into. However, after the second page is written into, the distribution is as shown in FIG. 1C. For this reason, a read operation has to be carried out by changing the word line potential three times in this order: "a", "b", "c". However, in a write operation, a verify operation with "c" is carried out by only changing the word line potential after a verify operation with "b". Thus, it is desirable that a read operation should be the same as a verify operation. Therefore, a read operation with "b" and that with "c" are carried out simultaneously.

Specifically, first, read operations are carried out simultaneously with the word line potentials "b" and "c" (S81). Thereafter, a read operation is carried out using the word line potential "a" (S82). When the threshold voltage of the memory cell is lower than the word line potential "a" or when the threshold voltage is higher than word line potential "b" and lower than the word line potential "c", data is determined to be "1". In addition, when the threshold voltage of the memory cell is higher than the word line potential "a" and lower than the word line potential "b" or when the threshold voltage is higher than word line potential "c", data is determined to be "0". Before the second page is written into, "1" should be outputted as the data on the second page. However, the distribution of threshold voltage is as shown in FIG. 1A. Thus, when the same read operation as after the second page is written into is carried out, the output data might be "0". Therefore, it is determined whether the data in the first flag cell FC1 is either "0" or "1" (S83). If the result has shown that the data in the first flag cell FC1 is "1" and the second page has not been written into, the output data is fixed to "1" (S84). To fix the output data to "1", the signal PRST of the data storage circuit is made high and the SDC is set to "1". Alternatively, the data input/output buffer of FIG. 2 is caused to output only data "1". In addition, if the data in the first flag cell FC1 is "0", the read-out data is outputted (S85).

In the second page read operation, the following operation is carried out.

(Read Operation: Second Page Read First Session)

In a first session of the second page read operation, as in the simultaneous verification using "b" and "c" in a program verify operation, after the bit line is precharged, the read potential "b" is supplied to the word line. In this state, the data is read from the memory cell. In the middle of the read operation, the potential of the word line is changed to the read potential "c" and the read operation is performed (S81).

First, the read voltage Vread is supplied to the unselected word lines and select line SG1 in the selected block. The signal BLPRE is set to 1 V+Vth and BLCLAMP is set to Vdd+Vth in the data storage circuit shown in FIG. 6, thereby precharging the bit line. Thereafter, the select line SG2 on the source side of the cell is made high. Since the cells whose threshold voltage is higher than the potential "b" are turned off, the bit line remains at the high level. In addition, since the cells whose threshold voltage is lower than the potential "b" are turned on, the bit line goes to Vss.

Next, the signal BLPRE of the data storage circuit is set to Vdd+Vth, thereby turning on the transistor 61u, which precharges node N3 of the TDC to Vdd. Thereafter, the signal BLCLAMP is set to 0.9 V+Vth, thereby turning on the transistor 61t. Node N3 of the TDC goes low when the bit line is at the low level and goes high when the bit line is at the high level. Next, the signal BLC1 is set to Vsg (Vdd+Vth), thereby loading the potential of the TDC into the PDC.

Next, the word line potential is changed to "c". Since the cells whose threshold voltage is higher than the potential "c" are turned off, the bit line remains at the high level. In addition, since the cells whose threshold voltage is lower than the potential "b" are turned on, the bit line goes to Vss. While the bit line is being discharged, the signal DTG is set to Vdd+Vth, thereby copying the data in the PDC into the DDC.

Next, the signal BLPRE of the data storage circuit 10 is set to Vdd+Vth, thereby turning on the transistor 61u, which precharges node N3 of the TDC to Vdd. Thereafter, the signal BLCLAMP is set to 0.9 V+Vth, thereby turning on the transistor 61t. Node N3 of the TDC goes low when the bit line is at the low level and goes high when the bit line is at the high level. Next, the signal BLC1 is set to Vsg(Vdd+Vth), thereby loading the potential of the TDC into the PDC.

(Read Operation: Second Page Read Second Session)

In a second session of the second page read operation, the read potential "a" is supplied to the selected word line, thereby conducting a read operation (S82).

First, the read voltage Vread is supplied to the unselected word lines and select line SG1 in the selected block. In this state, the signals BLPRE, BLCLAMP in the data storage circuit 10 are set to 1 V+Vth, thereby precharging the bit line. Thereafter, the select line SG2 on the source side of the cell is made high. Since the cells whose threshold voltage is higher than the word line potential "a" are turned off, the bit line remains at the high level. In addition, since the cells whose threshold voltage is lower than the word line potential "a" are turned on, the bit line goes to Vss.

Next, the signal BLPRE of the data storage circuit 10 is set to Vdd+Vth, thereby precharging node N3 of the TDC to Vdd. Thereafter, the signal BLCLAMP is set to Vdd+Vth, thereby turning on the transistor 61t. Node 3 of the TDC goes low when the bit line is at the low level and goes high when the bit line is at the high level.

While the bit line is being discharged, the signal VPRE is set to Vss and the signal BLPRE is set to Vdd+Vth, thereby putting the TDC to Vss temporarily. Thereafter, the signal REG is set to Vdd+Vth and the signal VREG is set to Vdd. If the DDC is at the high level, the TDC is made high. That is, the data in the DDC is copied into the TDC. Next, the signal is DTG is set to Vdd+Vth, thereby copying the data in the PDC into the DDC. Then, the signal VREG is set to Vss and the signal REG is set to Vdd. If the DDC is at the high level, the TDC is forced to go low. Thereafter, the signal BLC1 is set to Vdd+Vth, thereby loading the potential of the TDC into the PDC. It is when the threshold voltage has exceeded the "b" level and is equal to or lower than the "c" level in the first read operation that the PDC goes high. In addition, it is when the threshold voltage is equal to or lower than the "b" level or is equal to or lower than the "c" level that the PDC goes low.

Next, the signal BLPRE of the data storage circuit 10 is set to Vdd+Vth, thereby turning on the transistor 61u, which precharges node N3 of the TDC to Vdd. Thereafter, the signal BLCLAMP is set to 0.9 V+Vth, thereby turning on the transistor 61t. Node 3 of the TDC goes low when the bit line is at the low level and goes high when the bit line is at the high level. Next, the signal DTG is set to Vdd+Vth, the signal REG is set to Vdd, and the signal VREG is set to Vss.

If the PDC is at the high level, the TDC is forced to go to Vss. Then, the signal BLC1 is set to Vsg (Vdd+Vth), thereby loading the potential of the TDC into the PDC. As a result, it is when the threshold voltage of the memory cell is higher than the word line potential "a" and lower than the word line potential "b" or when the threshold voltage is higher than the word line potential "c" that the PDC goes high. Thereafter, the data in the PDC is transferred to the SDC.

When the data in the first flag cell FC1 is "1" (when no data has been written), the second page has not been written into. Therefore, the output data is fixed to "1" and the data is outputted (S84).

In the above explanation, the potential of the word line has been changed to "b" and "c" in the first precharging of the bit line, thereby reading the data in the memory cell. Then, the bit line has been precharged again, thereby reading the data with the word line potential "a". Alternatively, the data in the memory cell may be read by changing the potential of the word line in the order of "a", "b", "c" in the first precharging of the bit line.

(Erase)

In an erase operation, an address is specified first, thereby selecting a block shown by a broken line in FIG. 3. Next, the potential of a well where cells are formed is raised to a high voltage (about 20 V), the word line of the selected block is set to Vss, and the word lines of the unselected blocks are made floating. Then, a high voltage is applied between the cells of the selected block and the well, which erases the data stored in the cells. On the other hand, in the unselected blocks, since the word lines are in the floating state, when the well is raised to a high voltage, the word lines are also raised to a high voltage by capacitive coupling. As a result, the data stored in the memory cells in the unselected blocks are not erased.

After an erase operation, the data in the memory cells become "0". Even if either the first or the second page read operation is carried out, data "1" is outputted.

With the first embodiment, in the second-page program verify operation, data "2" and data "3" are verified simultaneously using the verify voltages "b'" and "c'". Therefore, to conduct two verify operations, the bit line is precharged once and the word line potential is set only to "b'" and "c'". Consequently, the number of precharges of the bit line requiring a long time can be decreased, which improves the verify speed.

Furthermore, in the second page read operation, data "2" and data "3" are read by precharging the bit line once and setting the word line potential to "b" and "c". Thus, the number of precharges can be reduced, which improves the read speed.

Moreover, in a program verify operation and a read operation, the bit line is precharged and then the potential of the word line is changed. This enables a program verify operation and a read operation to be carried out under the same conditions, which improves the reading accuracy.

In the second page write operation, the maximum number of loops which determines the number of executions of verify operations using "a'" is set. When the value of the counter (PC) has reached the maximum number of loops, the verify operation using "a'" is ended. As a result, the second page write time can be made shorter.

Furthermore, in the first embodiment, the data on the first page is written into the memory cell using a potential lower than the original threshold voltage, the data on the first page is written into the adjoining memory cell before the data on the second page is written, and the data on the second page is written into the memory cell after the adjoining memory cell is written into, thereby setting the original threshold voltage corresponding to the stored data. Since the data on the first page is written into the memory cell, taking into account the FG-FG capacitance of the adjoining memory cell, the threshold voltage corresponding to multivalued data can be set accurately.

When the data on the second page is written, data is written into the flag cell. In reading the data on each page, the externally outputted data is controlled according to the data stored in the flag cell. Therefore, the data on each page can be outputted reliably.

In the prior art, when part of the data read from, for example, the memory cell is replaced with the externally inputted data and the resulting data is written, that is, when a so-called page copy is made, a transistor 62e is inserted between the inverter circuit 62c and the inverter 62d and a transistor 62f is connected in parallel with the inverter circuit 62c and the transistor 62e as shown by a broken line in FIG. 6. In such a conventional configuration, when a program command is inputted in the middle of a page copy, the data read from the memory cell is inverted in logic level with respect to the data supplied from the data input terminal 5a and the result is latched in the SDC. Therefore, it is necessary to cause the data supplied from the data input terminal 5a to coincide in logic level with the data latched in the SDC. Accordingly, in a page copy, the transistor 62e is turned on and the transistor 62f is turned off by complementary signals φ, /φ, thereby inverting the writing data. The resulting data is supplied to the SDC.

However, with the first embodiment, in a page copy, the data read from the memory cell is inverted and the inverted data is latched in the SDC. The data from the data input terminal 5a is caused to coincide in logic level with the data in the SDC. Therefore, there is no need to provide the transistors 62e, 62f between the data input terminal 5a and the SDC as in the prior art. Consequently, the first embodiment has the advantage of simplifying the circuit configuration.

In the first embodiment, when the data on the second page (upper page) is written into the memory cell, a program and verify (a*, a') operation and a program verify (b', c') operation are carried out separately. However, as in a program verify (b', c') operation, they may be verified simultaneously by raising the word line potential in the order of a*, a', b', c' sequentially after the bit line is charged once.

In addition, in the second page read operation, a read (b, c) operation and a read (a) operation are carried out separately. However, these data items may be read simultaneously by raising the word line potential in the order of a, b, c sequentially after the bit line is charged once.

Second Embodiment

FIG. 19 shows a memory cell array 1 and a bit line control circuit 2 in a NAND flash memory for storing 8-valued (3 bits of) data according to a second embodiment of the present invention. Since the configuration of FIG. 19 is almost the same as the configuration for 4-valued (2 bits of) data shown in FIG. 3, only the part differing from the configuration of FIG. 3 will be explained.

In FIG. 19, when one word line is selected by an external address, then one sector shown by a broken line is selected. One sector is composed of three pages. An address is used to switch between the three pages. Specifically, since 3 bits of data can be stored in a memory cell, the switching between three bits is done by an address (a first page, a second page, and a third page). One sector has five flag cells FC1, FC2, FC3, FC4, and FC5 (FIG. 19 shows only flag cells FC1 and FC5). Therefore, when one word line is selected, the five flag cells FC1, FC2, FC3, FC4, and FC5 are selected at the same time. The flag cells FC1 to FC5 are connected via bit lines to flag data storage circuits 10*a*, 10*b*, 10*c*, 10*d*, 10*e*, respectively (FIG. 19 shows only the flag data storage circuits 10*a*, 10*e*). The flag cells FC1, FC2 store data indicating that the second page has been written into. The flag cells FC3, FC4, FC5 store data indicating that the third page has been written into.

However, since one memory cell can store 3 bits of data, three flag cells may be used to store data indicating that the second page and third page have been written into, without using five flag cells.

Moreover, to increase the reliability, more than one of each of the flag cells FC1 to FC5 may be provided. The same data is stored in these cells. In a read operation, majority decision may be applied to the data read from the flag cells.

The operation of the second embodiment will be explained.

An erase operation is the same as in the case of 4-valued data.

Figure 20A:
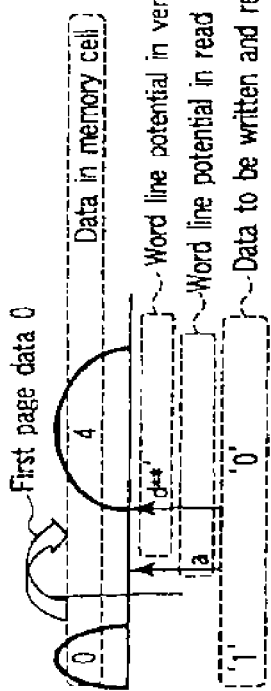
FIGS. 20A, 20B and 20C show the relationship between data in a memory cell and the threshold voltages of the memory cell.
Figure 20B:
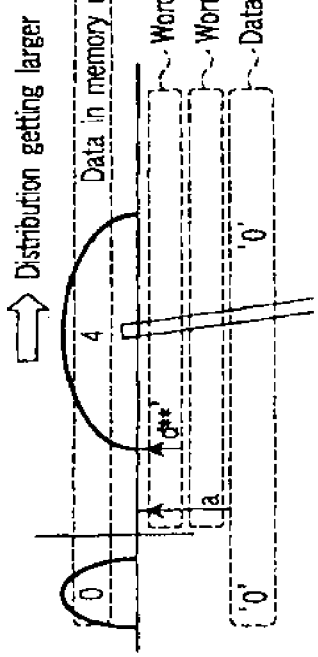

FIGS. 20A, 20B, 20C and FIGS. 21A, 21B show the relationship between the data in a memory cell and the threshold voltage of the memory cell. After an erase operation is carried out, the data in the memory cell becomes "0". As shown in FIG. 20A, when the first page is written into, the data in the memory cell becomes data "0" and data "4". Thereafter, when data is written into a cell adjoining the first page, the threshold voltage of data "4" expands (FIG. 20B).

Figure 20C:
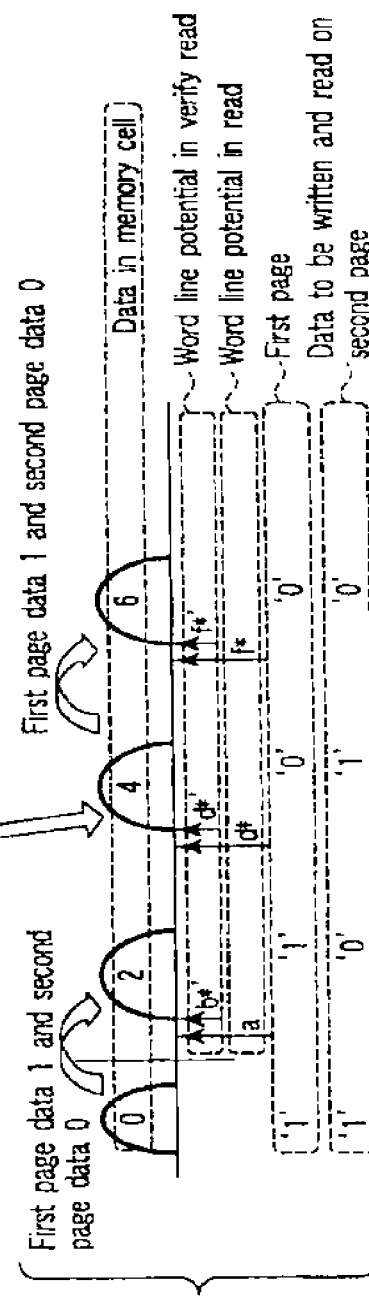

After the second page is written into, the data in the memory cell becomes data "0", "2", "4", "6" (FIG. 20C). Thereafter, when data is written into the adjoining cell, the threshold value distribution of each of data "0", "2", "4", "6" expands (FIG. 21A).

Figures 21A, 21B:
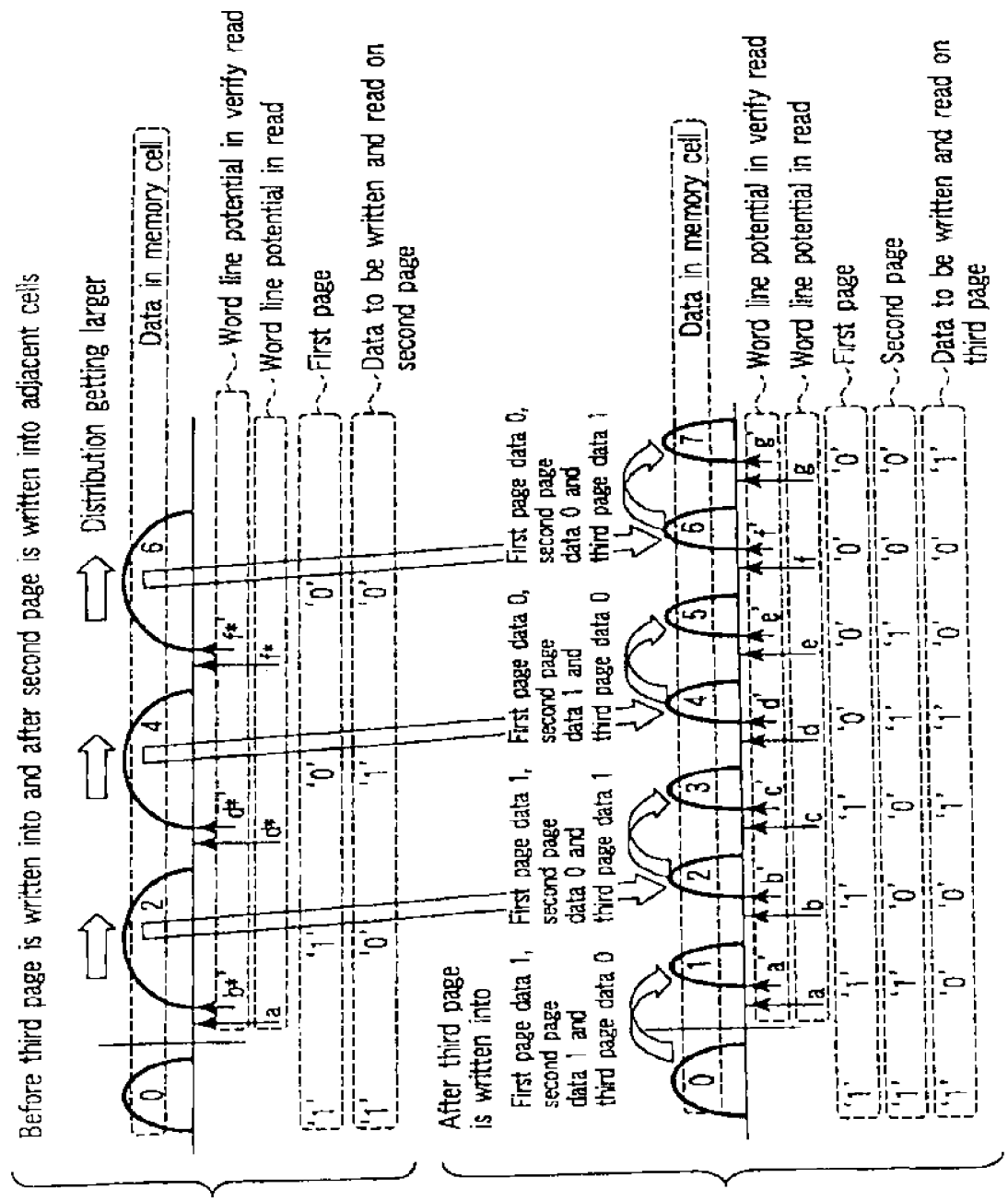
FIGS. 21A and 21B show the relationship between data in a memory cell and the threshold voltages of the memory cell.

After the third page is written into, the data in the memory cell becomes data "0" to "7" (FIG. 21B). In the second embodiment, the data in the memory cell is defined, starting from the lowest threshold voltage upward.

Figure 22A:
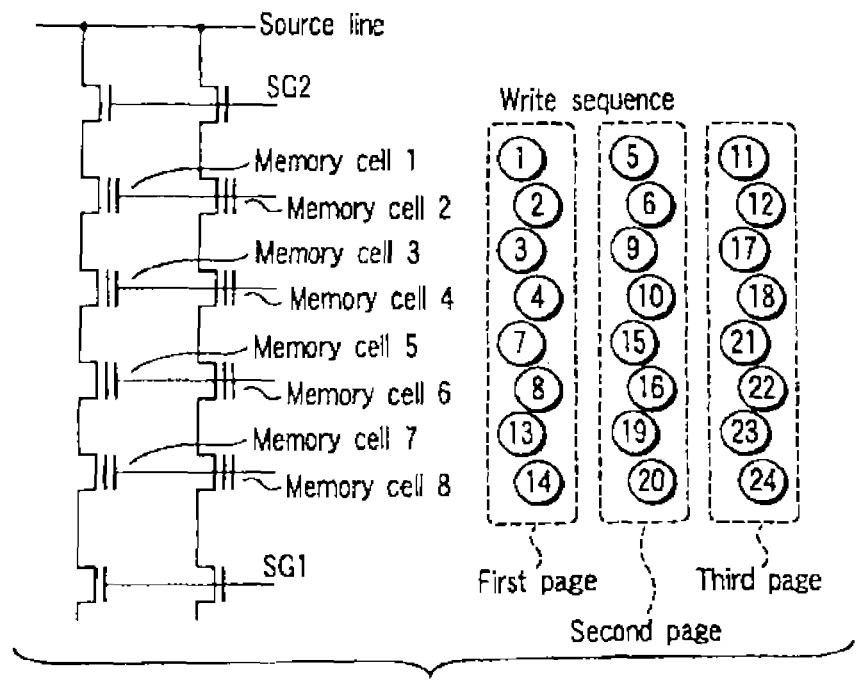
FIGS. 22A and 22B show an example of the order in which writing is done in the second embodiment.
Figure 22B:
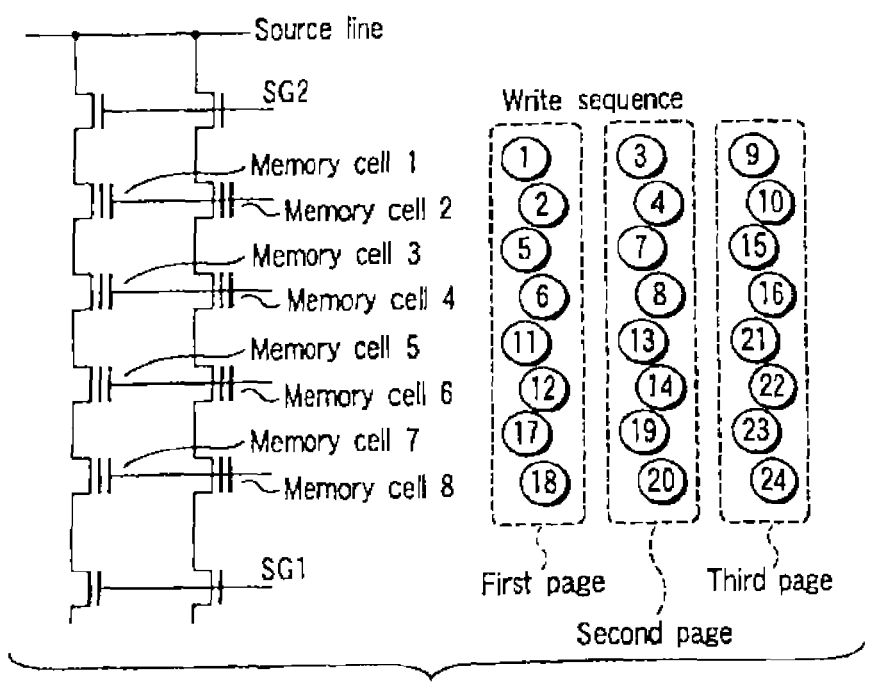

FIGS. 22A and 22B show two write sequences in the second embodiment. In a block, data is written in pages, starting from a memory cell closer to the source line. In FIGS. 22A and 22B, for the sake of explanation, the number of word lines is set at 4. The write sequence shown in FIG. 22A is similar to the write sequence shown in FIG. 7. In contrast, the write sequence shown in FIG. 22B differs a little from that of FIG. 22A. Specifically, after the first page is written into, the same cell is written into up to the second page, instead of writing data into the second page of the adjoining cell. Thereafter, before the third page is written into, up to the second page of the adjoining cell is written into and then the third page is written into. As described above, writing may be done, taking into account the effect of a cell adjoining the third page.

Let the original read potentials for the third page word line be "a", "b", "c", "d", "e", "f", "g" and the verify potentials be "a'", "b'", "c'", "d'", "e'", "f'", "g'". Let the second page read potentials be "b*" (="a"), "d*", "f*" lower than the original read potentials and the second page verify potentials be "b*'", "d*'", "f*'" a little higher than these. Let the first page read potential be "d" (="a") lower than the original read potential and the first page verify potential be "d'" a little higher than this.

(Program and Program Verify)

In a program operation, first, an address is specified, thereby selecting three pages shown in FIG. 19. In the memory, of the three pages, programming can be done only in this order: the first page, the second page, and then the third page. First page and second page are programmed in the same manner as in the case of 4-valued data.

The data in a 4-valued memory cell and the threshold voltages of the memory cell shown in FIGS. 20A, 20B, and 20C correspond to those in FIGS. 1A, 1B, and 1C. Since flowcharts for a program and a program verify operation are the same as those in FIGS. 8 and 9, they will be omitted. The definitions of data in the memory cell and the word line potentials are "0", "1", "2", "3" and "a", "b", "c" in the case of 4-valued data, whereas they are "0", "2", "4", "6" and "b", "d", "f" in the case of 8-valued data.

(First Page Program)

A flowchart for the first page program is the same as that of FIG. 8, except that the definitions of the word line potentials are changed as described above.

(Adjoining Cell Program)

As shown in FIG. 22A, after one bit of data is written into the first page of the memory cell 1, the first page of the memory cell 2 adjoining the memory cell 1 in the word direction is written into. Then, the writing of data into the first page of the memory cell 3 adjoining the memory cell 1 in the bit direction and the writing of data into the first page of the memory cell 4 adjoining the memory cell 1 diagonally are effected in that order. When these write operations have been carried out, the threshold voltage of the memory cell 1 rises due to the FG-FG capacitance, depending on writing data. Accordingly, the threshold voltage distribution of data "0" and that of data "4" in the memory cell 1 expand toward a higher threshold voltage as shown in FIG. 20B.

Thereafter, one bit of data is written into the second page of the memory cell 1 again.

(Second Page Program)

A flowchart for the second page program is the same as that of FIG. 9, except that the definitions of the word line potentials are changed as described above. The data in the data cache after a data load operation and an internal read operation are the same as the data in the data cache after data cache setting. In the second page write operation, the flag cell FC1 is written into to the verify potential "b*'" and the flag cell FC2 is written into to the verify potential "d*'".

(Adjoining Cell Program)

As shown in FIG. 22A, after data is written into the first and second pages of the memory cell 1, data is written into the second page of the memory cell 2, the first page of the memory cell 5, the first page of the memory cell 6, and the second page of the memory cell 3, and the second page of the memory cell 4. When these write operations have been carried out, the threshold voltage of the memory cell 1 rises due to the FG-FG capacitance, depending on writing data. Accordingly, the threshold voltage distributions of data "2", data "4", and data "6" in the memory cell 1 expand as shown in FIG. 21A.

Thereafter, one bit of data is written into the third page of the memory cell 1 again.

(Third Page Program)

Figure 23:
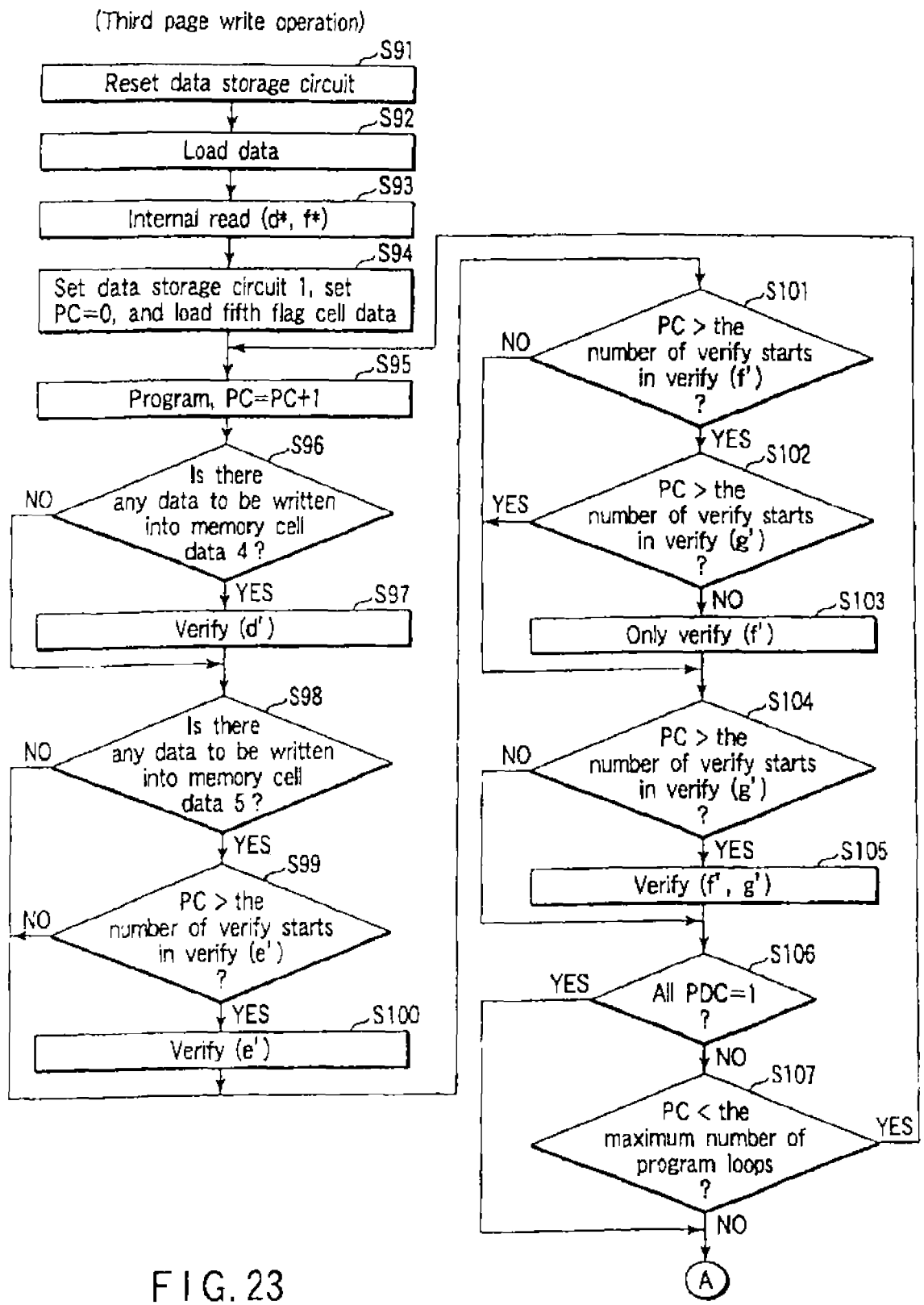
FIG. 23 is a flowchart to explain a third page program in the second embodiment.

FIG. 23 is a flowchart for a third page program operation. In the third page program operation, too, an address is selected first, thereby selecting three pages shown in FIG. 19.

Next, the data storage circuits 10 are reset (S91). Writing data is externally inputted and then is stored in the SDCs in all of the data storage circuits 10 (S92). If data "1" is externally inputted (if no writing is done), the SDC of the data storage circuit 10 of FIG. 6 goes low. If data "0" is externally inputted (if writing is done), the SDC goes high. Thereafter, when a write command is inputted, this means the third page program. Thus, to write data into the flag cells FC3 to FC5, specific data is inputted to the flag cell data storage circuits 10a, 10b.

As shown in FIG. 21B, in the third page program, when the data in the memory cell is "0" and the externally inputted data is "1", the data in the memory cell is kept at "0". When the externally inputted data is "0", the data in the memory cell is set at "1".

When the data in the memory cell is "2" and the externally inputted data is "0", the data in the memory cell is kept at "2". However, in the second page write operation, when it is verified whether the data in the memory cell has reached "2", the verify potential "b*'" lower than the original one is used. For this reason, a memory cell storing data "2" is written into to the potential "b'" or the original verify potential. When the data in the memory cell is "2" and when the externally inputted data is "1", the data in the memory cell is set at "3".

When the data in the memory cell is "4" and the externally inputted data is "1", the data in the memory cell is kept at "4". However, in the second page write operation, when it is verified whether the data in the memory cell has reached "4", the verify potential "d*'" lower than the original one is used. For this reason, a memory cell storing data "4" is written into to the potential "d'" or the original verify potential. When the data in the memory cell is "4" and when the externally inputted data is "0", the data in the memory cell is set at "5".

When the data in the memory cell is "6" and the externally inputted data is "0", the data in the memory cell is kept at "6". However, in the second page write operation, when it is verified whether the data in the memory cell has reached "6", the verify potential "f*'" lower than the original one is used. For this reason, a memory cell storing data "6" is written into to the potential "f'" or the original verify potential. When the data in the memory cell is "6" and when the externally inputted data is "1", the data in the memory cell is set at "7".

In the second page write operation, the flag cell FC1 is written into to the verify potential "b*'" and the flag cell FC2 is written into to the verify potential "d*'". In the third page write operation, the flag cell FC3 is written into to the verify potential "a'", the flag cell FC4 is written into to the verify potential "b'", and the flag cell FC5 is written into to the verify potential "d'".

(Third-Page First-Session Program)

In the third page program, data "1" to "7" are written into the memory cell. Although these data can be programmed simultaneously, four data "4" to "7" are written into the memory cell. Thereafter, data "1" to "3" are written into the memory cell. This will be explained concretely below.

(Internal Data Read 1 and Data Cache Setting 1) (S93, S94)

Before data is written into the memory cell, it is determined whether the data in the second page memory cell is either "4" or "6" or either "0" or "2", whether the data in the memory cell is "6", and whether the data in the memory cell is any one of "0", "2", and "4". To do this, the word line potential is set to "d*'" and "f*'" in that order and an internal read operation is carried out (S93).

FIG. 25A shows the state of the data cache after an internal read operation.

Thereafter, the data cache is operated to set the data cache as shown in FIG. 25B. Then, for example, the counter (PC) is initialized to zero and the data in the fifth flag cell is loaded (S94).

In FIG. 25B, to set the data in the memory cell at "0" to "3", the PDC is set high. To set the data in the memory cell at "4", the PDC is set low, the DDC is set low, and the SDC is set high. To set the data in the memory cell at "5", the PDC is set low, the DDC is set high, and the SDC is set high. To set the data in the memory cell at "6", the PDC is set low, the DDC is set high, and the SDC is set low. To set the data in the memory cell at "7", each of the PDC, DDC, and SDC is set low.

(Program: First Session) (S95)

After the counter (PC) is counted up, data is written into the memory cell. As in the first embodiment, in the second embodiment, unnecessary verify operations are skipped using the value of the counter and a predetermined number of verify starts.

First, when the signal BLC1 is set at Vsg, if the PDC has data "0", the bit line is at Vss. If the PDC has data "1", the bit line is at Vdd. Next, after the signal BLC1 is set at Vss, the signal VREG is set at Vdd and the signal REG is set at the intermediate potential+Vth(1 V+Vth). Then, if the DDC has data "1", the bit line is at the intermediate potential. If the DDC has data "0", the bit line is not precharged. As a result, only when data "4", "7" are written into the memory cell, the bit line is at Vss. When data "5", "6" are written in the memory cell, the bit line is at the intermediate potential (1 V). If the data in the memory cell is "0" to "3" (if no writing is done), the bit line is at Vdd. Here, the selected word line is set at Vpgm and the unselected word line is set at Vpass. If the bit line is at Vdd, no writing is done. If the bit line is at Vss, writing is done. If the bit line is at the intermediate potential (1 V), writing is done a little. Accordingly, a memory cell in which data "5", "6" have been written might be written into insufficiently. However, since data "6" and data "7" are verified simultaneously, the write time ends earlier when they are written as simultaneously as possible. Therefore, the intermediate potential is supplied to the bit line.

(a) Thereafter, the verify voltage "d" is set and a write verify operation is carried out (S96, S97). In this verify operation, when the signal BLC2 is made high and signal BLCLAMP is set to a specific potential, the bit line is precharged. At this time, what is precharged is only a memory cell whose SDC is at the high level, that is, a memory cell in which data "5", "4" have been written.

Next, the verify potential "d" is supplied to the word line, thereby discharging the bit line. While the bit line is being discharged, the signal VREG is set at Vss and the signal REG is set at VDD. If the DDC is at the high level, the bit line is discharged. Therefore, a memory cell whose bit line is precharge is only the one into which data "4" is to be written.

Next, while the bit line is being discharged, the data in the DDC is transferred to the TDC. Thereafter, the data in the PDC is transferred to the DDC and the data in the TDC is transferred to the PDC. Then, the TDC is charged to Vdd. Thereafter, the signal BLCLAMP is set to a specific potential. Then, it is when data "4" has been written in the memory cell and the verify potential "d" has been reached that the TDC goes high.

Next, when the signal VREG is made high and the signal REG is set to Vsg, if the data in the DDC is at the high level, the TDC is forced to go high. Therefore, it is when data "4" has been written in the memory cell and the verify potential "d" has been reached, or when writing is unselected that the TDC goes to Vdd. Then, the signal DTG is set to Vsg and the data in the PDC is copied into the DDC. Thereafter, the signal BLC1 is set to Vsg and the potential of the TDC is loaded into the PDC.

(b) Thereafter, the verify voltage "e'" is set and a write verify operation is carried out (S98, S99, S100).

In this verify operation, the signal VPRE is set high and the signal BLCLAMP is set to a specific potential, thereby precharging the bit line. Next, the verify potential "e'" is supplied to the word line and the bit line is discharged. While the bit line is being discharged, the data in the DDC is transferred to the TDC. Thereafter, the data in the PDC is transferred to the DDC and the data in the TDC is transferred to the PDC. Then, the TDC is charged to Vdd. Thereafter, the signal BLCLAMP is set to a specific potential. Then, it is when the threshold voltage of the cell is equal to or higher than the verify potential "e'" that the TDC goes high. Here, when the signal BALC2 is set at Vth+0.5 V, if the SDC has "0" (when data "6" has bee written in the memory cell or when data "7" has been written in the memory cell), the TDC goes to Vss. Thus, it is when data "5" has been written in the memory cell and the verify potential "e'" has been reached.

Next, when the signal VREG is made high and signal REG is set to Vsg, if the data in the DDC is at the high level, the TDC is forced to go high. Therefore, it is when data "5" has been written in the memory cell and the verify potential "e'" has been reached or when writing is unselected that the TDC goes to Vdd. After the signal DTG is set to Vsg and the data in the PDC is copied into the DDC, the signal BLC1 is set to Vsg and the potential of the TDC is loaded into the PDC.

(c) A verify operation using the verify potential "f'" is the same as a verify operation using the verify potential "b" of the first embodiment. The word line potential in a verify operation is "f'" (S101, S102, S103).

(d) A simultaneous verify operation with the verify potentials "f'", "g'" is the same as a simultaneous verify operation with the verify potentials "b", "c" of the first embodiment. The word line potentials in a verify operation are "f'" and "g'".

In this way, the program and verify operation is repeated until the data in all of the PDCs has become "1" (S106, S107). However, when the data in the DDC is "1" in a write operation, that is, when data "5" has been written in the memory cell or when data "6" has been written in the memory cell, the bit line is set to the intermediate potential and a write operation is carried out. Each time the program and verify operation is repeated, the program voltage Vpgm is raised little by little. In the first program, four data "4" to "7" are written into the memory cell.

In the above explanation, after the first program, four verify operations are carried out. In the initial loop of the program, the threshold voltage does not rise. Thus, only a verify operation using the verify potential "d'" is carried out at first. Next, a verify operation using the verify potential "d'" and the verify potential "e'" is carried out. Then, a verify operation using only the verify potential "d'", the verify potential "e'", and the verify potential "f'" is carried out. Finally, a verify operation using the verify potential "d'" and the verify potential "e'" and a "f', g'" simultaneous verify operation of verifying the verify potential "f'" and the verify potential "g'" at the same time may be carried out.

In a loop close to the end of the program, the writing of data "4" has been completed. Therefore, a verify operation using the verify potential "d'" may be omitted and a verify operation using the verify potential "d'" and the verify potential "e'" may be omitted.

In the first third-page program, the flag cell FC5 is written into to the verify potential "d'".

(Second-Session Program) (S108 to S121)

In a second-session program, three data "1" to "3" are written into the memory cell. A memory cell into which data "1" is to be written has not been written into at all. Therefore, as in the first embodiment, a verify potential "a*'" lower than the original verify potential is provided. The intermediate potential is supplied to the bit line of a cell whose threshold voltage has exceeded the verify potential "a*'". This makes the write speed slower and the threshold value distribution narrower. Since data "2" and data "3" are verified simultaneously, the write time ends earlier when they are written as simultaneously as possible. Therefore, even when data "2" is being written into the memory cell, the intermediate potential is supplied to the bit line, thereby making the write speed slower.

(Internal Data Read 2 and Data Cache Setting 2) (S109, S110)

After the data in the third flag cell has been loaded (S108), before data is written into the memory cell, the word line potential is set to "b*(=a)" and "d*'" in that order and an internal read operation is carried out (S109).

Thereafter, the data cache is operated to set the data cache as shown in FIG. 26 (S110). Specifically, to write data "0" into the memory cell, the PDC is set high, the DDC is set high, and the SDC is set high. To write data "1" into the memory cell, the PDC is set low, the DDC is set low, and the SDC is set high. To write data "2" into the memory cell, the PDC is set low, the DDC is set high, and the SDC is set low. To write data "3" into the memory cell, the PDC is set low, the DDC is set low, and the SDC is set low. To write data "4" to "7" into the memory cell, each PDC is set high.

Here, for example, the counter (PC) is initialized to zero and the data in the fourth flag cell is loaded.

(Program: Second Session) (S111)

Next, for example, after the counter (PC) is counted up, data is written into the memory cell. When the signal BLC1 is set at Vsg first, if the PDC has data "0", the bit line is at Vss. If the PDC has data "1", the bit line is at Vdd. Next, after the signal BLC1 is set at Vss, the signal VREG is set at Vdd and the signal REG is set at the intermediate potential+Vth (1 V+Vth). Then, if the DDC has data "1", the bit line is at the intermediate potential (1 V). If the DDC has data "0", the bit line is not precharged. As a result, when data "3" has been written in the memory cell or when data "1" has been written in the memory cell and the threshold voltage is equal to or lower than the verify potential "a*'" lower than the original verify potential, the bit line is at Vss. When data "2" has been written in the memory cell, when data "1" has been written in the memory cell and the threshold voltage has exceeded the verify potential "a*'" lower than the original potential, or when the bit line is at the intermediate potential (1 V) and the data in the memory cell is "0", "4" to "3" (when no writing is done), the bit line is at Vdd. Here, the selected word line is set at Vpgm and the unselected word line is set at Vpass. If the bit line is at Vdd, no writing is done. If the bit line is at Vss, writing is done. If the bit line is at the intermediate potential (1 V), writing is done a little. Since verify operations in writing data "2" and data "3" into the memory cell are carried out simultaneously, the write time ends earlier when they are written as simultaneously as possible. Therefore, the intermediate potential is supplied to the bit line.

(e) A verify operation using the verify potentials "a', a*'" is the same as a verify operation using the verify potentials "a', a*'" in the first embodiment (S112, S113, S114).

(f) A verify operation using only the verify potential "b'" is the same as a verify operation using only the verify potential "b'" in the first embodiment (S115, S116, S117).

(g) A simultaneous verify operation using the verify potentials "b'", "c'" is the same as a simultaneous verify operation using the verify potentials "b", "c" (S118, S119).

When the PDC is at the low level, the write operation is carried out again. The program and verify operation is repeated until the data in the PDCs of all of the data storage circuits has become high (S120 to S121).

In the above explanation, after the first-session program, three verify operations are carried out. In the initial loop of the program, the threshold voltage does not rise. Thus, only a verify operation using the verify potentials "a', a*'" is carried out at first. Next, a verify operation using the verify potentials "a', a*'" is carried out. Then, a verify operation using the verify potential "b'" is carried out. Finally, a verify operation using the verify potentials "a', a*'" and a simultaneous verify operation using the verify potentials "b'", "c'" may be carried out.

In a loop close to the end of the program, since the writing of data "1" has been completed, these verify operations may be omitted. If data "1" need not be verified, the SDC does not have to hold the data. Therefore, data for next writing may be read from the outside and stored in the SDC. With such a configuration, a still higher speed operation is possible.

In the third-page second program, the flag cell FC3 is written into to the verify potential "a'" and the flag cell FC4 is written into to the verify potential "b'".

(First Page Read)

Figure 27A:
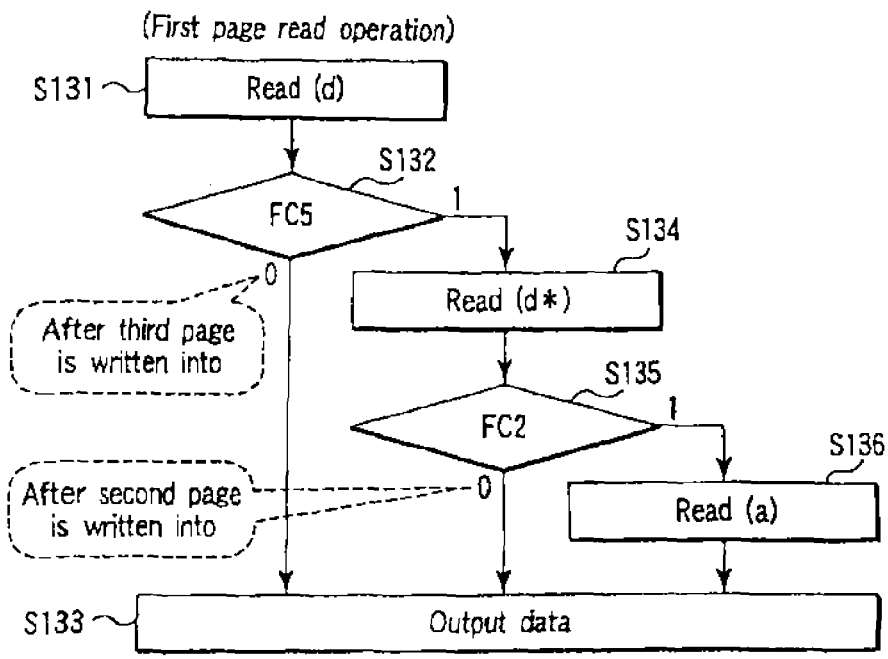
FIGS. 27A and 27B are flowcharts to explain a first page read operation and a second page read operation, respectively.

FIG. 27A is a flowchart for a first page read operation.

First, an address is specified, thereby selecting three pages shown in FIG. 19. As shown in FIGS. 20A, 20B, and 20C and FIGS. 21A and 21B, the distribution of threshold voltage differs before and after the second page is written into and before and after the third page is written into. Therefore, the potential of the word line is set to "d" first and a read operation is carried out (S131). Thereafter, it is determined from the data in the flag cell FC5 whether the third page has been written into (S132). In the determination, if there are a plurality of flag cells, it is decided by the majority of the flag cells.

If the data read from the flag cell FC5 is "0", this means that the third page has been written into. Since the threshold value distribution is as shown in FIG. 21B, the result of reading the potentials on the word lines with "d" has already been read into the data storage circuits 10. Thus, these data are outputted to the outside world (S133).

On the other hand, when the data read from the flag cell FC5 is "1", this means that the third page has not been written into. Therefore, the word line potential is set to "d*" and a read operation is carried out (S134). It is determined from the data in the flag cell FC2 whether the second page has been written into (S135). In the determination, if there are a plurality of flag cells, it is decided by the majority of the flag cells.

If the data read from the flag cell FC2 is "0", this means that the second page has been written into. Since the threshold value distribution is as shown in FIG. 20C, the result of reading the potentials on the word lines with "d*" has already been read into the data storage circuits 10. Thus, these data are outputted to the outside world (S133).

On the other hand, when the data read from the flag cell FC2 is "1", this means that the second page has not been written into. Therefore, the word line potential is set to "a" and a read operation is carried out and the read-out result is outputted to the outside world (S136).

(Second Page Read)

Figure 27B:
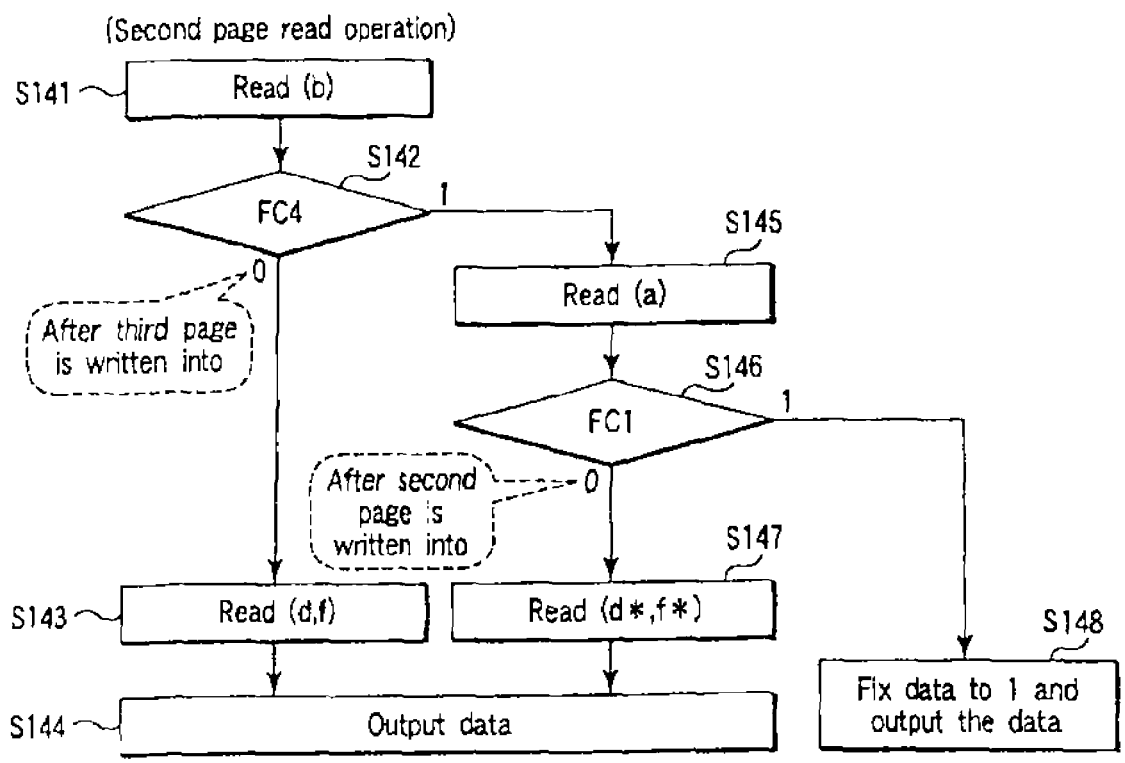

FIG. 27B is a flowchart for a second page read operation.

First, an address is specified, thereby selecting three pages shown in FIG. 19. As shown in FIGS. 20A to 20C and FIGS. 21A and 21B, the distribution of threshold voltage differs before and after the second page is written into and before and after the third page is written into. Therefore, the potential of the word line is set to "b" first and a read operation is carried out (S141). Thereafter, it is determined from the data in the flag cell FC4 whether the third page has been written into (S142). In the determination, if there are a plurality of flag cells, it is decided by the majority of the flag cells.

If the data read from the flag cell FC4 is "0", this means that the third page has been written into. Since the threshold value distribution is as shown in FIG. 21B, it is necessary to read the data from the memory cell with the word line potentials "b", "d", "f". However, the result of reading the word line potential "b" has already been read into the data storage circuit. Thus, the data is read with the word line potentials "d", "f" and then is outputted (S143, S144). The reading with the word line potentials "d", "f" is the same as a "b, c" simultaneous read operation in the first embodiment.

On the other hand, when the data read from the flag cell FC4 is "1", this means that the third page has not been written into. Therefore, the word line potential is set to "a" and a read operation is carried out (S145). It is determined from the data read from the flag cell FC1 whether the second page has been written into (S146). In the determination, if there are a plurality of flag cells, it is decided by the majority of the flag cells.

If the data read from the flag cell FC1 is "0", this means that the second page has been written into. Since the threshold value distribution is as shown in FIG. 20C, it is necessary to read data with the word line potentials "b*'", "d*'", "f*'". However, the result of reading the word line potential "b*'" has already been read into the data storage circuit 10. Thus, the data is read with the word line potentials "d*'", "f*'" and is outputted (S144). A read operation with the word line potentials "d*'", "f*'" is the same as a "b, c" simultaneous read operation in the first embodiment.

On the other hand, when the data read from the flag cell FC1 is "1", this means that the second page has not been written into. Therefore, data is fixed to "1" and is outputted to the outside world (S148).

(Third Page Read)

Figure 28:
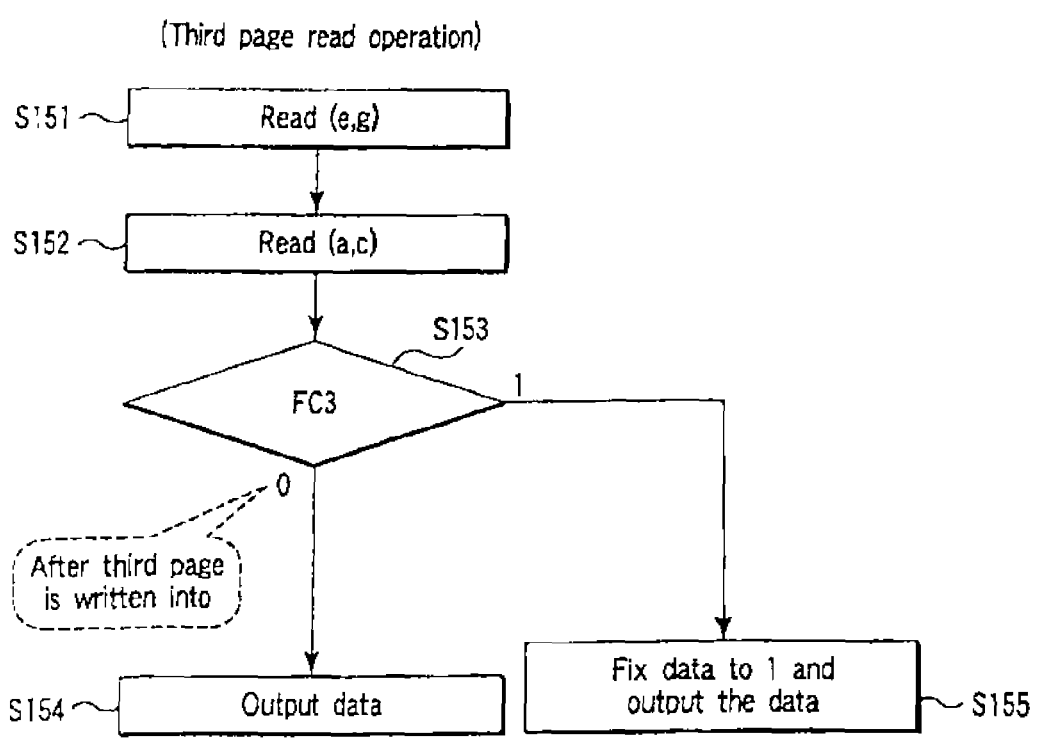
FIG. 28 is a flowchart to explain a third page read operation.

FIG. 28 is a flowchart for a second page read operation.

First, an address is specified, thereby selecting three pages shown in FIG. 19. As shown in FIGS. 20A, 20B, and 20C and FIGS. 21A and 21B, the distribution of threshold voltage differs before and after the second page is written into and before and after the third page is written into. Therefore, a read operation is carried out with the word line potentials "e, g" (S151). Then, a read operation is carried out with the word line potentials "a, c" (S152). Thereafter, it is determined from the data read from the flag cell FC3 whether the third page has been written into (S153). In the determination, if there are a plurality of flag cells, it is decided by the majority of the flag cells. A read operation with the word line potentials "e, g" and a read operation with the word line potentials "a, c" are the same as in the first embodiment.

If the data read from the flag cell FC3 is "0", this means that the third page has been written into. The threshold value distribution is as shown in FIG. 21B. Thus, the data read into the data storage circuit with the word line potentials "e, g" and the word line potentials "a, c" is outputted (S154). If the data read from the flag cell FC3 is "1", this means that the third page has not been written into. Therefore, data is fixed to "1" and is outputted to the outside world (S155).

(Erase)

Since an erase operation is carried out in the same manner as in the first embodiment, its explanation will be omitted.

With the second embodiment, 8-valued (3 bits of) data can be written and read reliably at high speed. Moreover, in a third page write operation, with the bit line being precharged, a plurality of threshold voltages are verified simultaneously by changing the potentials of the word line. This enables a third page program verify operation to be made faster.

In the 8-valued (3-bit) NAND flash memory of the second embodiment, when the third page is written into, data "4" to "7" are written in the first write operation and data "1" to "3" are written. However, this invention is not limited to this. For instance, data "2", "4", "6" may be written first and then data "1", "3", "5", "7" may be written.

Even when the data items are written in such a manner, the same effect as in the first embodiment can be produced.

Third Embodiment

In the second embodiment, the flag cells FC1 to FC5 have written into as follows. When the second page is written into, the flag cell FC1 is written into to the verify potential "b*'" and the flag cell FC2 is written into to the verify potential "d*'". When the third page is written into, the flag cell FC3 is written into to the verify potential "a'", the flag cell FC4 is written into to the verify potential "b'", and the flag cell FC5 is written into to the verify potential "d'". For this reason, the second embodiment uses five flag cells. However, the flag cell FC1 can be substituted for the flag cell FC4 and the flag cell FC2 can be substituted for the flag cell FC5. Therefore, the circuit shown in FIG. 19 can be composed of three flag data storage circuits and three flag cells FC1, FC2, and FC3.

In the above configuration, the first and second page write operations are the same as in the second embodiment. The third page write operation differs a little from that in the second embodiment.

Figure 29:
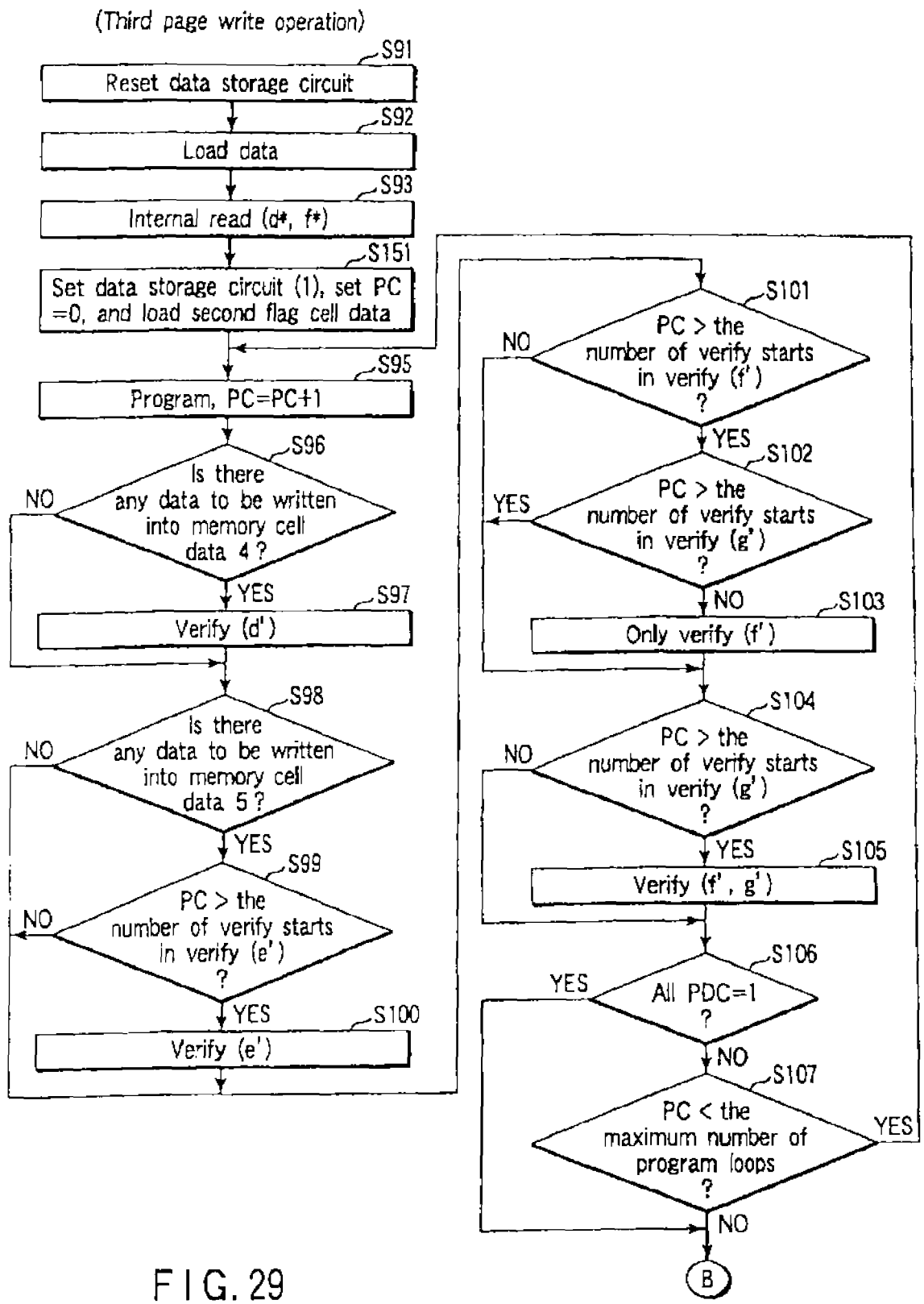
FIG. 29 is a flowchart to explain a third page write operation according to a third embodiment of the present invention.
Figure 30:
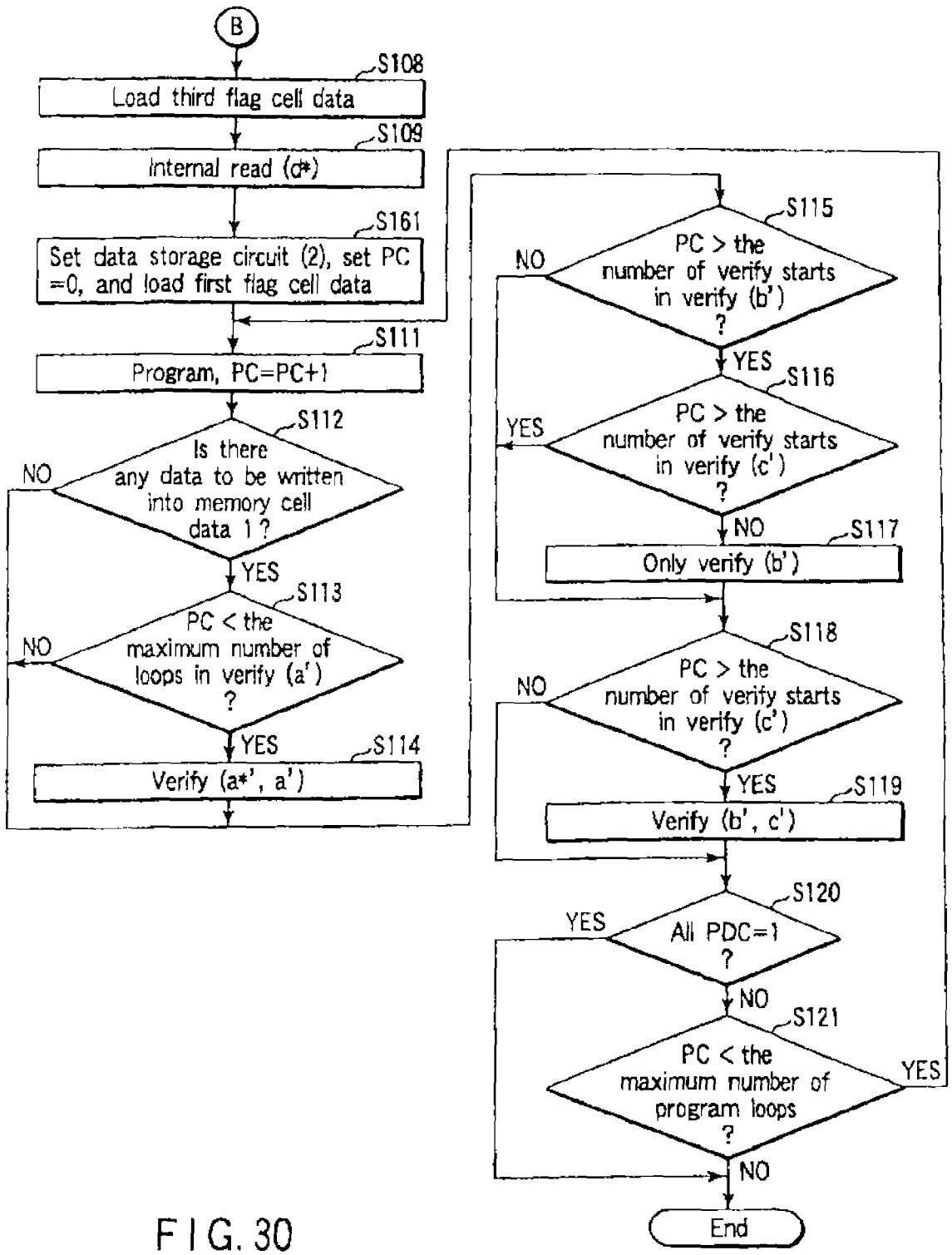
FIG. 30 is a flowchart to explain the third page write operation following FIG. 29.

FIGS. 29 and 30 show the third page write operation. In a third-page first write operation of FIG. 29, what differs from FIG. 23 is the way of loading the flag cell data after the internal read (S93). In the second embodiment, data is loaded into the fifth flag cell FC5 (S94). In contrast, in the third embodiment, after the internal read operation (S93), data is loaded into the flag cell FC2 (S151).

Figure 24:
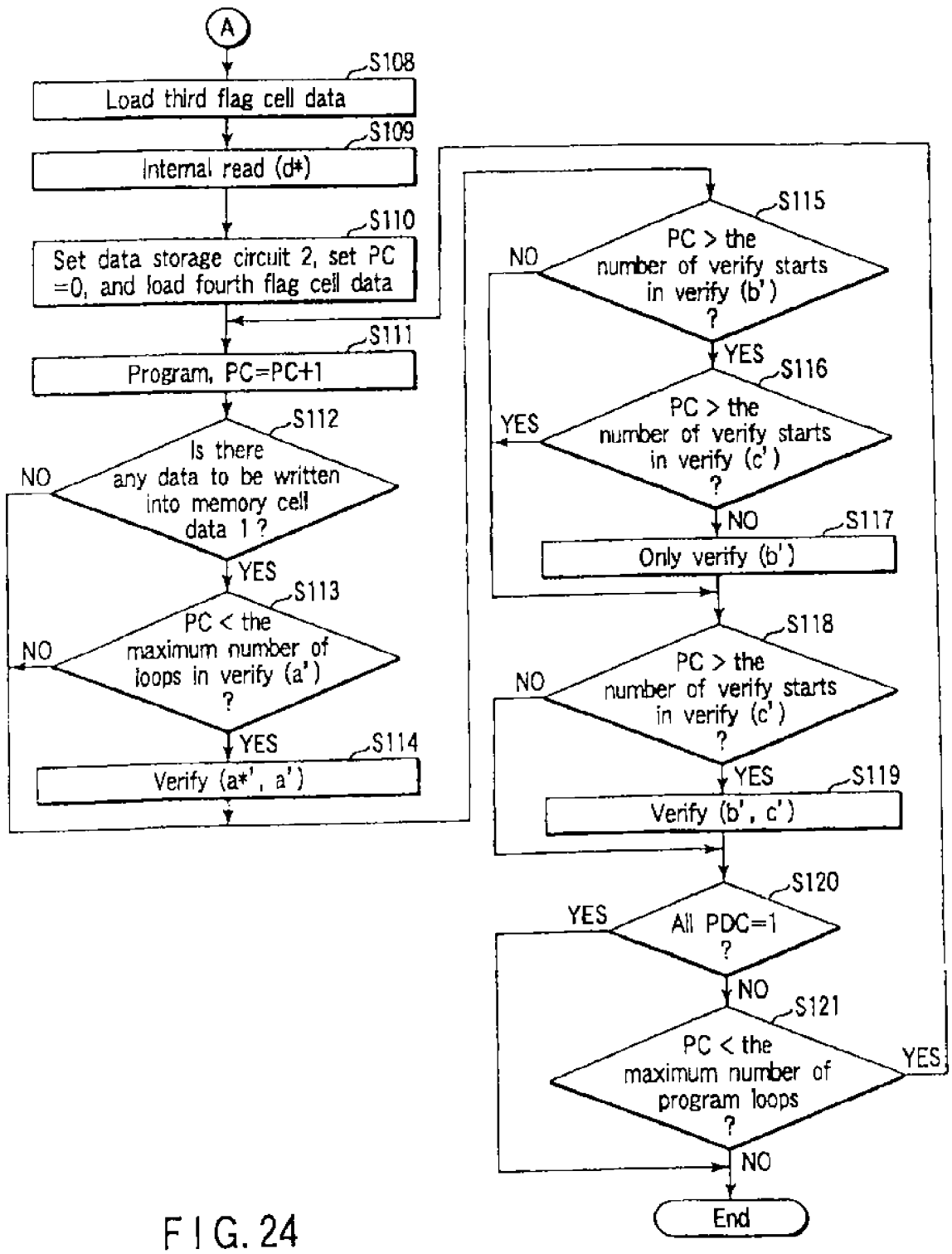
FIG. 24 is a flowchart to explain the third page program following FIG. 23.

In a third-page second write operation of FIG. 29, what differs from FIG. 24 is the way of loading the flag cell data after the internal read operation (S109). In the second embodiment, data is loaded into the fourth flag cell FC4 (S110). In contrast, in the third embodiment, after the internal read operation (S93), data is loaded into the flag cell FC1 (S161).

As described above, when the second page is written into, the flag cell FC1 is written into to the verify potential "b*'" and the flag cell FC2 is written into to the verify potential "d*'". Next, in the write operations shown in FIGS. 29 and 30, when the third page is written into, the flag cell FC3 is written into to the verify potential "a'". The flag cell FC1 written into to the verify potential "b*'" in the second page write operation is written into to the verify potential "b'" in the third page write operation. The flag cell FC2 written into to the verify potential "d*'" in the second page write operation is written into to the verify potential "d'" in the third page write operation.

Figure 31A:
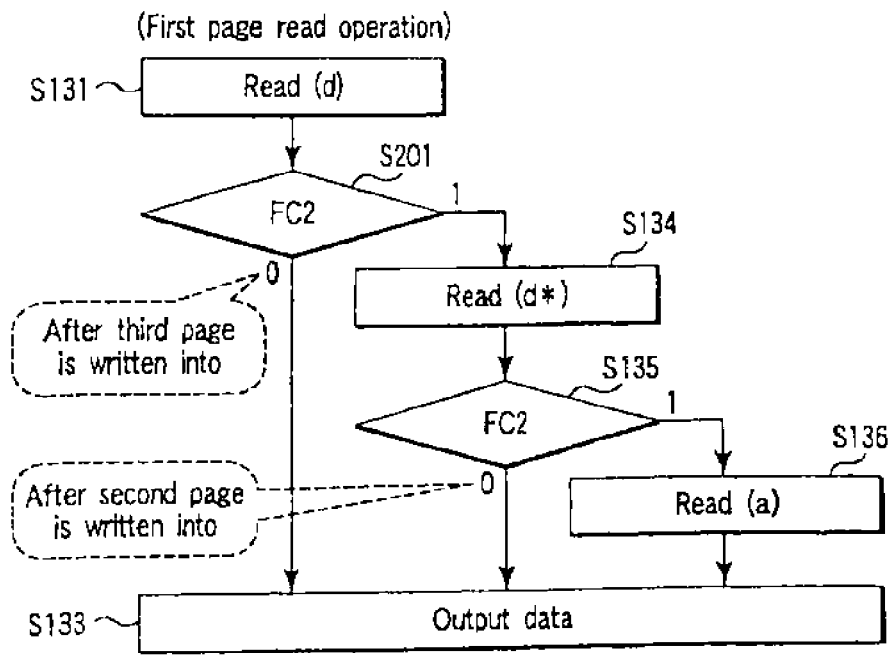
FIGS. 31A and 31B are flowcharts to explain a first page read operation and a second page read operation, respectively.
Figure 31B:
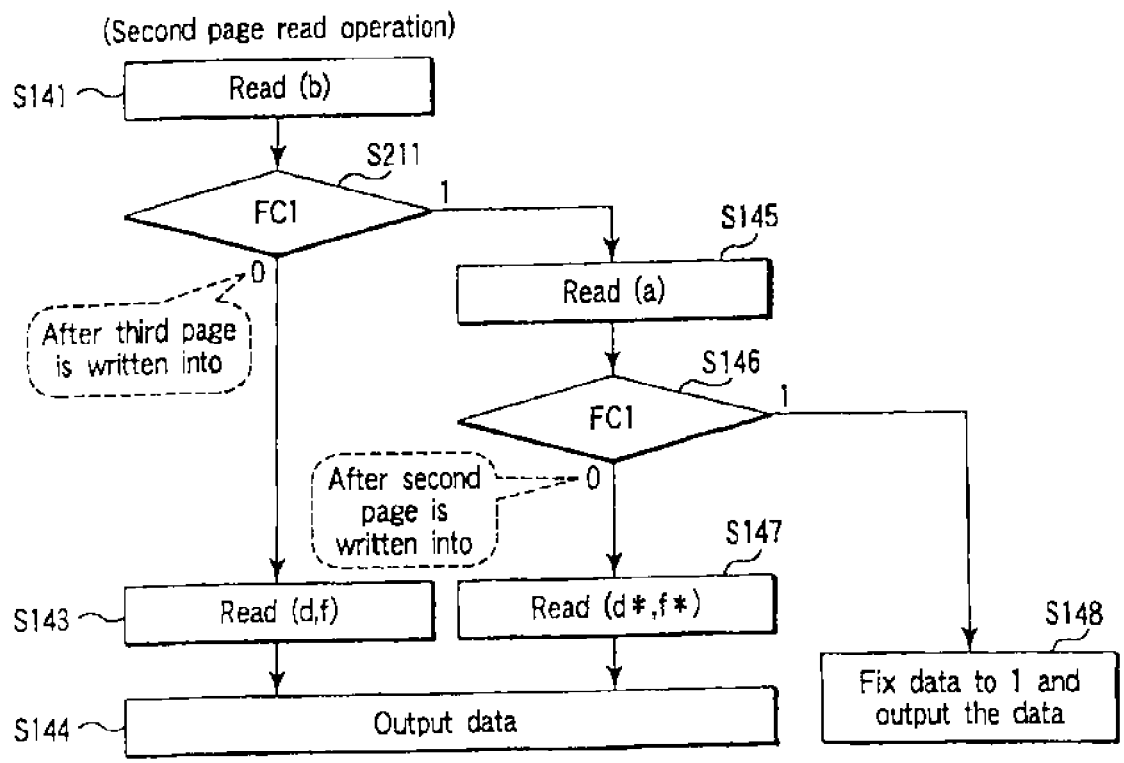

FIG. 31A shows a first page reading algorithm and FIG. 31B shows a second page reading algorithm.

In FIG. 31A, what differs from FIG. 27A is the determination after a read operation is carried out with the potential "d" (S131). In the second embodiment, this determination is made on the basis of the data read from the flag cell FC5 (S132). In contrast, in the third embodiment, the determination is made on the basis of the data read from the flag cell FC2 (S201). The remaining operation is the same as in FIG. 27A.

In FIG. 31B, what differs from FIG. 27B is the determination after a read operation is carried out with the potential "b" (S141). In the second embodiment, this determination is made on the basis of the data read from the flag cell FC4 (S142). In contrast, in the third embodiment, the determination is made on the basis of the data read from the flag cell FC2 (S211). The remaining operation is the same as in FIG. 27B.

A third page reading algorithm is the same as that of the second embodiment shown in FIG. 28.

With the third embodiment, use of three flag data storage circuits and three flag cells enables a program verify operation to be made faster as in the second embodiment. Since the number of flag data storage circuits and flag cells can be reduced, the third embodiment has the advantage of decreasing the area occupied by the chip.

In the second page write operation in the first embodiment, and in the third page write operation in the second and third embodiments, when data "1" is written into the memory cell, the SDC becomes empty. Therefore, it is possible to supply the data to be written next to the SDC. Storing the data to be written next in the SDC beforehand makes the write speed much faster.

Furthermore, the following configuration is possible: when the SDC becomes empty, the program operation is stopped temporarily, the data is read from the memory cell on another page, the result of the reading is stored in the SDC, and the stopped program operation is started again, while the SDC is outputting the stored data to the outside world.

The number of flag cells and their arrangement are not limited to the first to third embodiments.

FIG. 32 shows an example of arranging a plurality of flag cells. In the example, to increase reliability, a plurality of first and second flag cells and dummy cells are provided at one end of the memory cell array. Specifically, four first flag cells and three second flag cells are arranged for even-numbered pages (BLE) and four first flag cells and three second flag cells are arranged for odd-numbered pages (BLO). On both sides of the even-numbered and odd-numbered second flag cells, an even-numbered dummy cell and an odd-numbered dummy cell are provided.

With this configuration, in a read operation, by the majority decision of the four first flag cells for even-numbered pages and by the majority decision of the three second cells for even-numbered pages, it is determined whether the second page of an even-numbered page has been written into. In addition, by the majority decision of the four first flag cells for odd-numbered pages and by the majority decision of the three second cells for odd-numbered pages, it is determined whether the second page of an odd-numbered page has been written into. With this configuration, even when the threshold voltage of a cell previously written into is changed by the threshold voltage of an adjoining cell written into later through the FC-FC capacitance of the adjoining cell, it can be determined reliably that the second page has been written into.

Fourth Embodiment

In a nonvolatile semiconductor memory device for storing multivalued data, when the number of bits of data to be stored is large, one threshold value distribution has to be made narrower. To achieve this, the following has been proposed: in a program and verify operation, a write operation is carried out, while the program voltage is increased little by little. When the program voltage has exceeded a verify potential lower than the original verify potential, an intermediate potential is inputted to the bit line, thereby making the write speed in the program operation slower. In this state, writing is done to the original verify potential. However, it is necessary to distinguish a state where a verify potential lower than the original one has been exceeded from a state where the original verify potential has been exceeded. This causes the problem of increasing the number of page buffers.

The operation of the fourth embodiment is almost the same as that of the first embodiment, except for a simultaneous verify operation of data "2" and "3" using the verify potentials "b'" and "c'" in a second page program verify operation. In the first embodiment, a cell to be written into to the threshold voltages "b'" and "c'" is written into to a verify potential lower than the original threshold voltage. When the cell has exceeded this verify potential, the intermediate potential is supplied to its bit line, making the write speed slower, which prevents the width of the distribution of the threshold voltage from getting narrower. As shown in FIG. 33A, a cell to be written into to the threshold voltage "b'" is written into to the level of "v'" in a first page write operation. Thus, the write speed becomes slower. For this reason, such an operation may be unnecessary. A cell to be written into to the threshold voltage "c'" is also written into to the level of "v'" in a first page write operation. There is a difference in level between "v'" and "c'". For this reason, in verifying the threshold voltage "c'", a cell is written into to a verify potential lower than the original threshold voltage. When the cell has exceeded the level, the intermediate potential is supplied to its bit line, making the write speed slower, which narrows the threshold value distribution. To do this, the threshold voltage "c'" is verified with a verify potential "c*'" lower than the original one and with the original verify potential "c'".

FIG. 34 shows a first page write operation according to the fourth embodiment. Since a first write operation shown in S301 to S308 of FIG. 34 and the data in the data cache of FIG. 36 are the same as those in the first embodiment, explanation of them will be omitted.

Figure 35:
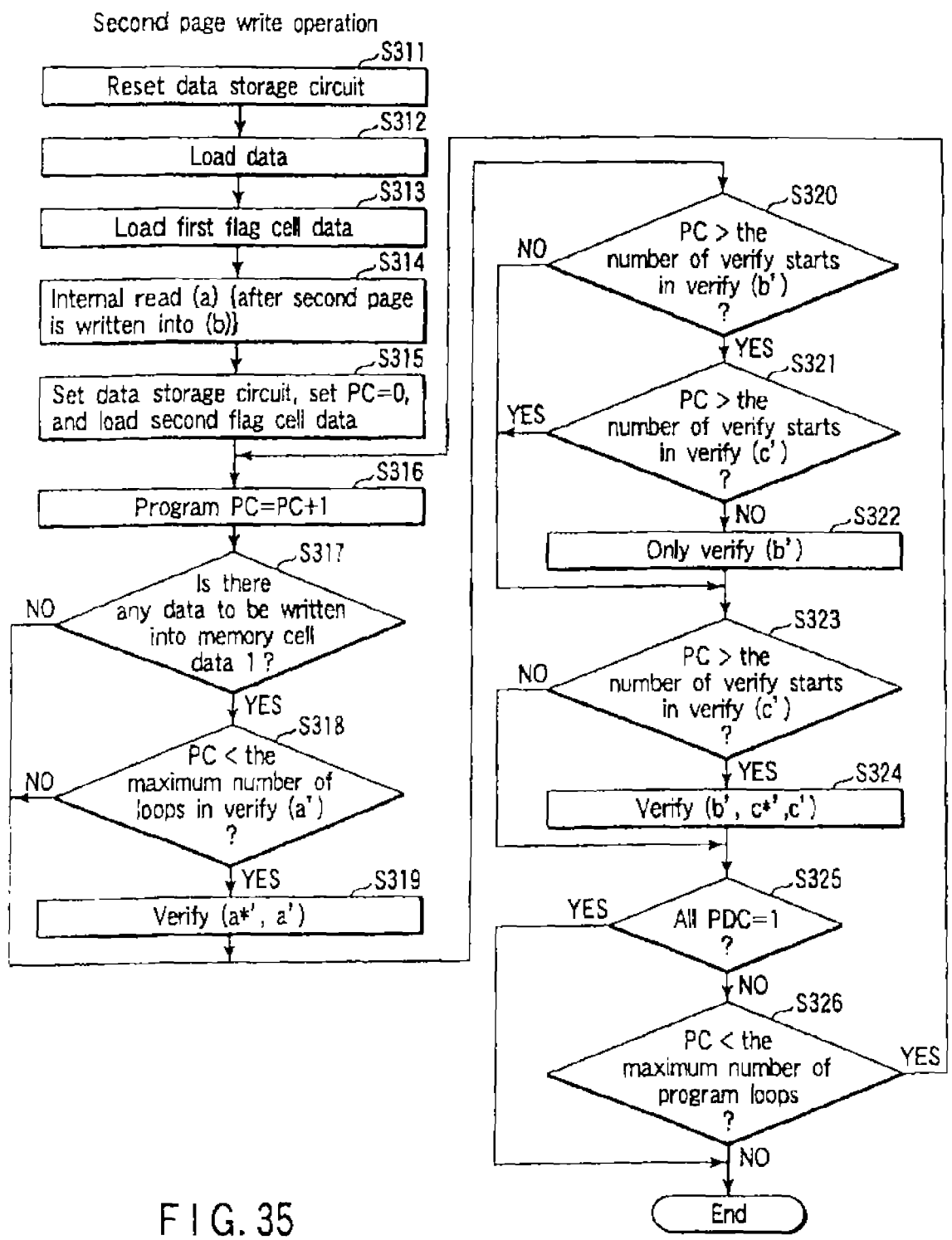
FIG. 35 is a flowchart to explain a second page operation in the fourth embodiment.
Figure 43A:
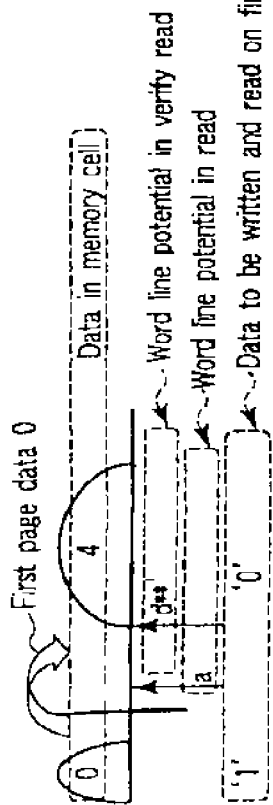
FIGS. 43A, 43B and 43C show the relationship between data in a memory cell and the threshold voltages of the memory cell according to a sixth embodiment of the present invention.
Figure 43B:
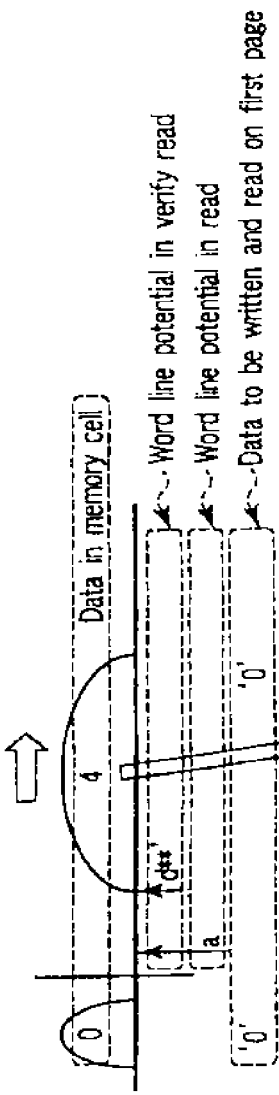
Figure 43C:
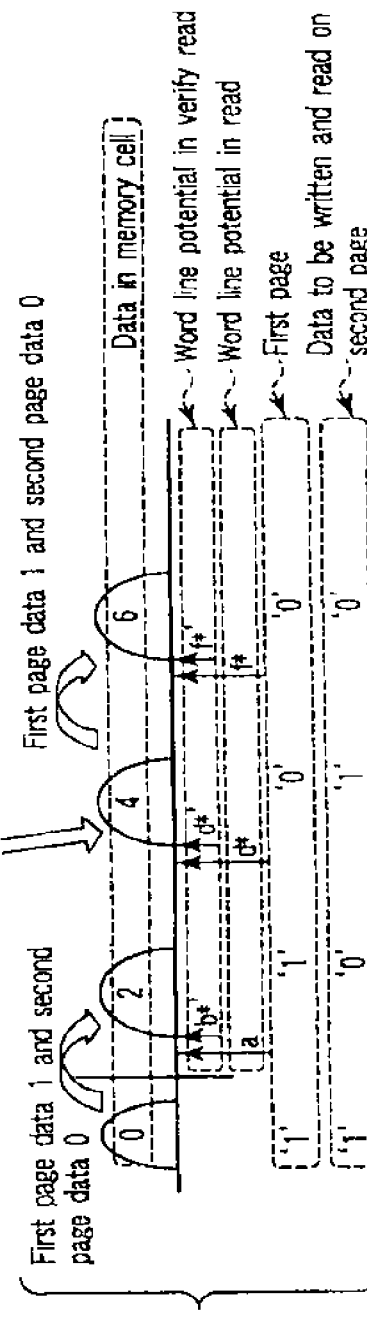

FIG. 35 shows a second page write operation. In a second page write operation, the operations from S311 to S322 are almost the same as those in the first embodiment, expect for a simultaneous verify operation using the verify potentials "b'", "c*'", and "c'".

(Simultaneous Verification Using the Verify Potentials "b'", "c*'", "c'") (FIGS. 37 and 38)

In FIG. 35, when a program and verify operation is repeated a plurality of times, the writing of data into a cell where data "3" is being written into the memory cell is completed. Therefore, instead of the verify operation using the verify potential "b'" (S322), a simultaneous verify operation is carried out using the verify potentials "b'", "c*'", and "c'" (S324). First, the signal BLPRE is set to the high level (Vdd+Vth), the VPRE is set to the high level (Vdd+Vth), and the signal BLCLAMP is set to a specific potential, thereby precharging the bit line.

Next, the verify potential "b'" is supplied to the word line, thereby discharging the bit line. While the bit line is being discharged, the data in the DDC is transferred to the TDC. Thereafter, the data in the PDC is transferred to the DDC and the data in the TDC is transferred to the PDC.

Then, after the TDC is charged to Vdd, the signal BLCLAMP is set to the specific potential. Then, it is when the threshold voltage is equal to or higher than the verify potential "b'" that the TDC goes high ("1"). Here, when the signal BLC1 is at an intermediate potential, such as Vth+0.5 V, if the PDC has "0" (is at the low level) (when data "3" has been written in the memory cell or when data "1" has been written in the memory cell and the threshold voltage is equal to or lower than the verify potential "a*'"), the TDC goes to Vss. Therefore, it is when data "2" has been written in the memory cell and the verify potential "b'" has been reached that the TDC goes to Vdd. Next, when the signal VREG is set high (e.g., to Vdd) and the signal REG is set to Vsg (e.g., Vdd+Vth), if the data in the DDC is at the high level, the TDC is forced to go high. Therefore, it is when data "2" has been written in the memory cell and the verify potential "b'" has been reached or when writing is unselected that the TDC goes to Vdd. After the signal DTG is set to Vsg and the data in the PDC is copied into the DDC, the signal BLC1 is set to Vsg and the potential of the TDC is loaded into the PDC.

Next, the verify potential "c*'" is supplied to the word line and the bit line is discharged.

Then, after the TDC is charged to Vdd, the signal BLCLAMP is set to a specific potential. It is when data "3" has been written in the memory cell and the verify potential "c*'" has been reached that the TDC goes to Vdd. Next, when the signal VREG is made high and the signal REG is set to Vsg, if the data in the DDC is at the high level, the TDC is forced to go high. Therefore, it is when data "3" has been written in the memory cell and the verify potential "c*'" has been reached, when data "2" has been written in the memory cell, or when data "1" has been written in the memory cell and the threshold voltage is equal to or higher than the verify potential "a*'" that the TDC goes to Vdd. After the signal DTG is set to Vsg and the data in the PDC is copied into the DDC, the signal BLC1 is set to Vdd+Vth and the potential of the TDC is loaded into the PDC.

Next, the verify potential "c'" is supplied to the word line and the bit line is discharged.

Then, after the TDC is charged to Vdd, the signal BLCLAMP is set to a specific potential. It is when data "3" has been written in the memory cell and the verify potential "c'" has been reached that the TDC goes to Vdd. Next, when the signal VREG is made high and the signal REG is set to Vsg, if the data in the DDC is at the high level, the TDC is forced to go high. Therefore, it is when data "3" has been written in the memory cell and the verify potential "c'" has been reached or when writing is unselected that the TDC goes to Vdd. After the signal DTG is set to Vsg and the data in the PDC is copied into the DDC, the signal BLC1 is set to Vsg and the potential of the TDC is loaded into the PDC.

As a result of these operations, when data "3" has been written in the memory cell, the verify potential "c*'" has been exceeded, and the write operation has not been completed with the original verify potential, the DDC is at the high level, the PDC is at the low level, and the SDC is at the low level. This state is the same as when data "2" has been written in the memory cell. For this reason, in the next program, since the DDC is at the high level, the bit line is at the intermediate potential (e.g., 1 V), with the result that writing is done.

Thereafter, in a simultaneous verify operation with the verify potentials "b'", "c*'", "c'", since the threshold voltage is equal to or higher than "c*'" in verifying the threshold voltage "b'", this verify operation is skipped and the PDC goes high. Thus, when data "3" has been written in the memory cell and the verify potential "c*'" has been exceeded, the bit line is set to the intermediate potential only once and writing is done.

In this way, the program and verify operation is repeated until the data in all of the PDCs has become "1". However, when the data in the DDC is "1" in a write operation, that is, when data "2" has been written in the memory cell, when data "3" has been written in the memory cell and the verify potential "c*'" has been exceeded (this is the same as when data "2" has been written in the memory cell), or when data "1" has been written in the memory cell and the verify potential "a*'" has been exceeded, the bit line is set to the intermediate potential and a write operation is carried out.

Each time the program and verify operation is repeated, the program voltage Vpgm is raised little by little. An increment ΔVpgm in the program voltage Vpgm differs between the first page write operation and the second page write operation. For example, an increment ΔVpgm in the first page write operation is set larger than an increment ΔVpgm in the second page write operation.

In the flowchart of FIG. 35, after program and verify "a*, a'" (S316, S319) is repeated several times, program and verify "a*', a'" and program verify "b'" are repeated several times, and program and verify "a*', a'" and program verify "b', c'" are repeated several times. In the middle of repeating the operations, the writing of data "1" into the memory cell is completed earlier. Therefore, when the cells into which data "1" is to be written have run out, program verify "a*', a'" is skipped (S318 to S320) and program and program verify "b'" (S316, S322) or program and program verify "b', c*', c'" (S316 to S326) is repeated. When program and verify "a*', a'" (S316, S319) is skipped, the SDC is not used. Therefore, the next program data can be inputted. However, there may be a cell where data "1" is difficult to write into the memory cell. Therefore, the number of times of program verify "a*, a'" is limited.

(Read Operation)

A read operation is the same as in the first embodiment.

(Erase)

In an erase operation, an address is specified first, thereby selecting a block shown by a broken line in FIG. 3 as described earlier. Next, the potential of a well where the cell is formed is raised to a high voltage (about 20 V), the word line of the selected block is set to Vss, and the word lines of the unselected blocks are made floating. Then, a high voltage is applied between the cell of the selected block and the well, which erases the data stored in the cell. On the other hand, in the unselected blocks, since the word lines are in the floating state, when the well is raised to a high voltage, the word lines are also raised to a high voltage. As a result, the data stored in the memory cells in the unselected blocks are not erased.

After an erase operation, the data in the memory cell becomes "0". Even if either the first or the second page read operation is carried out, data "1" is outputted.

(Write after Erase)

FIG. 33E shows an example of the threshold voltages after an erase operation. As described above, since the data in a plurality of memory cells in a block is erased simultaneously, there may be a case where even a voltage lower than the threshold voltage shown in FIG. 33A has been erased. When there is a memory cell where even a voltage lower than the original threshold voltage has been erased, the threshold voltage varying range becomes larger in writing data "1" into the memory cell having data "0" in an upper page (e.g., second page) program. As a result, the threshold voltage of the adjoining cells varies as a result of the coupling between their floating gates.

To prevent the threshold voltage of the adjoining cells from varying, slight writing is done after an erase operation as shown in FIG. 33F, thereby returning the threshold voltage of the cell where even a voltage lower than the original threshold voltage has been erased to the original threshold voltage.

In a write after erase operation, the PDCs of all of the data storage circuits are set to the low level. Thereafter, the cells connected to two bit lines BLE and BLO connected to a data storage circuit are written into simultaneously. In a write verify operation, one of the two bit lines is written into at a time. Since it takes time to verify all of the cells in the block, all of the word lines are set to the same potential and one NAND cell is verified simultaneously. When a write after erase operation has been completed on one of the bits lines, the PDC is made high, preventing the next program from being executed. Similarly, a verify operation is carried out on the other bit line. The write and verify operation is repeated until the data in all of the data storage circuits has become high.

With the fourth embodiment, in the middle of the second page write verify operation, the word line potential is changed in the order of threshold voltages "b', c*', c'" in charging the bit line once, thereby verifying the threshold voltages "b', c*', c'" simultaneously. This enables a high-speed verify operation, which makes a high-speed write operation possible.

In addition, while data "3" is being written into the memory cell, when a verify potential a little lower than the original verify potential has been exceeded, an intermediate potential is applied to the bit line and the writing is done. This makes it possible to narrow the distribution of threshold voltages written in the memory cell. Therefore, the step-up width of the write voltage can be made greater, which enables the overall write time to be shortened and therefore a write operation to be carried out at higher speed.

Specifically, in a write operation, when it is verified whether the memory cell has reached the threshold voltage of data "3", the verify operation is carried out using a verify potential "c*'" lower than the original verify potential "c'". If the lower verify potential "c*'" has been exceeded and the write operation has not been completed with the original verify potential "c'", the DDC, PDC, SDC in the data storage circuit have the data in writing data "2". Therefore, in the next write operation, the intermediate potential is supplied to the bit line, thereby making the write speed slower. Thereafter, since the memory skips a verify operation in verifying data "2", the writing of the cell is completed. Therefore, the distribution of threshold voltages written in the memory cell can be made narrower.

Moreover, since a data storage circuit for distinguishing between a memory cell where a verify potential lower than the original verify potential has been exceeded and a memory cell where the original verify potential has been exceeded is not needed, an increase in the circuit configuration can be prevented.

Fifth Embodiment

In the fourth embodiment, the second page has been written into as follows. As for the cells into which data "3"

is to be written, an intermediate potential is supplied to a cell where a verify potential "c*'" lower than the original verify potential "c'" is exceeded and writing is done once. Then, the write operation is completed. As for the cells into which data "1" is to be written, the intermediate potential is supplied to a cell where a verify potential "a*'" lower than the original verify potential "a'" is exceeded. Then, the write operation is repeated until the original verify potential "a'" has been reached. Therefore, the operation differs a little, depending on the data to be written.

In contrast, in a fifth embodiment of the present invention, a cell into which data "1" is to be written is written into in the same manner as a cell into which data "3" is to be written. Specifically, the intermediate potential is supplied to a cell where a verify potential "a*'" lower than the original verify potential "a'" is exceeded and writing is done once. Then, the write operation is completed. In addition, when the first page is written into, the intermediate potential is supplied to a cell where a verify potential "v*'" lower than the original verify potential "v'" is exceeded and writing is done once. Then, the write operation is completed.

Hereinafter, these operations will be explained concretely by reference to FIGS. 39 to 43.

(First Page Write Operation)

First, a first page write operation will be explained. A first page program operation and a program verify operation are the same as in the modification of the first embodiment of FIG. 8. However, as shown in FIG. 39A, in a program verify operation, "1" is set in the DDC of a cell where the verify potential "v*'" lower than the original verify potential "v'" is exceeded. In the next program, if the PDC has "0" and the DDC has "1", the intermediate potential (e.g. 1 V) is supplied to the bit line and writing is done.

Since the TDC is composed of a capacitor, the data in the DDC is transferred to the TDC, the data in the PDC is transferred to the DDC, and the data in the TDC is transferred to the PDC in the write recovery operation as shown in FIG. 39B (after data refresh 1).

Furthermore, as shown in FIG. 39C (after data refresh 2), the data in the DDC is transferred to the TDC, the data in the PDC is transferred to the DDC, and the data in the TDC is transferred to the PDC, thereby refreshing the data in the DDC. However, in the operation of FIG. 39C, when the data in the DDC is transferred to the TDC, if the data in the DDC (1: writing unselected, 0: writing) is transferred without resetting the value in the TDC (verify potential "a*'" is exceeded->1) shown in FIG. 39B, the TDC has "1" even when the verify potential "a*'" is exceeded. Thus, the PDC indicates that writing is unselected. Accordingly, when the verify potential "a*'" is exceeded, the intermediate potential is supplied to the bit line only once and is then programmed.

(Second Page Write Operation)

In a second page write operation, the intermediate potential is supplied to a cell where a verify potential "a*'" lower than original verify potential "a'". Then, writing is done only once and the write operation is completed.

A program verify operation is the same as in FIG. 35. In a program verify operation, as shown in FIG. 40, the DDC is set to "1" in a cell where a verify potential "a*'" lower than the original verify potential "a'" is exceeded. When the PDC has "0" and the DDC has "1" in the next program, the intermediate potential is supplied to the bit line and writing is done. Thus, after the intermediate potential is supplied to the bit line and writing is done once, the PDC is set to "1". Then, the write operation is completed.

Hereinafter, the operation will be explained concretely.

In the middle of programming, the signal BLCLAMP is made low, thereby disconnecting the PDC and the DDC from the bit line. Since the bit line has a large capacitance, the write operation is continued even when the PDC and DDC are disconnected from the bit line.

Thereafter, the signal BLPRE is made high, the signal VPRE is made high, and the TDC is set to the high level. Furthermore, the signal REG is made high and the signal VREG is made low. If the DDC has "1", the TDC is set to the low level. If the DDC has "0", the TDC is kept at the high level. In this state, the data in the TDC is transferred to the PDC. At the same time, the DTG is set high, causing both the DDC and the PDC to hold the same data as shown in FIG. 41A.

Next, the signal BLC2 is made high, thereby transferring the data in the SDC to the TDC. Then, the signal REG is made high and the signal VREG is set to Vss. In this state, if the DDC has "1", the TDC is forced to go low and then the data in TDC is transferred to the PDC (FIG. 41B).

Thereafter, the signal BLPRE is made high, the signal VPRE is made high, and the TDC is set to the high level. Furthermore, the signal REG is made high and the signal VREG is made low. If the DDC has "1", the TDC is set to the low level. If the DDC has "0", the TDC is kept at the high level. After the signal DTG is set to "1", thereby transferring the data in the PDC to the DDC, the data in the TDC is transferred to the PDC (FIG. 42A).

Next, after the signal BLPRE is made high and the signal VPRE is made high, thereby setting the TDC to the high level, the signal BLCLAMP is set to a specific voltage. Then, if the bit line is at the low level ("0") or the intermediate potential, the TDC is at the low level. If the bit high is at the high level, the TDC is at the high level. Thereafter, the signal VREG is set to Vdd and the signal REG is set high. Then, if the DDC is at the high level, the TDC is forced to go high. Thereafter, the data in the PDC is transferred to the DDC and the data in the TDC to the PDC. The data in the DDC is the originally held data. However, the PDC goes high, if the DDC is at the high level, and the SDC is at the high level, that is, if the verify potential "a*'" lower than the original verify potential "a'" is exceeded, that is, indicates that writing is unselected. Therefore, if the verify potential "a*'" is exceeded, the bit line is set to the intermediate potential only once and programming is done (FIG. 42B).

With the fifth embodiment, in a second page write operation, data can be written by the same writing method into a cell into which data "1" is to be written and a cell into which data "0" is to be written. Specifically, the intermediate potential is supplied to a cell where the verify potential "a*'" lower than the original verify potential "a'" is exceeded and writing is done only once. Then, the write operation is completed. Therefore, a higher-speed write operation can be realized.

Furthermore, in a first page data write operation, too, the intermediate potential is supplied to a cell where the verify potential "v*'" lower than the original verify potential "v'" is exceeded and writing is done only once. Then, the write operation is completed. Therefore, a still higher-speed write operation can be realized.

Sixth Embodiment

Next, a sixth embodiment of the present invention will be explained by reference to FIGS. 43 to 52.

In the sixth embodiment, the configuration of the memory cell array and the arrangement of data storage circuits are the same as those in the second and third embodiments. In the sixth embodiment, 8-valued (3 bits of) data is stored in a memory cell.

The relationship between data to be written and the threshold voltages of a memory cell shown in FIGS. 43A, 43B, 43C and FIGS. 44A and 44B are the same as in FIGS. 20A, 20B, 20C and FIGS. 21A and 21B. In addition, a first page and a second page program operation are almost the same as those in the fourth embodiment. Specifically, in a first page and a second page program operation, when it is verified whether the data in the memory cell has reached the original threshold voltage, the verification is made using a verify potential lower than usual. The sixth embodiment differs from the fourth embodiment in a third page program operation.

(Third Page Program)

Figure 45:
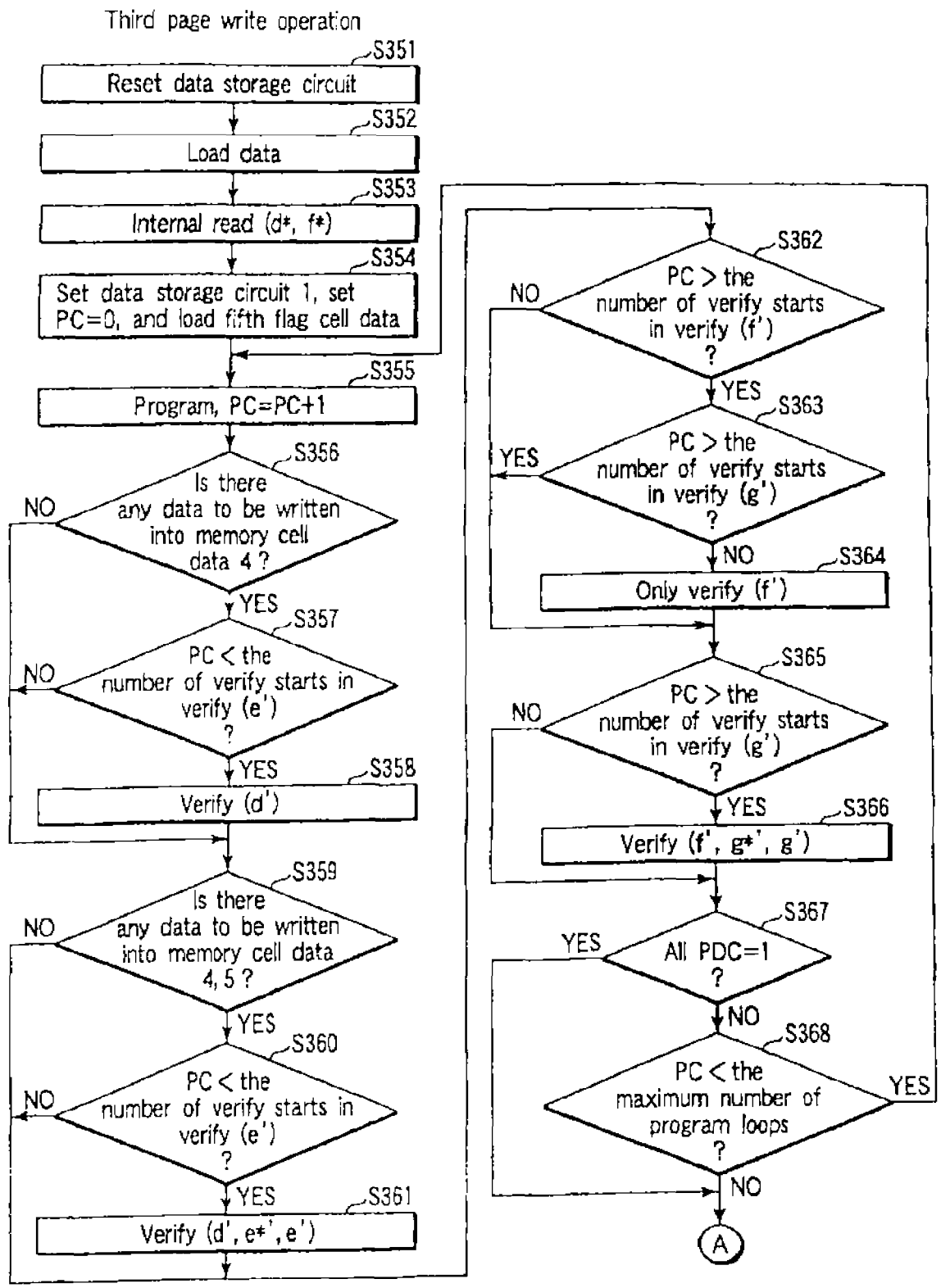
FIG. 45 is a flowchart to explain a third page write operation in the sixth embodiment.
Figure 46:
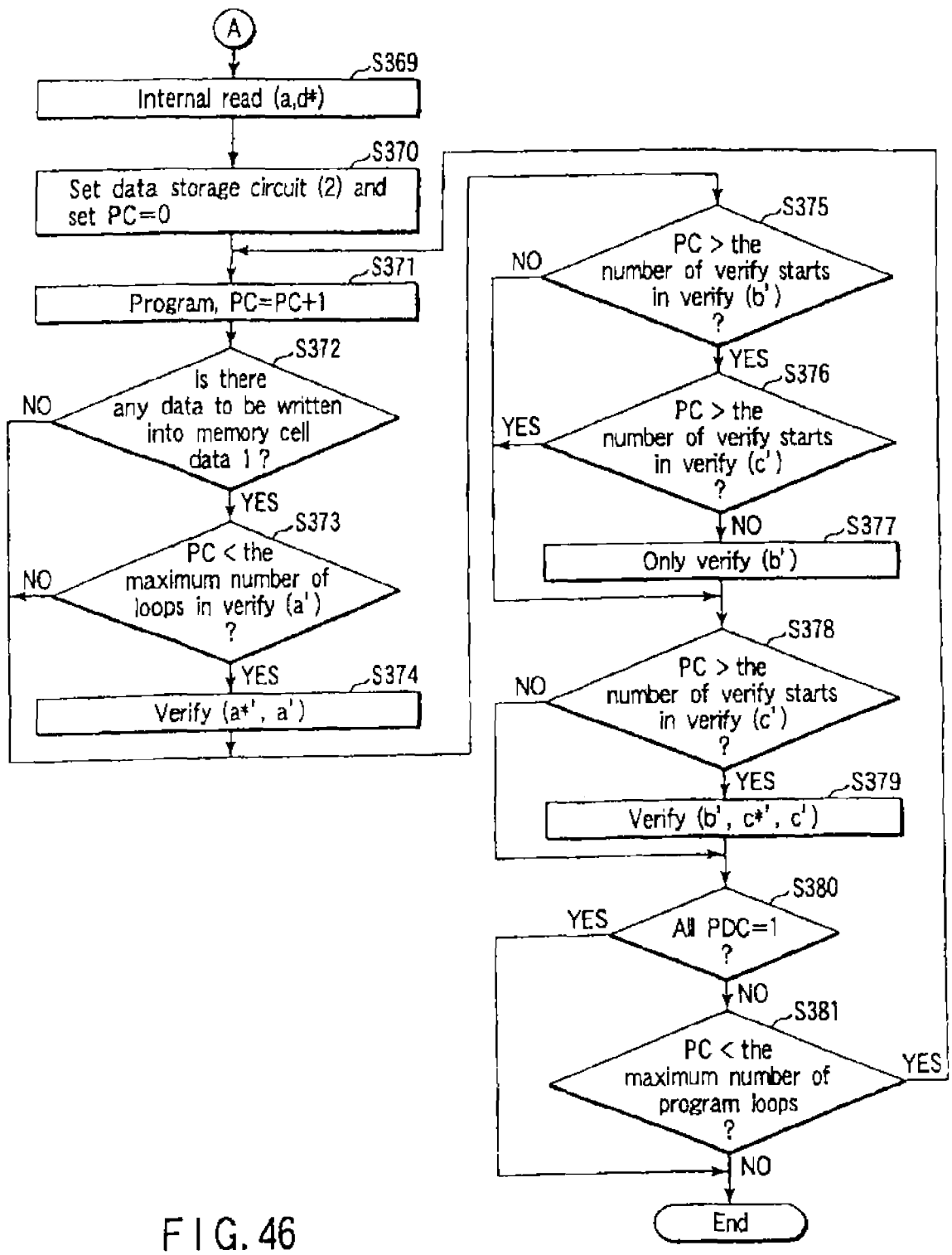
FIG. 46 is a flowchart to explain a third page write operation in the sixth embodiment.
Figure 54:
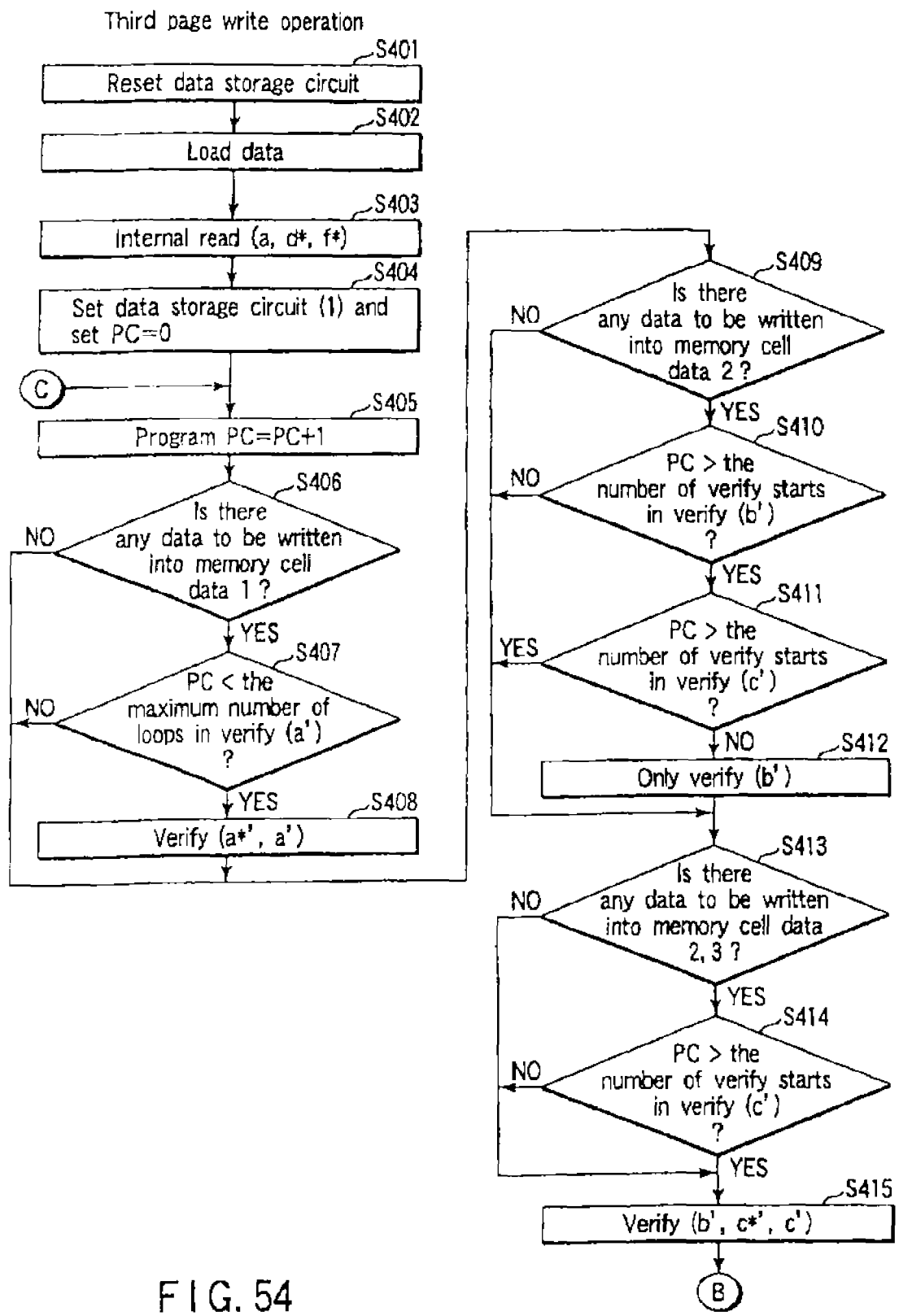
FIG. 54 is a flowchart to explain a third page write operation in the seventh embodiment.
Figure 55:
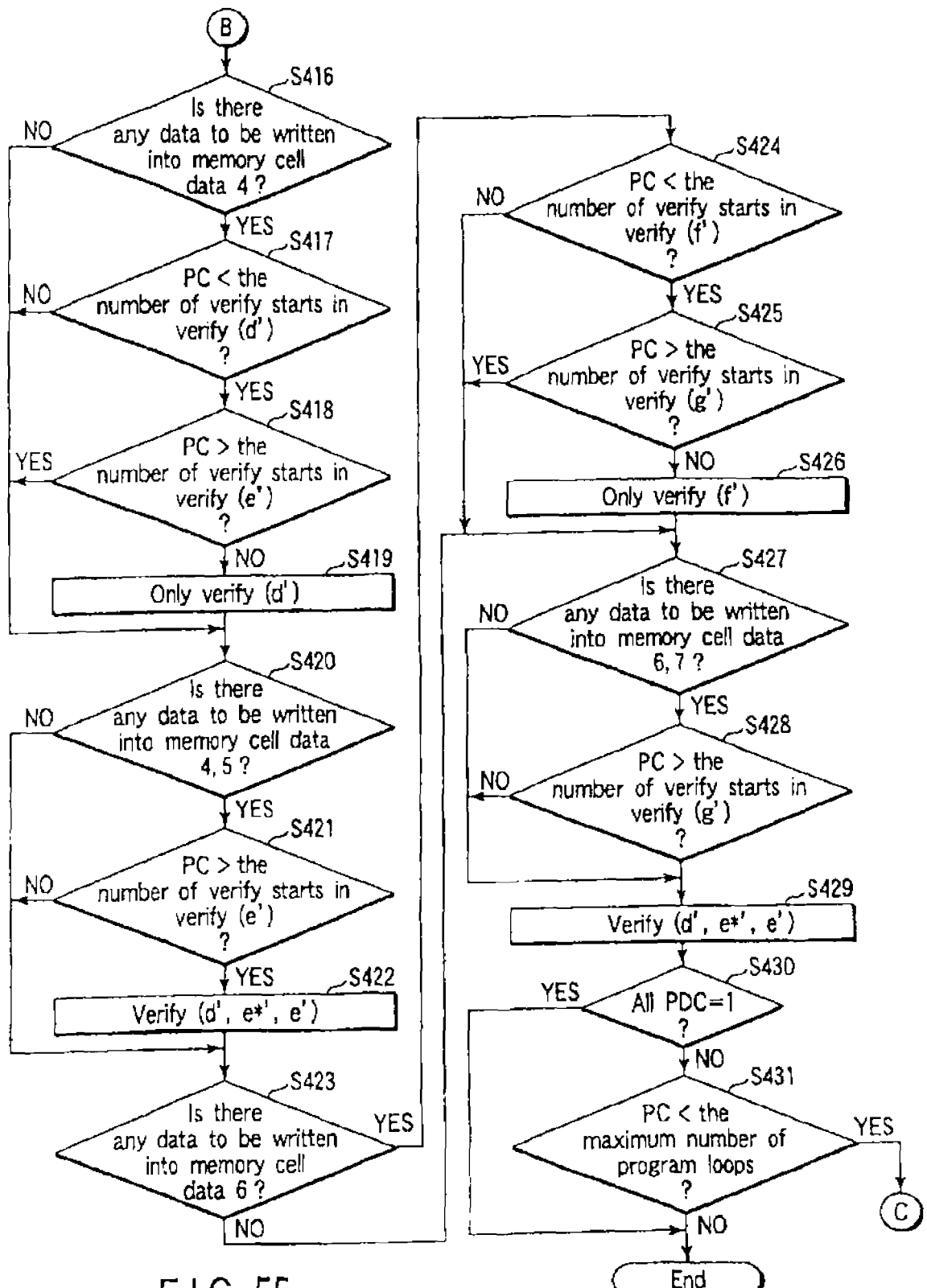
FIG. 55 is a flowchart to explain a third page write operation in the seventh embodiment.

FIGS. 45 and 46 are flowcharts for a third page program operation. In a third page program operation, an address is specified first, thereby selecting three pages shown in FIG. 19.

Next, the data storage circuits 10 are reset (S351) and writing data is externally inputted into the SDCs of all of the data storage circuits 10 (S352). If data "1" is externally inputted (if no writing is done), the SDC in the data storage circuit 10 of FIG. 6 goes low. If data "0" is externally inputted (if writing is done), the SDG goes high.

Figures 44A, 44B:
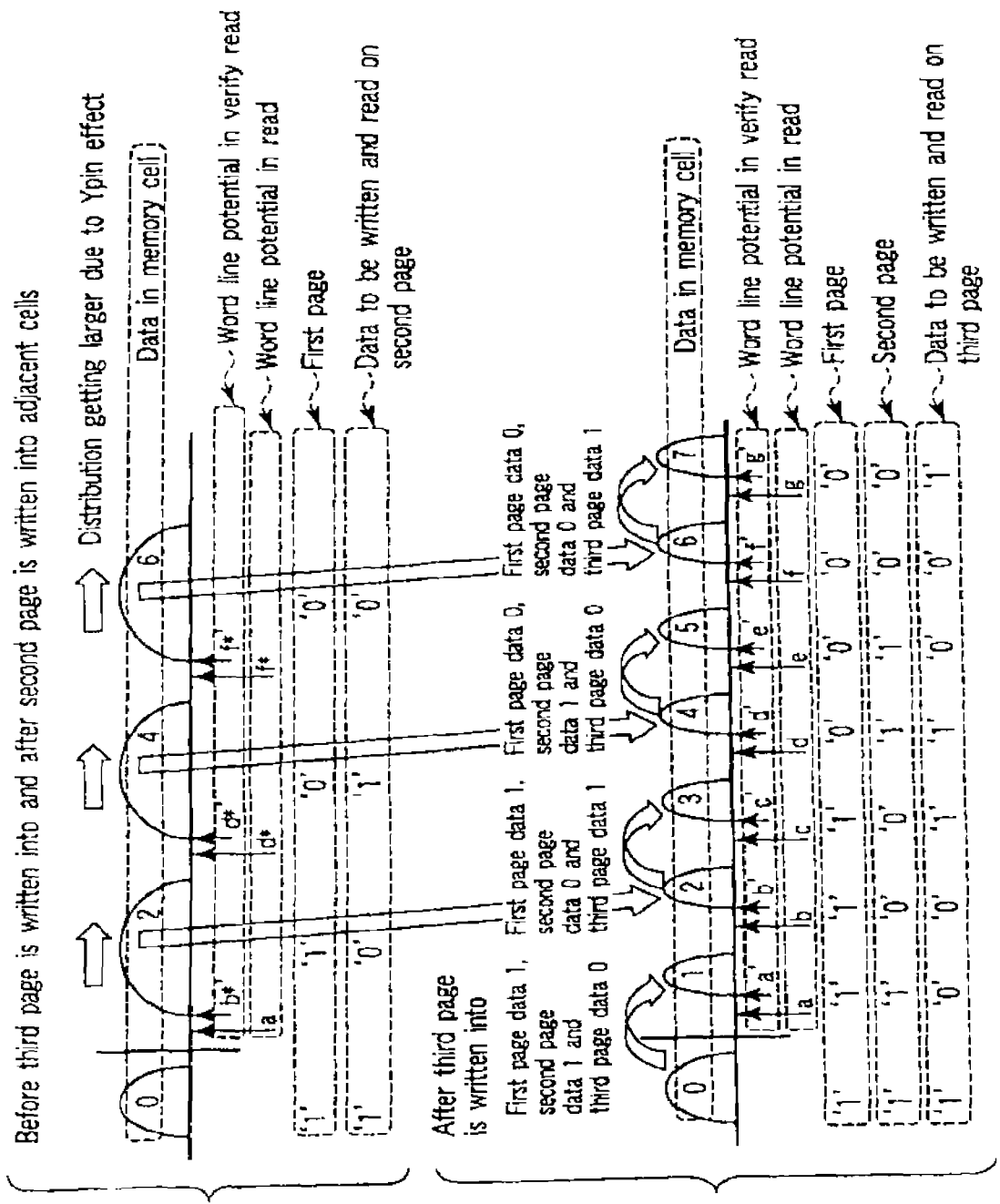
FIGS. 44A, and 44B show the relationship between data in a memory cell and the threshold voltages of the memory cell in the sixth embodiment.

In the third page program operation, as shown in FIG. 44B, when the data in the memory cell is "0" and when the externally inputted data is "1", the data in the memory cell is kept at "0". When the externally inputted data is "0", the data in the memory cell is set to "1".

When the data in the memory cell is "2" and when the externally inputted data is "1", the data in the memory cell remains at "2". However, in a second page write operation, when it is verified whether the data in the memory cell has reached "2", a verify potential "b*'" lower than the original one is used. For this reason, a memory cell storing data "2" is written into to the original verify potential "b'". When the data in the memory cell is "2" and when the externally inputted data is "0", the data in the memory cell is set to "3".

When the data in the memory cell is "4" and when the externally inputted data is "1", the data in the memory cell remains at "4". However, in a second page write operation, when it is verified whether the data in the memory cell has reached "4", a verify potential "d*'" lower than the original one is used. For this reason, a memory cell storing data "4" is written into to the original verify potential "d'". When the data in the memory cell is "4" and when the externally inputted data is "0", the data in the memory cell is set to "5".

When the data in the memory cell is "6" and when the externally inputted data is "1", the data in the memory cell remains at "6". However, in a second page write operation, when it is verified whether the data in the memory cell has reached "6", a verify potential "f*'" lower than the original one is used. For this reason, a memory cell storing data "6" is written into to the original verify potential "f'". When the data in the memory cell is "6" and when the externally inputted data is "0", the data in the memory cell is set to "7".

In the sixth embodiment, writing is done in this way. However, the data to be written and read and the data in the memory cell may be dealt with as shown in the second and third embodiments.

Furthermore, when data "3", "5", "7" are written into a cell, a verify operation is carried out using a threshold voltage lower than the original verify potential. When the threshold voltage has been exceeded and when the write operation has not been completed using the original verify potential, an intermediate potential is supplied to the bit line in the next write operation, thereby making the write speed slower. Then, writing is done once and the write operation is completed. In a cell where the original verify potential has been exceeded, the write operation is ended at that time.

In addition, when data "1" is written into a memory cell, a verify operation is carried out using a verify voltage lower than the original verify potential. When the verify potential lower than the original verify potential has been exceeded, the intermediate potential is supplied to the bit line in the next and later write operations, thereby making the write speed slower. Then, the cell is written into until the original verify potential has been exceeded.

(Third Page First-Session Program)

In a third page program operation, data "1" to "7" are written into a memory cell. These data items can be programmed simultaneously. However, in the sixth embodiment, four data "4" to "7" are written into a memory cell first. Then, data "1" to "3" are written into the memory cell. Thereafter, these operations will be explained concretely.

First, the data storage circuits are reset and data is externally loaded into the SDCs of the data storage circuits (FIG. 45, S351, S352).

(Internal Data Read 1 and Data Cache Setting 1) (S353, S354)

Before data is written into the memory cell, it is determined whether the data in the second page memory cell is either "4" or "6" or either "0" or "2", whether the data in the memory cell is "6", and whether the data in the memory cell is any one of "0", "2", and "4". To do this, the word line potential is set to "d*" and "f*" in that order. Then, the data written in the memory cell is read and set in the data cache.

FIG. 47A shows the state of the data cache after the internal read operation. Thereafter, the data cache is operated to set the data cache as shown in FIG. 47B. Then, for example, the counter (PC) is initialized to zero and the data in the fifth flag cell is loaded.

In FIG. 47B, to set the data in the memory cell at "0" to "3," the PDC is set at the high level ("1"). To set the data in the memory cell at "4", the PDC is set at the low level ("0"), the DDC is set high, and the SDC is set high. To set the data in the memory cell at "5", the PDC is set low, the DDC is set low, and the SDC is set high. To set the data in the memory cell at "6", the PDC is set low, the DDC is set high, and the SDC is set low. To set the data in the memory cell at "7", each of the PDC, DDC, and SDC is set low.

(Program: First Session) (S355)

After the counter (PC) is counted up, data is written into the memory cell. As in the second embodiment, in the sixth embodiment, unnecessary verify operations are skipped using the value of the counter and a predetermined number of verify starts.

First, when the signal BLC1 is set at Vsg, if the PDC has data "0", the bit line is at Vss. If the PDC has data "1", the bit line is at Vdd. Next, after the signal BLC1 is set at Vss, the signal VREG is set at Vdd and the signal REG is set at the intermediate potential (e.g., 1 V+Vth). Then, if the DDC has data "1", the bit line is at the intermediate potential. If the DDC has data "0", the bit line is not precharged. As a result, only when data "5", "7" have been written in the memory cell, the bit line is at Vss. When data "4", "6" have written in the memory cell, the bit line is at the intermediate potential (e.g., 1 V). If the data in the memory cell is "0" to "3" (if no writing is done), the bit line is at Vdd. Here, the selected word line is set at Vpgm and the unselected word line is set at Vpass. If the bit line is at Vdd, no writing is done. If the bit line is at Vss, writing is done. If the bit line is at the intermediate potential (e.g., 1 V), writing is done a little. Accordingly, a memory cell in which data "4", "6" have been written into might be written insufficiently. However, since data "4" and data "5" in the memory cell are verified simultaneously and data "6" and data "7" in the memory cell are verified simultaneously, the write time ends earlier when they are written as simultaneously as possible. Therefore, the intermediate potential is supplied to the bit line.

(Verification Using Only "d'") (S356 to S358, FIG. 48A)

Thereafter, the verify voltage "d'" is set and a write verify operation is carried out. First, when the signal BLC2 is made high Vdd+Vth and the signal BLCLAMP is set to a specific potential, the bit line is precharged. At this time, what is precharged is only a memory cell whose SDC is at the high level, that is, a memory cell in which data "5", "4" have been written.

Next, the verify potential "d'" is supplied to the word line, thereby discharging the bit line. While the bit line is being discharged, the data in the DDC is transferred to the TDC. Thereafter, the data in the PDC is transferred to the DDC and the data in the TDC is transferred to the PDC. Then, the TDC is charged to Vdd. Thereafter, the signal BLCLAMP is set to a specific potential. Then, it is when data "4" and data "5" have been written in the memory cell and the threshold voltage has become equal to or higher than the verify potential "d'" that the TDC goes high. Thereafter, the signal BLC1 is set to the intermediate potential (Vth+0.5 V). When the PDC is at the low level or when data "5" has been written in the memory cell, the TDC goes low. Therefore, it is when data "4" has been written in the memory cell and the threshold voltage has become equal to or higher than the verify potential "d'" that the TDC goes high.

Next, when the signal VREG is made high and the signal REG is set to Vsg, if the data in the DDC is at the high level, the TDC is forced to go high. Therefore, it is when data "4" has been written in the memory cell and the verify potential "d'" has been reached, or when writing is unselected that the TDC goes to Vdd. Then, the signal DTG is set to Vsg and the data in the PDC is copied into the DDC. Thereafter, the signal BLC1 is set to Vsg and the potential of the TDC is loaded into the PDC.

(Simultaneous Verification Using "d'", "e*'", "e'") (S359 to S361, FIG. 48B)

As the program is repeated several times, the writing of data "5" into the memory cell is getting closer to completion. Therefore, a verify operation using the verify potential "e'" is carried out. In this verify operation, verifications are made using "d'", "e*'", and "e'" simultaneously.

First, the signal BLC2 is set to the high level and the signal BLCLAMP is set to a specific potential, thereby precharging the bit line. At this time, what is precharged is only a memory cell whose SDC is at the high level, that is, a memory cell in which data "5", "4" have been written.

Next, the verify potential "d'" is supplied to the word line, thereby discharging the bit line. While the bit line is being discharged, the data in the DDC is transferred to the TDC. Thereafter, the data in the PDC is transferred to the DDC and the data in the TDC is transferred to the PDC. Then, after the TDC is charged to Vdd, the signal BLCLAMP is set to a specific potential. Then, it is when data "4" and "5" have been written in the memory cell and the threshold voltage is equal to or higher than the verify potential "d'" that the TDC goes high. Thereafter, the signal BLC1 is set to the intermediate potential (Vth+0.5 V). When the PDC is at the low level, if data "5" has been written in the memory cell, the TDC goes low. Therefore, it is when data "4" has been written in the memory cell and the threshold voltage becomes equal to or higher than the verify potential "d'" that the TDC goes high.

Next, when the signal VREG is made high and the signal REG is set to Vsg, if the data in the DDC is at the high level, the TDC is forced to go high. Therefore, it is when data "4" has been written in the memory cell and the verify potential "d'" has been reached or when writing is unselected that the TDC goes to Vdd. After the signal DTG is set to Vsg and the data in the PDC is copied into the DDC, the signal BLC1 is set to Vsg and the potential of the TDC is loaded into the PDC.

Thereafter, the verify potential "e*'" is supplied to the word line and the bit line is discharged. Then, the TDC is charged to Vdd. Thereafter, the signal BLCLAMP is set to the specific potential. Thus, it is when the threshold voltage of the cell is equal to or higher than the verify potential "e*'" that the TDC goes high. That is, it is when data "5" has been written in the memory cell and the verify potential "e*'" has been reached that the TDC goes high.

Next, when the signal VREG is made high and the signal REG is set to Vsg, if the data in the DDC is at the high level, the TDC is forced to go high. Therefore, it is when data "5" has been written in the memory cell and the verify potential "e*'" has been reached or when data "0", "2", "4", "6" have been written in the memory cell that the TDC goes to Vdd. After the signal DTG is set to Vsg and the data in the PDC is copied into the DDC, the signal BLC1 is set to Vsg and the potential of the TDC is loaded into the PDC.

Thereafter, the verify potential "e'" is supplied to the word line and the bit line is discharged. Then, the TDC is charged to Vdd. Thereafter, the signal BLCLAMP is set to the specific potential. Thus, it is when the threshold voltage of the cell is equal to or higher than the verify potential "e'" that the TDC goes high. That is, it is when data "5" has been written in the memory cell and the verify potential "e'" has been reached that the TDC goes high.

Next, when the signal VREG is made high and the signal REG is set to Vsg, if the data in the DDC is at the high level, the TDC is forced to go high. Therefore, it is when data "5" has been written in the memory cell and the verify potential "e'" has been reached or when writing is unselected that the TDC goes to Vdd. After the signal DTG is set to Vsg and the data in the PDC is copied into the DDC, the signal BLC1 is set to Vsg and the potential of the TDC is loaded into the PDC.

When data "5" has been written in the memory cell, the verify potential "e*'" has been reached, and the write operation has not been completed in the verification using the verify potential "e'", the data in the data storage circuit is as follows: SDC="1", DDC="1", and PDC="0". This is the same as the data in the data storage circuit when data "4" has been written in the memory cell. Specifically, when data "5" has been written in the memory cell and the verify potential "e*'" has been reached, data "4" is being written into the memory cell. When data "4" is being written into the memory cell, the intermediate potential is supplied to the bit line. Therefore, in the next write operation, the memory cell is written a little. In the next simultaneous verification using "d'", "e*'", "e'", this cell never fails to skip the verify operation, because the threshold voltage of the cell is equal to or higher than "e*'" in a verify operation using "d'". Thus, a second and later write operations will not be carried out.

(Verify Operation Using Only the Verify Potential "f'") (S362 to S364, FIG. 49A)

In a verify operation using only the verify potential "f'", the signal VPRE is made high, the signal BLPRE is set to Vdd+Vth, and the signal BLCLAMP is set to a specific potential, thereby precharging the bit line.

Next, the verify potential "f'" is supplied to the word line, thereby discharging the bit line. While the bit line is being discharged, the data in the DDC is transferred to the TDC. Thereafter, the data in the PDC is transferred to the DDC and the data in the TDC is transferred to the PDC. Then, the TDC is charged to Vdd. Thereafter, the signal BLCLAMP is set to a specific potential. Then, it is when data "6" and data "7" have been written in the memory cell and the threshold voltage has become equal to or higher than the verify potential "f'" that the TDC goes high. Thereafter, the signal BLC1 is set to the intermediate potential (Vth+0.5 V). When the PDC is at the low level or when data "7" has been written in the memory cell, the TDC goes low. Therefore, it is when data "6" has been written in the memory cell and the threshold voltage has become equal to or higher than the verify potential "f'" that the TDC goes high.

Next, when the signal VREG is made high and the signal REG is set to Vsg, if the data in the DDC is at the high level, the TDC is forced to go high. Therefore, it is when data "6" has been written in the memory cell and the verify potential "f'" has been reached, or when writing is unselected that the TDC goes to Vdd. Then, the signal DTG is set to Vsg and the data in the PDC is copied into the DDC. Thereafter, the signal BLC1 is set to Vsg and the potential of the TDC is loaded into the PDC.

(Simultaneous Verify Using "f'", "g*'", "g'") (S365, S366, FIG. 49B)

As the program is repeated several times, the writing of data "7" into the memory cell is getting closer to completion. Therefore, a verify operation using the verify potential "g'" is carried out. In this verify operation, verifications are made using "f'", "g*'", and "g'" simultaneously.

First, the signal VPRE is set to the high level, the signal BLPRE is set to Vdd+Vth, and the signal BLCLAMP is set to a specific potential. Then, the bit line is precharged.

Next, the verify potential "f'" is supplied to the word line, thereby discharging the bit line. While the bit line is being discharged, the data in the DDC is transferred to the TDC. Thereafter, the data in the PDC is transferred to the DDC and the data in the TDC is transferred to the PDC. Then, the TDC is charged to Vdd. Thereafter, the signal BLCLAMP is set to a specific potential. Then, it is when data "6" and "7" have been written in the memory cell and the threshold voltage is equal to or higher than the verify potential "f'" that the TDC goes high. Thereafter, the signal BLC1 is set to the intermediate potential (Vth+0.5 V). When the PDC is at the low level, if data "7" has been written in the memory cell, the TDC goes low. Therefore, it is when data "6" has been written in the memory cell and the threshold voltage becomes equal to or higher than the verify potential "f'" that the TDC goes high.

Next, when the signal VREG is made high and the signal REG is set to Vsg, if the data in the DDC is at the high level, the TDC is forced to go high. Therefore, it is when data "6" has been written in the memory cell and the verify potential "f'" has been reached or when writing is unselected that the TDC goes to Vdd. After the signal DTG is set to Vsg and the data in the PDC is copied into the DDC, the signal BLC1 is set to Vsg and the potential of the TDC is loaded into the PDC.

Thereafter, the verify potential "g*'" is supplied to the word line and the bit line is discharged. Then, the TDC is charged to Vdd. Thereafter, the signal BLCLAMP is set to the specific potential. Thus, it is when the threshold voltage of the cell is equal to or higher than the verify potential "g*'" that the TDC goes high. That is, it is when data "7" has been written in the memory cell and the verify potential "g*'" has been reached that the TDC goes high.

Next, when the signal VREG is made high and the signal REG is set to Vsg, if the data in the DDC is at the high level, the TDC is forced to go high. Therefore, it is when data "7" has been written in the memory cell and the verify potential "g*'" has been reached or when data "0", "2", "4", "6" have been written in the memory cell that the TDC goes to Vdd. After the signal DTG is set to Vsg and the data in the PDC is copied into the DDC, the signal BLC1 is set to Vsg and the potential of the TDC is loaded into the PDC.

Thereafter, the verify potential "g'" is supplied to the word line and the bit line is discharged. Then, the TDC is charged to Vdd. Thereafter, the signal BLCLAMP is set to the specific potential. Thus, it is when the threshold voltage of the cell is equal to or higher than the verify potential "g'" that the TDC goes high. That is, it is when data "7" has been written in the memory cell and the verify potential "g'" has been reached that the TDC goes high.

Next, when the signal VREG is made high and the signal REG is set to Vsg, if the data in the DDC is at the high level, the TDC is forced to go high. Therefore, it is when data "7" has been written in the memory cell and the verify potential "g'" has been reached or when writing is unselected that the TDC goes to Vdd. After the signal DTG is set to Vsg and the data in the PDC is copied into the DDC, the signal BLC1 is set to Vsg and the potential of the TDC is loaded into the PDC.

When data "7" has been written in the memory cell, the verify potential "g*'" has been reached, and the write operation has not been completed in the verification using the verify potential "g'", the data in the data storage circuit is as follows: SDC="0", DDC="1", and PDC="0". This is the same as the data in the data storage circuit when data "6" has been written in the memory cell. Specifically, when data "7" has been written in the memory cell and the verify potential "g*'" has been reached, data "6" is being written into the memory cell. When data "6" is being written into the memory cell, the intermediate potential is supplied to the bit line. Therefore, in the next write operation, the memory cell is written a little. In the next simultaneous verification using "fα", "f*'", "g'", this cell never fails to skip the verify operation, because the threshold voltage of the cell is equal to or higher than "g*'" in a verify operation using "f'". Thus, a second and later write operations will not be carried out.

In this way, the program and verify operation is repeated until the data in all of the PDCs has become "1" (S367, S368). However, when the data in the DDC is "1" in a write operation, that is, when data "4" has been written in the memory cell, when data "6" has been written in the memory cell, when data "5" has been written in the memory cell and the verify potential "e*'" has been exceeded, or when data "7" has been written in the memory cell and the verify potential "g*'" has been exceeded, the bit line is set to the intermediate potential and a write operation is carried out. Each time the program and verify operation is repeated, the program voltage Vpgm is raised little by little. In this way, in the first-session program, four data "4" to "7" are written into the memory cell.

In the above explanation, after the first-session program, four verify operations are carried out. In the initial loop of the program, the threshold voltage does not rise. Thus, only a verify operation using the verify potentials "d'" is carried out at first. Next, a simultaneous verify operation using the verify potentials "d'", "e*'", "e'" is carried out. Then, a simultaneous verify operation using the verify potentials "d'", "e*'", "e'" and a verify operation using only "f'" are carried out. Finally, a simultaneous verify operation using the verify potentials "d'", "e*'", "e'" and a simultaneous verify operation using the verify potentials "f'", "g*'", "g'" may be carried out.

In a loop close to the end of the program, since the writing of data "4" and "5" into the memory cell has been completed, the simultaneous verify operations using the verify potentials "d'", "e*'", "e'" may be omitted and finally only a simultaneous verify operation using "f'", "g*'", "g'" may be carried out.

(Second-Session Program)

In a second-session program, three data "1" to "3" are written into the memory cell. A memory cell into which data "1" is to be written has not been written into at all. Therefore, as in the first embodiment, a verify potential "a*'" lower than the original verify potential is provided. The intermediate potential is supplied to the bit line of a cell whose threshold voltage has exceeded the verify potential "a*'". This makes the write speed slower and the threshold value distribution narrower. Since data "2" and data "3" are verified simultaneously, the write time ends earlier when they are written as simultaneously as possible. Therefore, even when data "2" is being written into the memory cell, the intermediate potential is supplied to the bit line, thereby making the write speed slower.

(Internal Data Read 2 and Data Cache Setting 2) (S369, S370, FIG. 50)

Before data is written into the memory cell, the word line potential is set to "b*(=a)" and "d*'" in that order and an internal read operation is carried out.

Thereafter, the data cache is operated to set the data cache as shown in FIG. 50A (S110). Specifically, to write data "0" into the memory cell, the PDC is set at "1", the DDC is set at "1", and the SDC is set at "1". To write data "1" into the memory cell, the PDC is set at "0", the DDC is set at "0"/"1", and the SDC is set at "1". To write data "2" into the memory cell, the PDC is set at "0", the DDC is set at "1", and the SDC is set at "0". To write data "3" into the memory cell, the PDC is set at "0", the DDC is set at "0", and the SDC is set at "0". To write data "4" to "7" into the memory cell, the PDC is always set at "1".

(Program: Second Session) (S371)

Here, for example, the counter (PC) is initialized to zero.

Next, for example, after the counter (PC) is counted up, data is written into the memory cell. First, when the signal BLC1 is set at the intermediate potential (Vdd+Vth), if the PDC has data "0", the bit line is at Vss. If the PDC has data "1", the bit line is at Vdd. Next, after the signal BLC1 is set at Vss, the signal VREG is set at Vdd and the signal REG is set at the intermediate potential (e.g., 1 V+Vth). Then, if the DDC has data "1", the bit line is at the intermediate potential (e.g., 1 V). If the DDC has data "0", the bit line is not precharged. As a result, when data "3" has been written in the memory cell or when data "1" has been written in the memory cell and the threshold voltage is equal to or lower than the verify potential "a*'" lower than the original verify potential, the bit line is at Vss. When data "2" has been written in the memory cell, when data "1" has been written in the memory cell and the threshold voltage has exceeded the verify potential "a*'" lower than the original potential, or when the bit line is at the intermediate potential (1V) and the data in the memory cell is "0", "4" to "7" (when no writing is done), the bit line is at Vdd. Here, the selected word line is set at Vpgm and the unselected word line is set at Vpass. If the bit line is at Vdd, no writing is done. If the bit line is at Vss, writing is done. If the bit line is at the intermediate potential (1 V), writing is done a little. Since verify operations in writing data "2" and data "3" into the memory cell are carried out simultaneously, the write time ends earlier when they are written as simultaneously as possible. Therefore, the intermediate potential is supplied to the bit line.

(Verification Using "a'", "a*'") (S372 to S374, FIG. 50B)

In a verify operation using the verify potentials "a'", "a*'", the signal VPRE is made high, the signal BLPRE is set to Vdd+Vth, and the signal BLCLAMP is set to a specific potential. Then, the bit line is precharged. Next, the verify potential "a*'" is supplied to the word line, thereby discharging the bit line.

Then, the TDC is charged to Vdd. Thereafter, the signal BLCLAMP is set to a specific potential. Then, it is when the threshold voltage of the cell is equal to or higher than the verify potential "a*'" that the TDC goes high. Next, the signal BLC2 is set to the intermediate potential (Vth+0.5 V). When the SDC is at the low level, the TDC goes low. Therefore, it is when data "1" has been written in the memory cell and the verify potential "a*'" has been reached that the TDC goes high. Next, when the signal VREG is made high and the signal REG is set to Vsg, if the data in the DDC is at the high level, the TDC is forced to go high. Therefore, it is when data "1" has been written in the memory cell and the verify potential "a*'" has been reached or when data "0", "2", "4", "6" have been written in the memory cell that the TDC goes to Vdd. After the signal DTG is set to Vsg and the data in the PDC is copied into the DDC, the signal BLC1 is set to Vsg and the potential of the TDC is loaded into the PDC.

Thereafter, the verify potential "a'" is supplied to the word line and the bit line is discharged. Then, the TDC is charged to Vdd. Thereafter, the signal BLCLAMP is set to the specific potential. Thus, it is when the threshold voltage of the cell is equal to or higher than the verify potential "a'" that the TDC goes high. Next, when the signal BLC2 is set to the intermediate potential (Vth+0.5 V), if the SDC is at the low level ("0"), the TDC goes to the high level ("1"). That is, it is when data "1" has been written in the memory cell and the verify potential "a'" has been reached that the TDC goes high. Next, when the signal VREG is made high and the signal REG is set to Vsg, if the data in the DDC is at the high level, the TDC is forced to go high. Therefore, it is when data "1" has been written in the memory cell and the verify potential "a'" has been reached or when writing is unselected that the TDC goes to Vdd. After the signal DTG is set to Vsg and the data in the PDC is copied into the DDC, the signal BLC1 is set to Vsg and the potential of the TDC is loaded into the PDC (FIG. 51).

(Verify Potential "b'") (S375 to S377, FIG. 51B)

In a verify operation using only the verify potential "b'", the signal VPRE is made high, the signal BLPRE is set to Vdd+Vth, and the signal BLCLAMP is set to a specific potential, thereby precharging the bit line.

Next, the verify potential "b'" is supplied to the word line, thereby discharging the bit line. While the bit line is being discharged, the data in the DDC is transferred to the TDC, the data in the PDC is transferred to the DDC, and the data in the TDC is transferred to the PDC. Furthermore, while the bit line is being discharged, the signal VREG is set to Vss, the signal REG is set to Vdd, and the signal BLCLAMP is set to a specific voltage. If the DDC is at the high level ("1"), that is, if writing is unselected, the bit line is forced to go low. Thereafter, the TDC is charged to Vdd. Then, the signal BLCLAMP is set to a specific potential. Therefore, the data in the memory cell has become equal to or higher than the verify potential "b'" that the TDC goes high. Thereafter, the signal BLC1 is set to the intermediate potential (Vth+0.5 V). When the PDC is at the low level or when data "3" has been written in the memory cell, the TDC goes low. Therefore, it is when data "2" has been written in the memory cell and the threshold voltage has become equal to or higher than the verify potential "b'" that the TDC goes high.

Next, when the signal VREG is made high and the signal REG is set to Vsg, if the data in the DDC is at the high level, the TDC is forced to go high. Therefore, it is when data "2" has been written in the memory cell and the verify potential "b'" has been reached, or when writing is unselected that the TDC goes to Vdd. Then, the signal DTG is set to Vsg and the data in the PDC is copied into the DDC. Thereafter, the signal BLC1 is set to Vsg and the potential of the TDC is loaded into the PDC.

(Simultaneous Verification Using "b'", "c*'", "c'") (S378, S379, FIG. 52)

As the program is repeated several times, the writing of data "2" into the memory cell is getting closer to completion. Therefore, a verify operation using the verify potential "c'" is carried out. In this verify operation, verifications are made using "b'", "c*'", and "c'" simultaneously.

First, the signal VPRE is set to the high level, the signal BLPRE is set to Vdd+Vth, and the signal BLCLAMP is set to a specific potential. Then, the bit line is precharged. Next, the verify potential "b'" is supplied to the word line, thereby discharging the bit line. While the bit line is being discharged, the data in the DDC is transferred to the TDC, the data in the PDC is transferred to the DDC, and the data in the TDC is transferred to the PDC. Furthermore, while the bit line is being discharged, the signal VREG is set to Vss, the signal REG is set to Vdd, and the signal BLCLAMP is set to a specific voltage. When the DDC has "1", that is, when writing is unselected, the bit line is forced to go low. Thereafter, the TDC is charged to Vdd. Then, the signal BLCLAMP is set to a specific potential. Therefore, it is when data "2" has been written in the memory cell and the threshold voltage is equal to or higher than the verify potential "b'" that the TDC goes high. Thereafter, the signal BLC1 is set to the intermediate potential (Vth+0.5 V). When the PDC is at the low level, that is, when data "3" has been written in the memory cell, the TDC goes low. Therefore, it is when data "2" has been written in the memory cell and the threshold voltage is equal to or higher than the verify potential "b'" that the TDC goes high.

Thereafter, the verify potential "c*'" is supplied to the word line, thereby discharging the bit line. Then, the TDC is charged to Vdd. Thereafter, the signal BLCLAMP is set to a specific potential. Then, it is when the threshold voltage of the cell is equal to or higher than the verify potential "c*'" that the TDC goes high. That is, it is when data "3" has been written in the memory cell and the verify potential "c*'" has been reached that the TDC goes high.

Next, when the signal VREG is made high and the signal REG is set to Vsg, if the data in the DDC is at the high level, the TDC is forced to go high. Therefore, it is when data "3" has been written in the memory cell and the verify potential "c*'" has been reached or when data "0", "2", "4", "6" have been written in the memory cell that the TDC goes to Vdd. After the signal DTG is set to Vsg and the data in the PDC is copied into the DDC, the signal BLC1 is set to Vsg and the potential of the TDC is loaded into the PDC.

Thereafter, the verify potential "c'" is supplied to the word line and the bit line is discharged. Then, the TDC is charged to Vdd. Thereafter, the signal BLCLAMP is set to the specific potential. Thus, it is when the threshold voltage of the cell is equal to or higher than the verify potential "c'" that the TDC goes high. That is, it is when data "3" has been written in the memory cell and the verify potential "c'" has been reached that the TDC goes high.

Next, when the signal VREG is made high and the signal REG is set to Vsg, if the data in the DDC is at the high level, the TDC is forced to go high. Therefore, it is when data "3" has been written in the memory cell and the verify potential "c'" has been reached or when writing is unselected that the TDC goes to Vdd. After the signal DTG is set to Vsg and the data in the PDC is copied into the DDC, the signal BLC1 is set to Vsg and the potential of the TDC is loaded into the PDC.

When data "3" has been written in the memory cell, the verify potential "c*'" has been reached, and the write operation has not been completed in the verification using the verify potential "g'", the data in the data storage circuit is as follows: SDC="0", DDC="1", and PDC="0". This is the same as the data in the data storage circuit when data "2" has been written in the memory cell. Specifically, when data "3" has been written in the memory cell and the verify potential "c*'" has been reached, data "2" is being written into the memory cell. When data "2" is being written into the memory cell, the intermediate potential is supplied to the bit line. Therefore, in the next write operation, the memory cell is written a little. In the next simultaneous verification using "b'", "c*'", "c'", this memory cell never fails to skip the verify operation, because the threshold voltage of the cell is equal to or higher than "c*'" in a verify operation using "b'". Thus, a second and later write operations will not be carried out.

In this way, the program and verify operation is repeated until the data in all of the PDCs has become "1" (S380, S381). However, when the data in the DDC is "1" in a write operation, that is, when data "1" has been written in the memory cell, when data "3" has been written in the memory cell and the verify potential "a*'" has been exceeded, when data "2" has been written in the memory cell, or when data "3" has been written in the memory cell and the verify potential "c*'" has been exceeded, the bit line is set to the intermediate potential and a write operation is carried out. Each time the program and verify operation is repeated, the program voltage Vpgm is raised little by little. In this way, in the second-session program, three data "1" to "3" are written into the memory cell.

When the PDC is at the low level, the write operation is carried out again. The program operation and the verify operation are repeated until the data in the PDCs of all of the data storage circuits has become high.

In the above explanation, after the first-session program, two verify operations are carried out. In the initial loop of the program, the threshold voltage does not rise. Thus, only a verify operation using the verify potentials "a', a*'" is carried out at first. Next, a verify operation using the verify potentials "a', a*'" and a verify operation using the verify potential "b'" are carried out. Finally, a verify operation using the verify potentials "a', a*'" and a simultaneous verify operation using the verify potentials "b'", "c'" may be carried out.

In a loop close to the end of the program, since the writing of data "1" into the memory cell has been completed, these verify operations may be omitted. When the verification of data "1" in the memory cell is not necessary, the SDC need not hold data. Therefore, the next writing data may be read from the outside world and stored in the SDC. With this configuration, a much higher-speed operation is possible.

(Read)

Since a read operation is almost the same as in the second and third embodiments, its explanation will be omitted.

(Erase)

Since an erase operation is almost the same as in the first and fourth embodiments, its explanation will be omitted.

With the sixth embodiment, when data "3", "5", "7" are written into the memory cell in the third page program, a verify operation is carried out using a threshold voltage lower than the original verify potential. Then, when the verify potential lower than the original one has been exceeded and when the write operation has not been completed with the original verify potential, the intermediate potential is supplied to the bit line to make the write speed slower in the next write operation. In this state, the write operation is carried out only once and then is completed. In a cell where the original verify potential has been exceeded, the write operation is ended at that time. Furthermore, when data "1" is written into the memory cell, a verify operation is carried out using a verify voltage lower than the original verify potential. When the verify potential lower than the original one has been exceeded, the intermediate potential is supplied to the bit line in the next and later write operations to make the write speed slower. Then, the writing is done until the original verify potential has been exceeded. Consequently, 8-valued (3 bit of) data can be written and read reliably at high speed.

Moreover, with the sixth embodiment, the distribution of threshold voltages of a memory cell into which odd-numbered data "1", "3", "5", "7" are written can be made narrower.

Seventh Embodiment

In the sixth embodiment, when the third page is written into, data "4" to data "7" are written into the memory cell in a first write operation and data "1" to data "3" are written into the memory cell in a second write operation.

In contrast, in a seventh embodiment of the present invention, when the third page is written into, data "1" to data "7" are written into the memory cell simultaneously. To achieve this, the configuration of the data storage circuit 10 is modified slightly.

FIG. 53 shows a data storage circuit applied to the seventh embodiment. In FIG. 53, the same parts are indicated by the same reference numerals. As shown in FIG. 53, a secondary dynamic data cache (SDDC) is added to the data storage circuit 10. The SDDC stores the data of the SDC temporarily and, together with the SDC, PDC, DDC, and TDC, stores verify data. The SDDC, which has almost the same configuration as that of the DDC, is composed of transistors 63*a*, 63*b*. One end of the current path of the transistor 63*a* is connected to node N2*b*. A signal DTG2 is supplied to the gate of the transistor 63*a*. The other end of the current path of the transistor 63*a* is connected to the gate of the transistor 63*b*. A signal VREG2 is supplied to one end of the current path of the transistor 63*b*. The other end of the current path of the transistor 63*b* is connected to one end of the current path of the transistor 63*c*. The other end of the current path of the transistor 63*c* is connected to node N3. A signal REG2 is supplied to the gate of the transistor 63*c*.

With the above configuration, a three page write operation using the data storage circuit 10 will be explained by reference to FIGS. 54, 55, 56A, and 56B.

First, after the data storage circuit 10 is reset, writing data is externally loaded into the SDC of the data storage circuit 10 (S401, S402). Thereafter, an internal read operation is carried out using the threshold voltages "a", "d*", "f*", thereby reading the data from the memory cell (S403).

FIG. 56A shows the data cache setting after a third page data load and internal read operation. Here, the data in the SDC, DDC, and PDC are the same as in FIG. 47A. When data "0", "1" have been written in the memory cell, the data in the SDDC is set at "0". When data "2" to "7" have been written in the memory cell, the data in the SDDC is set at "1".

Next, each data cache is operated, with the result that data is set in each data cache as shown in FIG. 56B (S404). Here, the data in the SDDC is used to verify data "5", "4", "1", "0". The data in the SDC is used to verify data "3", "2", "1", "0". The data in the DDC is used to verify data "7", "5", "3", "1". As in the fifth embodiment, in the seventh embodiment, when writing is done, if the PDC has "0", the bit line potential is set at Vss. If the PDC has "1", the bit line potential is set at Vdd. Thereafter, if the DDC has "1", the bit line potential is set to an intermediate potential (e.g., Vth+0.5 V) and a write operation is carried out (S405).

A verify operation is carried out, starting from the lowest threshold voltage upward. Specifically, first, data "1" is verified using the verify potentials "a*'", "a'" (S406 to S408). Thereafter, data "2" is verified using the verify potential "b'" (S409 to S412). Next, data "2", "3" are verified using the verify potentials "b'", "c*'", "c'" (S413 to S415). Then, data "4" is verified using the verify potential "d'" (S416 to S419). Thereafter, data "4", "5" are verified using the verify potentials "d'", "e*'", "e'" (S420 to S422). Next, data "6" is verified using the verify potential "f'" (S423 to S426). Then, data "6", "7" are verified using the verify potentials "f'", "g*'", "g'" (S427 to S429). This operation is repeated until the verification of each data has been completed (S430, S431).

In the above verify operation, in verifying data "3", "5", "7" in the memory cell, when the threshold voltage has reached a threshold voltage lower than the original one and is lower than the original threshold voltage, the data in the data cache are set as in the memory cell, that is, data "2", "4", "6". In this state, an intermediate potential is supplied to the bit line in the next program and a write operation is carried out. In the next verify operation, the write operation is completed. In writing data "1" into the memory cell, when the threshold voltage lower than the original one has been reached, the intermediate potential is supplied to the bit line in the subsequent program and the write operation is carried out. The write operation is repeated until the original threshold voltage has been reached.

In the seventh embodiment, the data storage circuit 10 is provided with the SDDC which holds data used in verifying data "5", "4", "1", "0" in the memory cell. This makes it possible to write the third page data at a time and verify the data. Consequently, the write speed can be made much faster.

In the seventh embodiment, the SDDC is provided between the SDC and the TDC. The installation location of the SDDC is not limited to this. For instance, the SDDC may be provided between the PDC and the TDC and in parallel with the DDC as shown in FIG. 53 by the dotted line.

FIG. 57 shows a layout of a NAND EEPROM cell array to which the first to seventh embodiments are applied;

As shown in FIG. 57, in a NAND EEPROM memory cell array, a plurality of memory cells MC and select transistors S1 are connected in series along bit lines BL. A plurality of memory cells MC arranged in the row direction are connected by a common control gate line (or word line) WL and select transistors S1 are connected by a common select gate line SGL. To each of the select transistors S1, a bit line BL is connected via a bit line contact BC.

Figure 58:
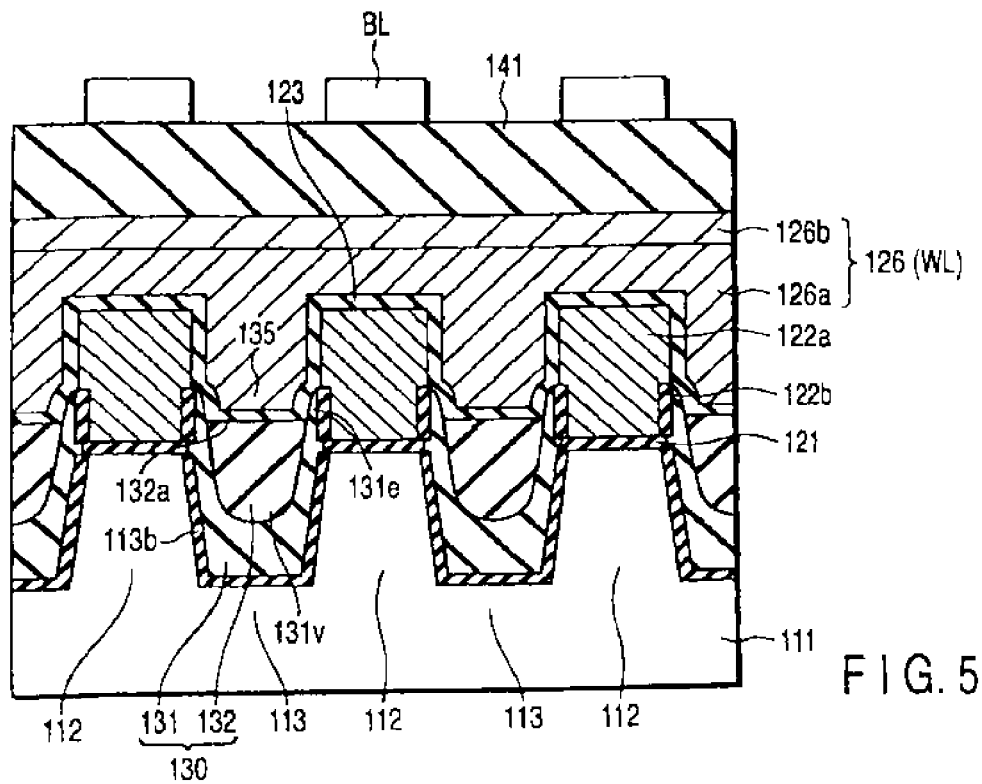
FIG. 58 is a sectional view taken along line 58-58 of FIG. 57.

As shown in FIG. 58, the memory cell array has element formation regions 112 formed on a silicon substrate 111. The element formation regions 112 are separated by trenches 113. The gates of the memory cells MC and the gates of the select transistors S1 are formed on the element formation regions 112.

Figure 59:
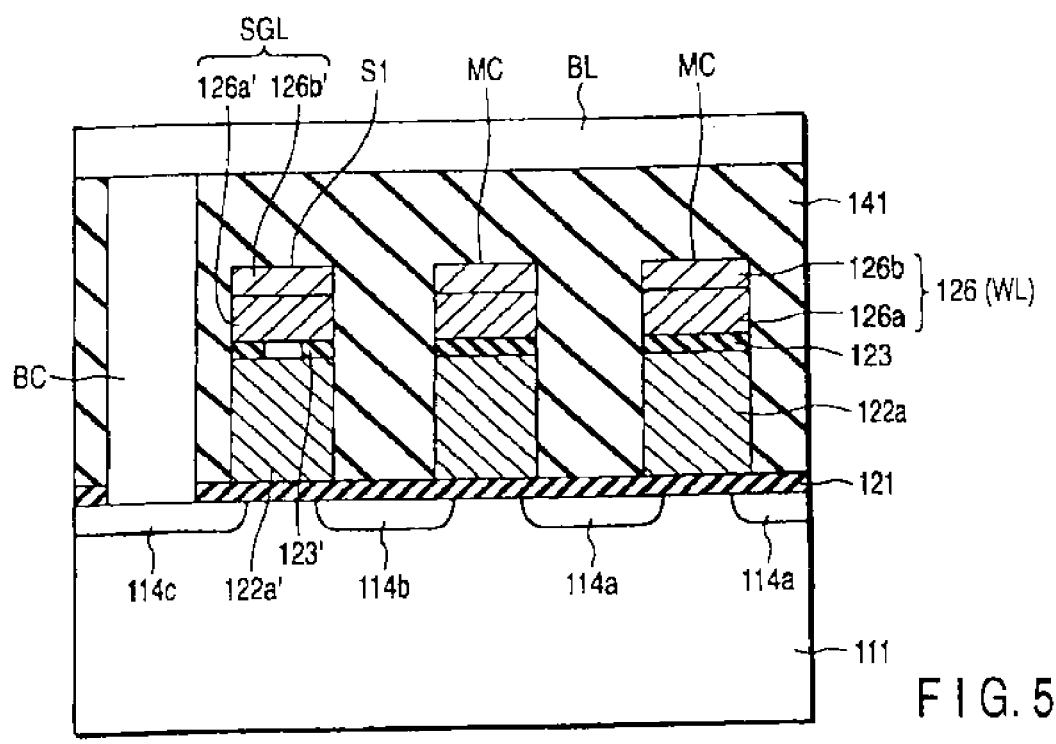
FIG. 59 is a sectional view taken along line 59-59 of FIG. 57.

As shown in FIG. 59, memory cells MC adjacent to each other in the direction of bit line BL share a source/drain diffused layer 114a formed in the silicon substrate 111. A memory cell MC and a select transistor S1 adjacent to each other in the direction of bit line BL share a source/drain diffused layer 114b formed in the substrate 111. Select transistors S1 facing each other with a bit line contact BC between them share a source/drain diffused layer 114c formed in the substrate 11.

In each of the element formation regions 112, a floating gate 122a is formed via a first gate insulating film 121, a tunnel insulating film. Above the floating gate 122a, a control gate 126 is formed via a second gate insulating film 123. The control gate 126 is a two-layer structure of a polysilicon film 126a and a tungsten silicide (WSi) film 126b. The materials for the films 126a and 126b are not limited to polysilicon and tungsten silicide. For instance, a polysilicon silicide film or the like may be used. Since the floating gates 122a, first gate insulating films 121, and trenches 113 are patterned at the same time as explained later, their side faces are aligned with one another.

On the inner walls (the bottom face and side faces) of a trench 113, an insulating film 113b is formed. On the side faces of a floating gate 122a, an insulating film 122b is formed. In the trench 113, an element isolating insulating film 130 is formed. The element isolating insulating film 130 is composed of a first element isolating insulating film 131 and a second element isolating insulating film 132. As shown in FIG. 58, the first element isolating insulating film 131 has an extended part 131e which is formed on the right and left sides along the inners walls of the trench 113 and is in contact with the insulating films 113b and 122b. The first element isolating insulating film 131 also has a hollow part 131v in its central part. The hollow part 131v is formed so as to take a concave shape with the height of the extended part 131e at its peak. The upper end of the extended part 131e is located above the undersurface of the floating gate 122a and below the top surface of the floating gate 122a and is made adjacent to the floating gate 122a via the insulating film 122b.

The second element isolating insulating film 132 is formed so as to fill the hollow part 131v of the first element isolating insulating film 131 almost completely. The highest part of the first element isolating insulating film 131 (the upper end of the extended part 131e) is located above the highest part of the second element isolating insulating film 132 (the top surface 132a). As a result, the element isolating insulating film 130 has at its top a concave part 135 in which the control gate 126 is to be buried.

A control gate 126 is formed continuously across a plurality of element formation regions 112 in a direction perpendicular to the bit line BL as shown in FIG. 58. The control gate 126 constitutes a word line WL. As described above, the height of the extended part 131e is located below the top surface of the floating gate 122a. The top surface 132a is positioned lower than the upper end of the extended part 131e. Therefore, the control gate 126 is formed so as to fill not only the top of the floating gate 122 but also the concave part 135 between the floating gates 122a. This makes it possible to suppress the capacity coupling between the adjacent floating gates 122a.

As shown in FIG. 59, a select transistor S1 includes a gate 122a', an insulating film 123', a select gate line SGL (films 126a' and 126b'). The gate 122a', insulating film 123', and films 126a' and 126b' are each made of the same material as that of the individual parts 122a, 123, 126a, and 126b of a memory cell MC. A select gate line SGL is connected directly (or short-circuited) to the gate 122a' by removing a part of the second gate insulating film 123'.

A width of the control gate 126 (the word line WL), a length between the control gates 126 (the word lines WL), a width of the bit line BL, and length between bit lines are set, for example, as 70 nm, respectively.

Figure 60:
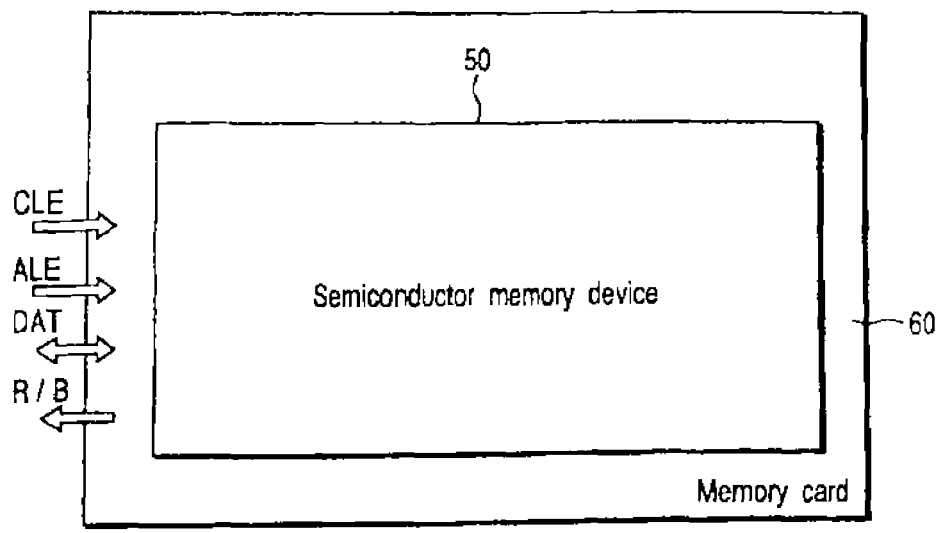
FIG. 60 is a block diagram of a memory card to which a semiconductor memory device of the present invention is applied.

NAND type EEPROM shown in each of the embodiments is applicable to various electronic equipments. FIGS. 60 to 66 show the examples. FIG. 60 shows an example which applied NAND type EEPROM of each embodiment to a memory card.

A memory card 60 includes the semiconductor memory device 50 constituted by the NAND type EEPROM as disclosed in each of the embodiments. As shown in FIG. 60, the memory card 60 is operable to receive/output predetermined signals and data from/to an external device (not shown).

A signal line (DAT), a command line enable signal line (CLE), an address line enable signal line (ALE) and a ready/busy signal line (R/B) are connected to the memory card 60 having the semiconductor memory device 50. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the semiconductor memory device 50 is ready, or not.

Figure 61:
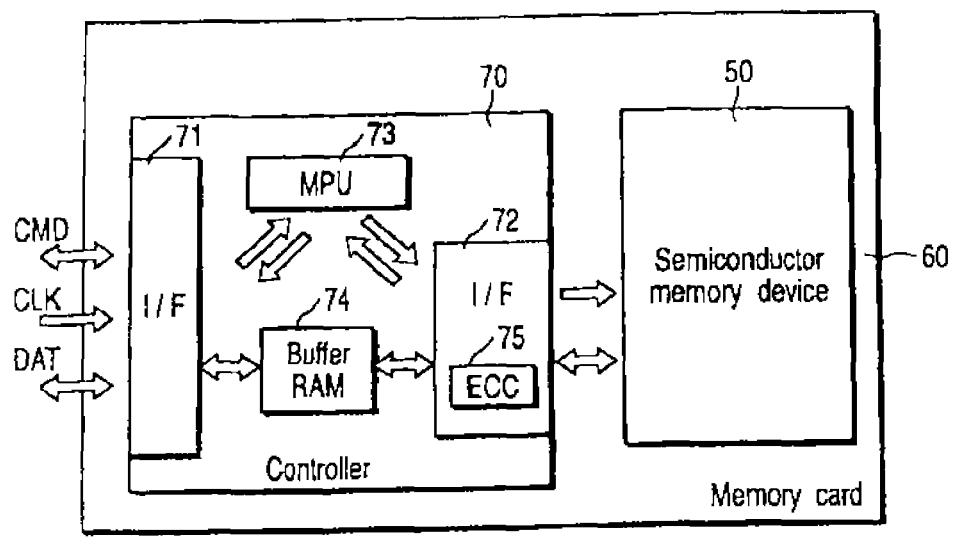
FIG. 61 is a block diagram showing an internal configuration of the memory card to which the semiconductor memory device of the present invention is applied.

Another exemplary assembly is shown in FIG. 61. The memory card shown in FIG. 61 differs from the memory card presented in FIG. 60 in that the memory card 60 of FIG. 61 includes, in addition to the semiconductor memory device 50 constituted by the NAND type EEPROM, a controller 70 which controls the semiconductor memory device 50 and receives/transfers predetermined signals from/to an external device (not shown).

The controller 70 includes an interface unit (I/F) 71, 72, a microprocessor unit (MPU) 73, a buffer RAM 74 and an error correction code (ECC) unit 75. The interface unit (I/F) 71, 72 receives/outputs predetermined signals from/to an external device (not shown) and the semiconductor memory device 50, respectively. The microprocessor unit 73 converts a logical address into a physical address. The buffer RAM 74 stores data temporarily. The error correction code unit 75 generates an error correction code. A command signal line (CMD), a clock signal line (CLK) and a signal line (DAT) are connected to the memory card 60. It should be noted that the number of the control signal lines, bit width of the signal line (DAT) and a circuit construction of the controller 70 could be modified suitably.

Another exemplary assembly is shown in FIG. 62. As can be seen from FIG. 62, a memory cardholder 80 is provided for receiving a memory card 60 having a semiconductor memory device 50 constituted by the NAND type EEPROM as discussed in each the embodiments. The cardholder 80 is connected to an electronic device (not shown) and is operable as an interface between the card 60 and the electronic device. The cardholder 80 may perform one or more of the functions of the controller 70 described in connection with FIG. 62.

Another exemplary assembly will be explained with reference to FIG. 63. FIG. 63 shows a connecting apparatus operable to receive a memory card or a cardholder, either of which includes the semiconductor memory device constituted by the NAND type EEPROM. The memory card or cardholder is insertable in the connecting apparatus 90 and is electrically connectable to the apparatus. The connecting apparatus 90 is connected to a board 91 via a connecting wire 92 and an interface circuit 93. The board 91 contains a CPU (Central Processing Unit) 94 and a bus 95.

Another exemplary assembly is shown in FIG. 64. As shown in FIG. 64, a memory card 60 or a cardholder 80, either of which includes the semiconductor memory device constituted by the NAND type EEPROM, is inserted and electrically connectable to a connecting apparatus 90. The connecting apparatus 90 is connected to a PC (Personal Computer) 300 via connecting wire 92.

Figure 65:
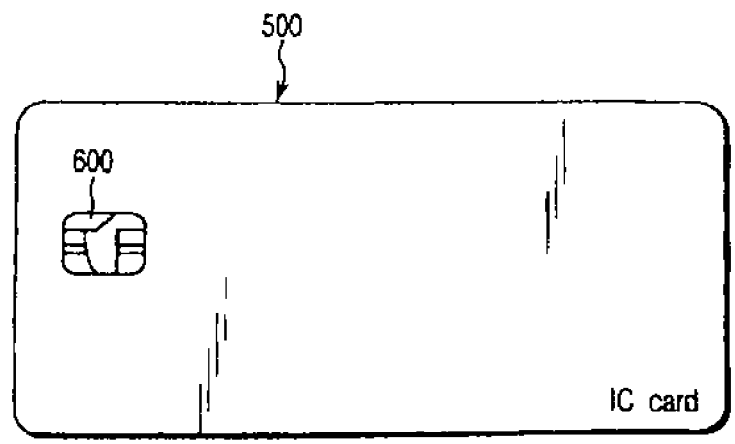
FIG. 65 is a plan view of an IC card to which a semiconductor memory device of the present invention is applied.
Figure 66:
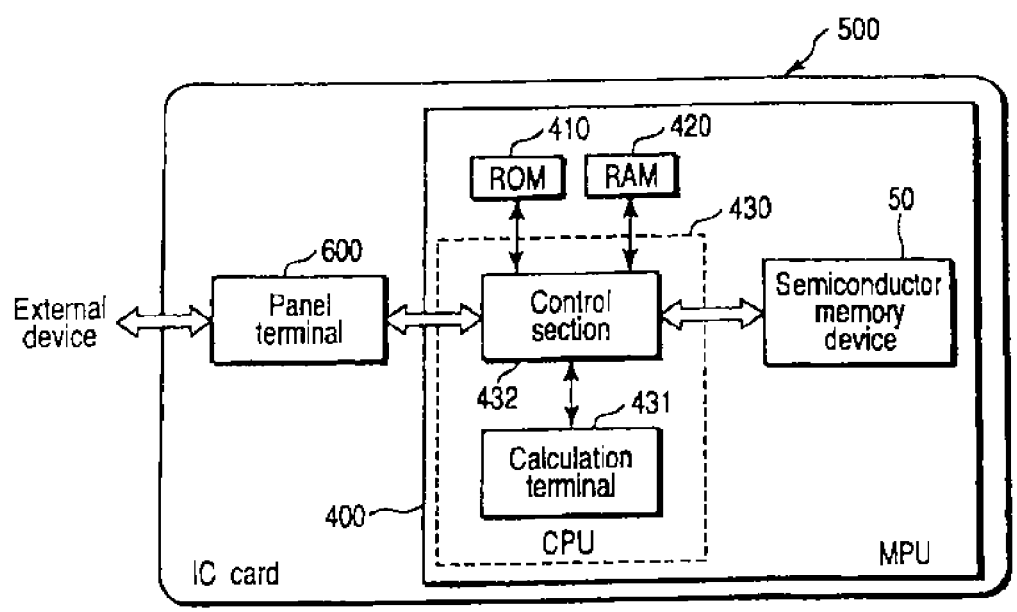
FIG. 66 is a block diagram showing an internal configuration of the IC card shown in FIG. 65.

Another exemplary assembly is shown in FIGS. 65 and 66. As shown in FIGS. 65 and 66, a semiconductor memory device 50 constituted by the NAND type EEPROM as described in each of the embodiments and other circuits such as ROM (read only memory) 410, RAM (random access memory) 420 and CPU (central processing unit) 430 are included in an IC (interface circuit) card 500. The IC card 500 is connectable to an external device via a plane terminal 600 that is coupled to an MPU (micro-processing unit) portion 400 of the card 450. The CPU 430 contains a calculation section 431 and a control section 432, the control section 432 being coupled to the nonvolatile semiconductor memory device 50, the ROM 410 and the RAM 420. Preferably, the MPU 400 is molded on one surface of the card 500 and the plane connecting terminal 600 is formed on the other surface.

Other implementations are readily discernable to one of ordinary skill in the art when the present description is read in view of the description in U.S. Pat. No. 6,002,605, which is incorporated herein by reference.

FIG. 67 shows another embodiment to which the NAND type EEPROM according to each of the above-described embodiments is applied. As shown in FIG. 67, a universal serial bus (USB) memory system 142 is constituted by a host platform 144 and a USB memory device 146.

The host platform 144 is connected to the USB memory device 146 via a USB cable 148. The host platform 144 is connected to the USB cable 148 via a USB connector 150, and the USB memory device 146 is connected to the USB cable 148 via a USB connector 152. The host platform 144 includes a USB host controller 154 controls packet transmitted on a USB bus.

The USB memory device 146 includes a USB flash controller 156, the USB connector 152 and at least one flash memory module 158. The USB flash controller 156 controls the other elements of the USB memory device 146 and also controls an interface of the USB memory device 146 to the USB bus. The flash memory module 158 includes a semiconductor memory device constituted by the NAND type EEPROM according to each embodiment.

When the USB memory device 146 is connected to the host platform 144, a standard USB process starts. In this process, the host platform 144 recognizes the USB memory device 146 to select a communication mode with the USB memory device 146. Then, the host platform 144 transfers/receives data to/from the USB memory device via a first-in-first-out (FIFO) buffer which stores transmission data called an end point. The host platform 144 recognizes changes of physical and electrical states of the USB memory device 146, such as attachment/detachment, via another end point, and receives packets to be received if any.

The host platform 144 sends a request packet to the USB host controller 154 to request for a service from the USB memory device 146. The USB host controller 154 transmits the packet onto the USB cable 148. The USB memory device 146 includes the end point which has accepted this request packet. In this case, these requests are received by the USB flash controller 156.

Next, the USB flash controller 156 carries out various operations such as the read of data from the flash memory module 158, the write of the data into the flash memory module 158, and the erase of the data. Furthermore, the USB flash controller 156 supports basic USB functions such as obtaining an USB address. The USB flash controller 156 controls the flash memory module 158 via a control line 160 for controlling outputs of the flash memory module 158, and via various signals such as /CE or a read/write signal. The flash memory module 158 is also connected to the USB flash controller 156 via an address data bus 162. The address data bus 162 transfers commands of read, write, and erase with respect to the flash memory module 158, and the address and data of the flash memory module 158.

The USB memory device 146 transmits a state packet using a state end point (end point 0) in order to inform the host platform 144 of results and states with respect to various operations which have requested by the host platform 144. In this process, the host platform 144 checks if there is any state packet (poling), and the USB memory device 146 returns an empty packet or the state packet itself, when there is not a packet of a new state message. It is to be noted that the USB cable 148 may be omitted, and a USB connector may also be used to directly connect the USB memory device 146 to the host platform 144. Additionally, various functions of the USB memory device can be carried out.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array including a plurality of memory cells arranged in a matrix, each of the memory cells being capable of storing data by n levels; and
    a control circuit configured to control the memory cell array, wherein
    the control circuit writes first data by m levels (m<n) to a first memory cell,
    the control circuit subsequently writes second data by the m levels (m<n) to a second memory cell adjacent to the first memory cell, and
    the control circuit subsequently writes, to the first memory cell, third data by the n levels formed of the first data by the m levels stored in the first memory cell and fourth data by (n−m) level.

2. The semiconductor memory device according to claim 1, wherein
    after the second data by the in levels is written to the second memory cell, the control circuit subsequently writes fifth data by the m levels to a third memory cell adjacent to the second memory cell, and the control circuit subsequently writes, to the second memory cell, sixth data by the n levels for lied of the second data by the m-levels stored in the second memory cell and seventh data by (n–m) level.

3. The semiconductor memory device according to claim 1, further comprising:

a first word line connected to the first memory cell; and a second word line connected to the second memory cell, wherein the first word line and the second word line are adjacent to each other.

4. The semiconductor memory device according to claim 2, further comprising:

a first word line connected to the first memory cell;

a second word line connected to the second memory cell; and a third word line connected to the third memory cell, wherein the first word line and the second word line are adjacent to each other, and the second word line and the third word line are adjacent to each other.

5. The semiconductor memory device according to claim 1, where the memory cells constitute a NAND flash memory.

6. The semiconductor memory device according to claim 2, where the third memory cell is adjacent to the second memory cell in a first row position different from a second row position of the first memory cell in the memory cell array.

* * * * *